United States Patent
Lee et al.

(10) Patent No.: US 7,809,203 B2
(45) Date of Patent: Oct. 5, 2010

(54) APPARATUS FOR ENCODING AND DECODING KEY DATA AND KEY VALUE DATA OF COORDINATE INTERPOLATOR AND RECORDING MEDIUM CONTAINING BITSTREAM INTO WHICH COORDINATE INTERPOLATOR IS ENCODED

(75) Inventors: Shin-jun Lee, Seoul (KR); Seok-yoon Jung, Seoul (KR); Euee-seon Jang, Seoul (KR); Sang-oak Woo, Kyungki-do (KR); Mahn-jin Han, Kyungki-do (KR); Do-kyoon Kim, Kyungki-do (KR); Gyeong-ja Jang, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1437 days.

(21) Appl. No.: 10/305,123

(22) Filed: Nov. 27, 2002

(65) Prior Publication Data

US 2003/0147470 A1    Aug. 7, 2003

Related U.S. Application Data

(60) Provisional application No. 60/369,597, filed on Apr. 4, 2002, provisional application No. 60/342,101, filed on Dec. 26, 2001, provisional application No. 60/334,541, filed on Dec. 3, 2001, provisional application No. 60/333,130, filed on Nov. 27, 2001.

(30) Foreign Application Priority Data

Oct. 19, 2002    (KR) ............................... 2002-64008

(51) Int. Cl.
*G06K 9/46*    (2006.01)
(52) U.S. Cl. ....................... 382/243; 375/245
(58) Field of Classification Search .......... 345/473–475
See application file for complete search history.

(56) References Cited

U.S. PATENT DOCUMENTS 4,189,744 A    2/1980    Stern (Continued)

FOREIGN PATENT DOCUMENTS

EP    749100 A2 *    12/1996

(Continued)

OTHER PUBLICATIONS

Ahn, Jeong-Hwan et al., "Motion-compensated compression of 3D animation models," Electronic Letters, Nov. 22, 2001, pp. 1445-1446, vol. 37, No. 24, IEE Stevenage, GB.

(Continued)

*Primary Examiner*—Sathyanarayan Pannala
(74) *Attorney, Agent, or Firm*—Staas & Halsey LLP

(57) ABSTRACT

An apparatus for encoding and decoding key data and key value data of a coordinate interpolator and a recording medium, on which a bitstream, into which a coordinate interpolator is encoded, is written, are provided. The bitstream includes key data encoding/decoding information, into which key data and information necessary to decode the key data are encoded, and key value data encoding/decoding information, into which key value data and information necessary to decode the key value data are encoded. The key data encoding/decoding information includes inverse DND operation information including the order of inverse DND indicating a predetermined number of cycles of inverse DND to be performed on differential data generated by entropy-decoding the bitstream in order to extend the range of the differential data.

5 Claims, 56 Drawing Sheets

U.S. PATENT DOCUMENTS

| | | | |
|---|---|---|---|
| 4,685,115 A | 8/1987 | Akagiri et al. | |
| 4,734,768 A | 3/1988 | Pexa | |
| 5,184,316 A | 2/1993 | Sugiyama | |
| 5,379,357 A | 1/1995 | Sentsui et al. | |
| 5,422,675 A | 6/1995 | Lim | |
| 5,491,479 A | 2/1996 | Wilkinson | |
| 5,635,986 A | 6/1997 | Kim | |
| 5,691,769 A | 11/1997 | Kim | |
| 5,692,117 A | 11/1997 | Berend et al. | |
| 5,757,668 A | 5/1998 | Zhu | |
| 5,781,239 A * | 7/1998 | Mattela et al. | 375/240.15 |
| 5,818,463 A | 10/1998 | Tao et al. | |
| 5,883,977 A | 3/1999 | Kim | |
| 5,899,970 A | 5/1999 | Sonohara | |
| 5,901,248 A | 5/1999 | Fandrianto et al. | |
| 5,912,676 A * | 6/1999 | Malladi et al. | 345/531 |
| 5,929,915 A | 7/1999 | Cho | |
| 5,929,917 A | 7/1999 | Kim | |
| 5,933,549 A | 8/1999 | Ide et al. | |
| 6,011,588 A | 1/2000 | Kim | |
| 6,055,337 A | 4/2000 | Kim | |
| 6,075,901 A | 6/2000 | Signes et al. | |
| 6,097,756 A | 8/2000 | Han | |
| 6,108,449 A | 8/2000 | Sekiguchi et al. | |
| 6,121,980 A | 9/2000 | Cho | |
| 6,128,041 A | 10/2000 | Han et al. | |
| 6,148,109 A | 11/2000 | Boon et al. | |
| 6,151,033 A | 11/2000 | Mihara et al. | |
| 6,151,073 A | 11/2000 | Steinberg et al. | |
| 6,157,745 A | 12/2000 | Salembier | |
| 6,188,796 B1 | 2/2001 | Kadono | |
| 6,204,854 B1 | 3/2001 | Signes et al. | |
| 6,301,303 B1 | 10/2001 | Chung et al. | |
| 6,421,384 B1 | 7/2002 | Chung et al. | |
| 6,424,792 B1 * | 7/2002 | Tsukagoshi et al. | 386/95 |
| 6,441,842 B1 | 8/2002 | Fandrianto et al. | |
| 6,445,826 B1 | 9/2002 | Kadono | |
| 6,516,093 B1 | 2/2003 | Pardas et al. | |
| 6,529,086 B2 | 3/2003 | Kim et al. | |
| 6,549,206 B1 * | 4/2003 | Signes | 345/473 |
| 6,553,149 B1 | 4/2003 | Chun et al. | |
| 6,559,848 B2 | 5/2003 | O'Rourke | |
| 6,603,815 B2 | 8/2003 | Suzuki et al. | |
| 6,614,428 B1 | 9/2003 | Lengyel | |
| 6,693,645 B2 | 2/2004 | Bourges-Sevenier | |
| 6,724,325 B2 * | 4/2004 | Fox | 341/51 |
| 6,847,365 B1 | 1/2005 | Miller et al. | |
| 6,959,114 B2 | 10/2005 | Kim et al. | |
| 7,006,571 B1 * | 2/2006 | Nakaya | 375/240.16 |
| 2001/0012324 A1 | 8/2001 | Normile | |
| 2001/0036230 A1 | 11/2001 | Sugiyama | |
| 2002/0036639 A1 | 3/2002 | Bourges-Sevenier | |
| 2002/0054646 A1 | 5/2002 | Tsushima et al. | |
| 2002/0070939 A1 | 6/2002 | O'Rourke | |
| 2002/0097246 A1 | 7/2002 | Jang et al. | |
| 2003/0103572 A1 | 6/2003 | Lee et al. | |
| 2003/0103573 A1 | 6/2003 | Woo et al. | |
| 2003/0108107 A1 | 6/2003 | Kim et al. | |
| 2003/0128215 A1 | 7/2003 | Kim et al. | |
| 2003/0128884 A1 | 7/2003 | Lee et al. | |
| 2003/0147470 A1 | 8/2003 | Lee et al. | |

FOREIGN PATENT DOCUMENTS

| | | |
|---|---|---|
| EP | 02 25 8133 | 4/2005 |
| JP | 9182082 | 7/1997 |
| JP | 9326990 | 12/1997 |
| KR | 1997-0073126 | 11/1997 |
| KR | 2002-0052205 | 8/2000 |
| KR | 10-2002-0031029 | 4/2002 |
| WO | WO 9114234 A * | 9/1991 |
| WO | 99/03067 | 1/1999 |
| WO | 01/41156 | 6/2001 |

OTHER PUBLICATIONS

Han, Mahnjin et al., "Interpolator Compression Core Experiments Description," ISO/IEC JTC 1/SC 29/WG 11 N4364, Jul. 2001, Sydney.

Jang, Euee S, "3D Animation Coding: its History and Framework," Multimedia and Expo. 2000, ICME 2000, 2000 IEEE Int'l. Conference on NY, Jul. 30, 2000, pp. 1119-1122, vol. 2, Piscataway, NJ, USA.

"Information technology—coding of audio-visual objects-Part 1: Systems," ISO/IEC 14496-1, 1999, pp. 137 & 245.

Kim, James D.K. et al., "Animation Data Compression in MPEG-4:Interpolators," Proceedings 2002 Int'l. Conference on Image Processing, IEEE, US, Sep. 2002, pp. 33-36, vol. 2, New York, NY.

"Call for Proposals for Interpolator Compression," MPEG, ISO/IEC JTC1/SC29/WG11 N4098, Mar. 2001, Singapore.

Signes, Julien, "Binary Format for Scene (BIFS): Combining MPEG-4 media to build rich multimedia services," Proceedings of the SPIE, Jan. 25, 1999, pp. 1506-1517, vol. 3653, Bellingham, VA, USA.

Varakliotis, Socrates et al., "Coding of Animated 3-D Wireframe Models for Internet Streaming Applications," 2001 IEEE Int'l. Conf. on Multimedia and Expo, Aug. 2001, pp. 353-356, Piscataway, NJ, USA.

Aaron E. Walsh et al. "Core Web 3D", Pub Sep. 14, 2000, eBook through Safari Tech Books Online, Chapters 17-19, ISBN 0-13-085728-9.

Ravi Ramamoorthi et al.—"Dynamic Splines with Constraints for Animation", Source Technical Report: 00000158, Pub: 1997, Published by California Institute of Technology, Pasadena, CA.

G. Bell et al. : "The Virtual Reality Modeling Language (VRML) Specification", Pub Aug. 1996, Version 2.0, WD ISO/IEC 14772, section 4.9.3 Interpolators.

James Steward, "Calculus Concepts and Contexts", Brooks/Cole Publishing 1998, pp. 416-417.

Yang et al., "Compression of 3-D Triangle Mesh Sequences Based on Vertex-Wise Motion Vector Prediction," IEEE Transactions on Circuits and Systems for Video Technology, Dec. 2002, vol. 12, No. 12, pp. 1178-1184, New York.

Chang H. Lu et al. "A DPCM System With Modulo Limiters," Communications for The Information Age, Proceedings of the Global Telecommunications Conference and Exhibition (Globecom), IEE, Nov. 28, 1988, pp. 581-585, vol. 1, New York.

K.A. Prabhu, "A Predictor Switching Scheme for DPCM Coding of Video Signals,"IEEE Transactions on Communications, Apr. 1985, pp. 373-379, vol. Com-33, No. 4, New York.

Bourges-Sevenier, Mikael et al., "Animation framework for MPEG-4 systems," Multimedia and Expo, 2000, ICME 2000, 2000 IEEE International Conference on New York, NY, Jul. 2000, pp. 1115-1118, vol. 2, Piscataway, NJ.

Zhen et al., "Lossless Compression of DSA Image Sequence Based on $D^2PCM$ Coder," Abstract, Biomedical Engineering Institute, Jun. 1999.

J. Yang, C. Kim, S. Lee, "Compression of 3d Triangle Mesh Sequences," Multimedia Signal Processing, 2001 IEEE Fourth Workshop on; Oct. 3-5, 2001, pp. 181-186.

Kim et al., "Technical Description of Interpolator Compression Tools," XP-001152010, Mar. 2002.

Kim et al., "Bitstream syntax and Decoding process of interpolator compression and it's Apparatus (Interpolator Compression part of the AFX study document)," XP-001152011, Aug. 10, 2005.

Kim et al., "Result of Core Experiment on Interpolator Compression MPEG01/M7774 Version 1," XP-001152012, Aug. 10, 2005.

Gersho, Allen, "Principles of Quantization," IEEE Transactions on Circuits and Systems, vol. CAS-25, No. 7, Jul. 1978, pp. 427-436.

Kim, Do Kyoon, "A Proposal for Interpolator Compression," ISO/IEC JTC1/SC29/WG11, MPEG01/M7473, Jul. 2001, pp. 1-29, Sydney, Australia.

Kim et al., "Result of Core Experiment on Interpolator Compression MPEG01/M7774 Version 2," XP-001152013, Aug. 10, 2005.

U.S. Appl. No. 10/305,016, filed Nov. 27, 2002, Shin-Jun Lee et al., Samsung Electronics, Co., Ltd.
U.S. Appl. No. 10/305,331, filed Nov. 27, 2002, Do-Kyoon Kim et al., Samsung Electronics, Co., Ltd.
U.S. Appl. No. 10/305,011, filed Nov. 27, 2002, Shin-Jun Lee et al., Samsung Electronics, Co., Ltd.
U.S. Appl. No. 10/305,174, filed Nov. 27, 2002, Sang-oak Woo et al., Samsung Electronics, Co., Ltd.
U.S. Appl. No. 10/305,164, filed Nov. 27, 2002, Do-Kyoon Kim et al., Samsung Electronics, Co., Ltd.
U.S. Appl. No. 11/544,672, filed Oct. 10, 2006, Shin-Jun Lee et al., Samsung Electronics, Co., Ltd.
Partial European Search Report cited in IDS filed Oct. 18, 2005 in U.S. Appl. No. 10/305,016.
Partial European Search Report cited in IDS filed May 18, 2005 in U.S. Appl. No. 10/305,016.
EPO Search Report dated Apr. 18, 2005, cited in IDS filed Jul. 13, 2005 in U.S. Appl. No. 10/305,331.
Korean Office Action dated Apr. 19, 2005, cited in IDS filed Jul. 13, 2005, in U.S. Appl. No. 10/305,331.
EPO Search Report dated Aug. 22, 2005, cited in IDS filed Jan. 10, 2006, in U.S. Appl. No. 10/305,011.
EPO Search Report dated Apr. 15, 2005, cited in IDS filed Jun. 21, 2006, in U.S. Appl. No. 10/305,011.
EPO Search Report dated Dec. 29, 2006, cited in IDS filed Mar. 19, 2007, for U.S. Appl. No. 10/305,174.
EPO Search Report dated Jan. 5, 2007, cited in IDS filed Mar. 19, 2007, for U.S. Appl. No. 10/305,174.
Partial EPO Search Report, cited in IDS filed May 31, 2005, for U.S. Appl. No. 10/305,174.
U.S. Office Action dated Mar. 13, 2008 for co-pending U.S. Appl. No. 11/544,672.
U.S. Office Action dated Jul. 30, 2008 for co-pending U.S. Appl. No. 11/544,672.
U.S. Advisory Action dated Nov. 3, 2008 for co-pending U.S. Appl. No. 11/544,672.
U.S. Office Action dated Feb. 10, 2009 for co-pending U.S. Appl. No. 11/544,672.
U.S. Office Action dated Jul. 17, 2009 for co-pending U.S. Appl. No. 11/544,672.
U.S. Office Action dated Nov. 1, 2005 for co-pending U.S. Appl. No. 10/305,164.
U.S. Office Action dated Mar. 14, 2005 for co-pending U.S. Appl. No. 10/305,164.
U.S. Office Action dated Mar. 5, 2006 for co-pending U.S. Appl. No. 10/305,164.
Interview Summary from Interview of Mar. 24, 2006, for co-pending U.S. Appl. No. 10/305,164.
U.S. Office Action dated Oct. 17, 2006 for co-pending U.S. Appl. No. 10/305,164.
U.S. Advisory Action dated Jan. 30, 2007 for co-pending U.S. Appl. No. 10/305,164.
U.S. Notification of Non-Compliant Appeal Brief dated May 10, 2007, for co-pending U.S. Appl. No. 10/305,164.
U.S. Letter Withdrawing a Notice of Defective Non-Compliant Appeal Brief, dated May 14, 2007, for co-pending U.S. Appl. No. 10/305,164.
Examiner's Answer mailed Jul. 13, 2007, for co-pending U.S. Appl. No. 10/305,164.
Corrections to Examiner's Answer mailed Aug. 27, 2007, for co-pending U.S. Appl. No. 10/305,164.
Notice of Entry and Consideration of Reply Brief, mailed Nov. 15, 2007, for co-pending U.S. Serial No. 10/305,164.
Notification of Non-compliant Appeal Brief, mailed Apr. 9, 2008, for co-pending U.S. Appl. No. 10/305,164.
Examiner's Answer mailed Jul. 3, 2008, for co-pending U.S. Appl. No. 10/305,164.
Notice of Entry and Consideration of Reply Brief, mailed Nov. 12, 2008, for co-pending U.S. Appl. No. 10/305,164.
Docketing Notice for Board of Patent Appeals and Interferences, dated Feb. 27, 2009, for co-pending U.S. Appl. No. 10/305,164.
Notice of Hearing, dated Aug. 27, 2009, for co-pending U.S. Appl. No. 10/305,164.

U.S. Office Action dated Oct. 17, 2006 for co-pending U.S. Appl. No. 10/305,174.
U.S. Office Action dated Jun. 14, 2007 for co-pending U.S. Appl. No. 10/305,174.
U.S. Notice of Allowance dated Oct. 5, 2007 for co-pending U.S. Appl. No. 10/305,174.
U.S. Notice of Non-Compliant Amendment dated Jun. 21, 2006 for co-pending U.S. Appl. No. 10/305,011.
U.S. Office Action dated Jan. 10, 2006 for co-pending U.S. Appl. No. 10/305,011.
U.S. Office Action dated Jul. 13, 2006 for co-pending U.S. Appl. No. 10/305,011.
U.S. Advisory Action dated Oct. 18, 2006, for co-pending U.S. Appl. No. 10/305,011.
U.S. Notice of Allowance dated Dec. 13, 2006 for co-pending U.S. Appl. No. 10/305,011.
U.S. Supplemental Notice of Allowance dated Jan. 31, 2007 for co-pending U.S. Appl. No. 10/305,011.
U.S. Office Action dated Jan. 10, 2006 for co-pending U.S. Appl. No. 10/305,331.
U.S. Office Action dated Jun. 28, 2006 for co-pending U.S. Appl. No. 10/305,331.
U.S. Notice of Allowance dated Oct. 12, 2006 for co-pending U.S. Appl. No. 10/305,331.
U.S. Office Action dated May 18, 2005 for co-pending U.S. Appl. No. 10/305,016.
U.S. Notice of Allowance dated Nov. 15, 2005 for co-pending U.S. Appl. No. 10/305,016.
"Object-Adaptive Vertex-Based Shape Coding Method", O'Connell, IEEE Transactions on Circuits and Systems for Video Technology, vol. 7. No. 1, Feb. 1997, pp. 251-255.
O'Connell, "Object-Adaptive Vertex-Based Shape Coding Method", IEEE Trans. Circuits and Systems for Video Technology, vol. 7, No. 1, Feb. 1997.
Varakliotis et al., "Coding of Animated Wireframe Models for Internet Streaming Applications", IEEE International Conference on Multimedia and Expo, pp. 353-356, 2001.
Kim et al., "Animation Data Compression in MPEG-4: Interpolaters", IEEE, ICIP, pp. 33-36, 2002. .
Yang et. al. "Compression of 3-D Triangle Mesh Sequences Based on Vertex-Wise Motion Vector Prediction," IEEE Transactions on Circuits and Systems for Video Technology, vol. 12, No. 12, Dec. 2002, pp. 1178-1184.
Ahn et al., "Motion-Compensated Compression of 3D Animation Models", Electroncs Letters, vol. 37 No. 24, Nov. 22, 2001.
Han et al., "Interpolator Compression Core Experiments Description", International Organisation for Standardisation Coding of Moving Pictures and Audio, Sydney, Jul. 2001.
Jang et al., "Calls for Proposals for Interpolator Compression", International Organisation for Standardisation Coding of Moving Pictures and Audio, Singapore, Mar. 2001.
Jang, "3D Animation Coding: its History and Framework", IEEE, pp. 1119-1222, 2002.
"Information Technology-Coding of Audio-Visual Objects", Part 1: Systems, ISO/IEC, 1999.
Signes, Binary Format for Scene (BIFS): Combining MPEG-4 Media to Build Rich Multimedia Services, IS&T/SPIE Conference on Visual Communications and Image Processing, San Jose, CA, Jan. 1999.
Kim et al., "Technical Description of Interpolar Compression Tools", International Organisation for Standardisation Coding of Moving Pictures and Associated Audio, Jeju, Mar. 2002.
Kim et al., "Bitstream syntax and Decoding Process of interpolar Compression and its Apparatus (Interpolator Compression Part of the AFX Study Document", International Organisation for Standardisation Coding of Moving Pictures and Associated Audio (Retrieved on Aug. 10, 2005).
Kim et al., "Result of Core Experiment on Interpolator Compression", International Organisation for Standardisation Coding of Moving Pictures and Associated Audio, Version 1, Pattaya, Dec. 2001.

Kim et al., "Result of Core Experiment on Interpolator Compression", International Organisation for Standardisation Coding of Moving Pictures and Associated Audio, Version 2, Pattaya, Dec. 2001.

European Search Report dated Apr. 15, 2005, cited in IDS filed Mar. 13, 2007, in U.S. Appl. No. 11/717,197.

European Search Report dated Aug. 22, 2005, cited in IDS filed Mar. 13, 2007, in U.S. Appl. No. 11/717,197.

U.S. Office Action dated Aug. 14, 2008 in U.S. Appl. No. 11/717,197.

U.S. Appl. No. 11/717,197, filed Mar. 13, 2007, Shin Jun Lee et al., Samsung Electronics, Co., Ltd.

EPO Search Report dated Aug. 22, 2005, cited in IDS filed Mar. 13, 2007, in U.S. Appl. No. 11/717,197.

EPO Search Report dated Apr. 15, 2005, cited in IDS filed Mar. 13, 2007, in U.S. Appl. No. 11/717,197.

Interview Summary from Interview of Jan. 11, 2010, for co-pending U.S. Appl. No. 11/717,197.

U.S. Office Action dated Dec. 30, 2009 for co-pending U.S. Appl. No. 11/717,197.

U.S. Office Action dated Apr. 17, 2009 for co-pending U.S. Appl. No. 11/717,197.

U.S. Office Action dated Aug. 14, 2008 for co-pending U.S. Appl. No. 11/717,197.

U.S. Advisory Action dated Sep. 18, 2009, for co-pending U.S. Appl. No. 11/717,197.

U.S. Office Action dated Dec. 31, 2009 for co-pending U.S. Appl. No. 11/544,672.

U.S. Advisory Action dated Sep. 29, 2009, for co-pending U.S. Appl. No. 11/544,672.

Interview Summary from Interview of Oct. 21, 2009, for co-pending U.S. Appl. No. 11/544,672.

Interview Summary from Interview of Oct. 9, 2009, for co-pending U.S. Appl. No. 11/544,672.

Notice of Allowance dated Dec. 1, 2009 for co-pending U.S. Appl. No. 10/305,164.

Transcript of Oral Argument dated Oct. 30, 2009 for co-pending U.S. Appl. No. 10/305,164.

Decision on Appeal dated Oct. 20, 2009 for co-pending U.S. Appl. No. 10/305,164.

Final Office Action dated Jun. 19, 2010 in co-pending U.S. Appl. No. 11/544,672.

USPTO Communication dated May 17, 2010 in copending U.S. Appl. No. 11/717,197 containing Notice of Allowability.

USPTO Communication dated May 24, 2010 containing Interview Summary dated May 20, 2010.

Notice of Allowance dated May 28, 2010 in copending U.S. Appl. No. 11/717,197.

* cited by examiner

SHIFT-UP

FINAL

FIG. 18B

```
void decodeSignedQuasiAAC(int *nDecodedValue, int qstep, QState *signContext, QState
*valueContext)
{
        int b = qstep - 2;
        int msb = 0;
        do {
                qf_decode(&msb, &valueContext[b]);
                msb = msb << b;
                b--;
        } while (msb == 0 && b >= 0);
        int sgn = 0;
        int rest = 0;
        if(msb != 0) {
                qf_decode(&sgn, signContext);
                while (b >= 0) {
                        int temp = 0;
                        qf_decode(&temp, zeroContext);
                        rest |= (temp << b);
                        b--;
                }
        }
        if(sgn)
                *nDecodedValue = -(msb+rest);
        else
                *nDecodedValue = (msb+rest);
}
```

FIG. 20A

```
class CompressedCoordinateInterpolator {
        KeyHeader kHeader;
        CoordIKeyValueHeader coordIKVHeader;
        qf_start();
        aligned(8) Key k(kHeader);
        CoordIKeyValue coordIKeyValue(coordIKVHeader,
kHeader.nNumberOfKey);
}
```

FIG. 20B

```
class KeyHeader {
        int i;
        unsigned int(5) nKeyQBit;
        unsigned int(5) nNumKeyCodingBit;
        unsigned int(nNumKeyCodingBit) nNumberOfKey;
        unsigned int(4) nKeyDigit;
        bit(1) bIsLinearKeySubRegion;
        if(bIsLinearKeySubRegion == 1)
                LinearKey lKey(nKeyDigit);
        bit(1) bRangeFlag;
        if(bRangeFlag == 1)
                KeyMinMax keyMinMax(nKeyDigit);
        unsigned int(5) nBitSize;
        unsigned int(2) nKDPCMOrder;
        for(i = 0; i < nKDPCMOrder + 1; i++) {
                bit(1) nQIntraKeySign[[i]]
                if(i == 0 && nQIntraKeySign[i] == 1)
                        continue
                unsigned int(nBitSize) nQIntraKey[[i]];
        }
        bit(1) bShiftFlag
        if(bShiftFlag == 1) {
                bit(1) nKeyShiftSign;
                unsigned int(nBitSize) nKeyShift
        }
        unsigned int(3) nDNDOrder;
        if(nDNDOrder == 7) {
                bit(1) bNoDND;
                if(bNoDND == 1)
                        nDNDOrder = -1;
        }
        int nMaxQBit = nBitSize;
        for(i = 0; i < nDNDOrder; i++) {
                bit(1) nKeyMaxSign[[i]];
                unsigned int(nMaxQBit) nKeyMax[[i]];
                nMaxQBit = (int)(log10(abs(nKeyMax[i]))/log10(2))+1;
                if(nMaxQBit+1 < nBitSize)
                        nMaxQBit += 1;
                else
                        nMaxQBit = nBitSize;
        }
        int bSignedAACFlag;
        int nKeyCodingBitQBit = (int)(log10(nKeyQBit))/log10(2))+1;
        unsigned int(nKeyCodingBitQBit) nKeyCodingBit;
        if(nDNDOrder != -1 && nDNDOrder != 0) {
                bit(1) bKeyInvertDownFlag;
                if(bKeyInvertDownFlag == 1) {
                        unsigned int(nKeyCodingBit) nKeyInvertDown;
                        bSignedAACFlag = 0;
                } else {
                        bSignedAACFlag = 1;
                }
        } else {
                bSignedAACFlag = 0;
        }
}
```

FIG. 20C

```
class LinearKey (int nKeyDigit) { unsigned int(5) nNumLinearKeyCodingBit;

unsigned int(nNumLinearKeyCodingBit) nNumberOfLinearKey ;

KeyMinMax kMinMax(nKeyDigit);

```
class KeyMinMax (int nKeyDigit) {
    bit(1) bMinKeyDigitSame;
    if((bMinKeyDigitSame == 0)
        unsigned int(4) nMinKeyDigit;
    else
        nMinKeyDigit = nKeyDigit;
    if(nMinKeyDigit != 0) {
        if(nMinKeyDigit < 8) {
            int count = (int)(log10(10^nMinKeyDigit-1)/log10(2)) + 1;
            bit(1) nMinKeyMantissaSign;
            unsigned int(count) nMinKeyMantissa;
            bit(1) nMinKeyExponentSign;
            unsigned int(6) nMinKeyExponent;
        } else
            float(32) fKeyMin;
    }
    bit(1) bMaxKeyDigitSame;
    if(bMaxKeyDigitSame == 0)
        unsigned int(4) nMaxKeyDigit;
    else
        nMaxKeyDigit = nKeyDigit;
    if(nMaxKeyDigit != 0) {
        if(nMaxKeyDigit < 8) {
            int count = (int)(log10(10^nMaxKeyDigit)-1)/log10(2)) + 1;
            bit(1) nMaxKeyMantissaSign;
            unsigned int(count) nMaxKeyMantissa;
            bit(1) bSameExponent;
            if(bSameExponent == 0) {
                bit(1) nMaxKeyExponentSign;
                unsigned int(6) nMaxKeyExponent;
            }
            else
                nMaxKeyExponent = nMinKeyExponent;
        } else
            float(32) fKeyMax;
    }
}
```

FIG. 20E

```
class Key (KeyHeader kHeader) {
        int nQKey[kHeader.nNumberOfKey];
        int i;
        int nNumberOfRemainingKey;
        if(kHeader.bIsLinearKeySubRegion == 1)
                nNumberOfRemainingKey = kHeader.nNumberOfKey
kHeader.lKey.nNumberOfLinearKey;
        else
                nNumberOfRemainingKey = kHeader.nNumberOfKey;
        for(i = kHeader.nKDPCMOrder+1; i < nNumberOfRemainingKey; i++) {
                if(kHeader.bSignedAACFlag == 0)
                        decodeUnsignedAAC(nQKey[i], kHeader.nKeyCodingBit, keyContext);
                else
                        decodeSignedAAC(nQKey[i], kHeader.nKeyCodingBit+1,
keySignContext, keyContext);
        }
}
```

FIG. 20F

```
class CoordIKeyValueHeader {
    bit(1) bTranspose;
    unsigned int(5) nKVQBit;
    unsigned int(5) nCoordQBit;
    unsigned int(nCoordQBit) nNumberOfCoord;
    unsigned int(4) nKVDigit;
    KeyValueMinMax kVMinMax (nKVDigit);
    unsigned int(nKVQBit) nXQMinOfMin;
    unsigned int(nKVQBit) nXQMinOfMax;
    unsigned int(nKVQBit) nYQMinOfMin;
    unsigned int(nKVQBit) nYQMinOfMax;
    unsigned int(nKVQBit) nZQMinOfMin;
    unsigned int(nKVQBit) nZQMinOfMax;
    unsigned int(nKVQBit) nXQMaxOfMin;
    unsigned int(nKVQBit) nXQMaxOfMax;
    unsigned int(nKVQBit) nYQMaxOfMin;
    unsigned int(nKVQBit) nYQMaxOfMax;
    unsigned int(nKVQBit) nZQMaxOfMin;
    unsigned int(nKVQBit) nZQMaxOfMax;
}
```

FIG. 20G

```
class CoordIKeyValue (CoordIKeyValueHeader coordIKVHeader, int nNumberOfKey) {
        int j, c;
    if(coordIKVHeader.bTranspose == 1) {
        int temp = nNumberOfKey;
        nNumberOfKey = coordIKVHeader.nNumberOfCoord;
        coordIKVHeader.nNumberOfCoord = temp;
    }
        int nKVACodingBitQBit = (int)(log10(abs(coordIKVHeader.nKVQBit))/log10(2))+1;
        int nDPCMMode[coordIKVHeader.nNumberOfCoord][3];
        unsigned int bSelFlag[coordIKVHeader.nNumberOfCoord][3] = 1;
        CoordIDPCMMode coordIDPCMMode(coordIKVHeader);
        for(j = 0; j < coordIKVHeader.nNumberOfCoord; j++) {
                for(c = 0; c < 3; c++) {
                        if(c == 0) {
                                if(coordIKVHeader.nXQMaxOfmin <=
coordIKVHeader.nXQMinOfmax) {
                                        qf_decode(&bSelFlag[j][c],
selectionFlagContext),
                                }
                        }
                        else if(c == 1) {
                                if(coordIKVHeader.nYQMaxOfmin <=
coordIKVHeader.nYQMinOfmax) {
                                        qf_decode(&bSelFlag[j][c],
selectionFlagContext),
                                }
                        }
                        else if(c == 2) {
                                if(coordIKVHeader.nZQMaxOfmin <=
coordIKVHeader.nZQMinOfmax) {
                                        qf_decode(&bSelFlag[j][c],
selectionFlagContext);
                                }
                        }
                }
```

FIG. 20H

```
                            if(bSelFlag[j][c] == 1) {
                                if(c == 0)
                                        decodeUnsignedAAC(&nKVACodingBit[j][c],
nKVACodingBitQBit, aqpXContext);
                                else if(c == 1)
                                        decodeUnsignedAAC(&nKVACodingBit[j][c],
nKVACodingBitQBit, aqpYContext);
                                else if(c == 2)
                                        decodeUnsignedAAC(&nKVACodingBit[j][c],
nKVACodingBitQBit, aqpZContext);
                                if(j > 0) {
                                        if(nDPCMMode[j][c] == 2 || nDPCMMode[j][c] ==
3) {
                                                int nQBitOfRef =
(int)(log10(abs(j-1))/log10(2))+1;
                                                decodeUnsignedAAC(&nRefVertex[j][c],
nQBitOfRef, refContext),
                                        }
                                }
                                if(nKVACodingBit[j][c] != 0) {
                                        decodeSignedAAC(&nQMin[j][c],
coordIKVHeader.nKVQBit+1,
                                                qMinSignContext, qMinContext);
                                        decodeSignedAAC(&nQMax[j][c],
coordIKVHeader.nKVQBit+1,
                                                            qMaxSignContext,
qMaxContext);
                                }
                        } else
                                decodeSignedAAC(&nQMin[j][c], coordIKVHeader.nKVQBit+1,
                                        qMinSignContext, qMinContext);

CoordIKeyValueDic coordIKeyValueDic(bSelFlag[j][c],
                                KVACodingBit[j][c], nNumberOfKey, c);
                }
        }
}
```

FIG. 20I

```
class CoordIDPCMMode (CoordIKeyValueHeader coordIKVHeader) {
    int i, s, k;
    unsigned int bIndexDPCMMode[coordIKVHeader.nNumberOfCoord] = 0;
    int nNumberOfSymbol = 0;
    for(i = 0; i < 27; i++) {
        qf_decode(&bAddressOfDPCMMode[i], dpcmModeDicAddressContext);
        if(bAddressOfDPCMMode[i] == 1)
            nNumberOfSymbol++;
    }
    for(s = 0; s < nNumberOfSymbol; s++) {
        for(k = 1; k < coordIKVHeader.nNumberOfCoord; k++) {
            if(bIndexDPCMMode[k] == 0) {
                qf_decode(&bDPCMIndex, dpcmModeDicIndexContext);
                if(bDPCMIndex == 1)
                    bIndexDPCMMode[k] = 1;
            }
        }
    }
}
```

FIG. 20J

```
class CoordIKeyValueDic (unsigned int bSelFlag, unsigned int nKVCodingBit,
int nNumberOfKey, int c) {
        if(bSelFlag == 1 && nKVCodingBit != 0) {
                qf_decode(&nDicModeSelect, dicModeSelectionContext);
                if(nDicModeSelect == 1)
                        CoordIIncrementalMode
coordIIncrementalMode(nKVCodingBit, nNumberOfKey);
                else
                        CoordIOccurrenceMode coordIOccurrenceMode(nKVCodingBit,
        nNumberOfKey, c);
        }
}
```

FIG. 20K

```
class CoordIIncrementalMode (unsigned int nKVCodingBit, int nNumberOfKey) {
    int i, s, k;
    int nSizeOfAddress = (2^ nKVCodingBit+1)-1;
    unsigned int bAddrIndex[nNumberOfKey] = 0;
    int nNumberOfSymbol = 0;
    for(i = 0; i < nSizeOfAddress; i++) {
        qf_decode(&bAddress[i], dicAddressContext);
        if(bAddress[i] == 1) {
            nNumberOfSymbol++;
        }
    }
    for(s = 0; s < nNumberOfSymbol; s++) {
        qf_decode(&nTrueOne, dicOneContext);
        for(k = 0; k < nNumberOfKey; k++) {
            if(bIndexOfAddr[k] == 0) {
                qf_decode(&bAddrIndex, dicIndexContext);
                if(bAddrIndex == nTrueOne) {
                    bAddrIndex[k] = 1;
                }
            }
        }
    }
}
```

FIG. 20L

```
class CoordIOccurrenceMode (unsigned int nKVCodingBit, int nNumberOfKey, int c) {
        int i, k;
        unsigned int bIndexOfDic[nNumberOfKey] = 0;
        for(i = 0; i < nNumberOfKey; i++) {
                if(bIndexOfDic[i] == 0) {
                        bIndexOfDic[nNumberOfKey] = 1;
                        if(c == 0)
                                decodeSignedQuasiAAC(&nQKV[i], nKVCodingBit+1,
                                        kvSignContext, kvXContext);
                        else if(c == 1)
                                decodeSignedQuasiAAC(&nQKV[i], nKVCodingBit+1,
                                        kvSignContext, kvYContext);
                        else if(c == 2)
                                decodeSignedQuasiAAC(&nQKV[i], nKVCodingBit+1,
                                        kvSignContext, kvZContext);
                        qf_decode(&bSoleKV, dicSoleKVContext);
                        if(bSoleKV == 0) {
                                qf_decode(&nTrueOne, dicOneContext);
                                for(k = i+1; k < nNumberOfKey; k++) {
                                        if(bIndexOfDic[k] == 0) {
                                                int bDicIndex;
                                                qf_decode(&bDicIndex,
dicIndexContext);
                                                if(bDicIndex == nTrueOne)
                                                        bIndexOfDic[k] = 1;
                                        }
                                }
                        }
                }
        }
}
```

// # APPARATUS FOR ENCODING AND DECODING KEY DATA AND KEY VALUE DATA OF COORDINATE INTERPOLATOR AND RECORDING MEDIUM CONTAINING BITSTREAM INTO WHICH COORDINATE INTERPOLATOR IS ENCODED

This application claims the priority of Korean Patent Application No. 2002-64008, filed Oct. 19, 2002, in the Korean Intellectual Property Office. This application also claims the benefit of U.S. Provisional Application No. 60/333,130, filed Nov. 27, 2001; U.S. Provisional Application No. 60/334,541, filed Dec. 3, 2001; U.S. Provisional Application No. 60/342,101, filed Dec. 26, 2001; and U.S. Provisional Application No. 60/369,597, filed Apr. 4, 2002. The entire contents of these applications are incorporated herein by reference.

BACKGROUND OF THE INVENTION

1. Field of the Invention

The present invention relates to an apparatus and a method for encoding and decoding synthetic images, and more particularly, to an apparatus and a method for encoding and decoding a coordinate interpolator representing the location of each vertex of an object in a keyframe-based graphic animation using coordinates of the vertices each consisting of x, y, and z components.

2. Description of the Related Art

Three-dimensional (3D) animation techniques have been widely adopted in 3D computer games or virtual reality computer applications. Virtual reality modeling language (VRML) is a representative example of such 3D animation techniques.

International multimedia standards, such as MPEG-4 binary format for scene (BIFS) and virtual reality modeling language (VRML), support a keyframe-based 3D animation using an interpolator node. In MPEG-4 BIFS and VRML, there are various kinds of interpolators including a scalar interpolator, a position interpolator, a coordinate interpolator, a orientation interpolator, a normal line interpolator, and a color interpolator, and these interpolators and their functions and characteristics are shown in Table 1.

TABLE 1

| Interpolator | Characteristics | Function |
|---|---|---|
| Scalar interpolator | Linear interpolation of scalar variations | Capable of representing area, diameter, and intensity |
| Position interpolator | Linear interpolation on 3D coordinates | Parallel movement in 3D space |
| Orientation interpolator | Linear interpolation of 3D coordinate axis and amount of rotation | Rotation in 3D space |
| Coordinate interpolator | Linear interpolation of variations in 3D coordinates | 3D morphing |
| Normal line interpolator | Linear interpolation of 3D coordinates of normal line | Capable of representing variations in 3D vector of normal line |
| Color interpolator | Linear interpolation of color information | Capable of representing variations in color |

Among the interpolators shown in Table 1, the coordinate interpolator is used to represent information on the location of each vertex constituting a 3D object in a keyframe-based animation and are comprised of keys and key value fields. Key fields represent the position of each keyframe on a temporal axis using discontinuous numbers in a range between −∞ and ∞. Each of the Key value fields specifies information on the position of each of the vertices constituting a 3D object at a certain moment represented by each of the keys and consists of three components x, y, and z. Each of the key value fields includes as many key values as each of the key fields has. In such a keyframe-based animation, predetermined keyframes are located at arbitrary places on a temporal axis, and animation data between the keyframes are filled by linear interpolation.

Since linear interpolation is employed in MPEG-4 BIFS and VRML, a considerable amount of key data and key value data is required to represent an animation as naturally and smoothly as possible using linear interpolators. In addition, in order to store and transmit such a natural and smooth animation, a storage of a large capacity and a considerable amount of time are needed. Therefore, it is preferable to compress interpolators in order to make it easier to store and transmit the interpolators.

In predictive MF field coding (PMFC), which is one of the methods for encoding and decoding interpolator nodes that have been adopted in MPEG-4 BIFS, key value data of a coordinate interpolator are encoded using a quantizer, a differential pulse code modulation (DPCM) operator, and an entropy encoder, as shown in FIG. 1. Referring to FIG. 1, the quantizer and the DPCM operator removes redundancy of the key value data, and the DPCM operator outputs the results of its operation to the entropy encoder. However, PMFC is not sufficiently effective in encoding key value data because it entropy-encodes only differential data obtained from a general DPCM operation and considers only a spatial correlation between vertices constituting a 3D object in an animation without taking into consideration a temporal correlation between such vertices, which is very important in a keyframe-based animation.

SUMMARY OF THE INVENTION

To solve the above and other problems, it is an aspect of the present invention to provide an apparatus for encoding a coordinate interpolator including a key data encoder, which compresses animation key data with a high efficiency while reducing redundancy among data, and a key value data encoder, which encodes key value data taking into consideration a temporal correlation between the key value data as well as a spatial correlation between the key value data.

It is another aspect of the present invention to provide an apparatus for decoding a bitstream encoded by the apparatus for encoding a coordinate interpolator according to the present invention.

It is another aspect of the present invention to provide a recording medium capable of providing a high-quality animation with a high compression rate, on which a bitstream encoded by the method and the apparatus for encoding a coordinate interpolator according to the present invention and to be decoded by the method and the apparatus for decoding a coordinate interpolator according to the present invention is recorded.

Accordingly, to achieve the above and other aspects of the present invention, there is provided an apparatus for encoding a coordinate interpolator, which includes key data indicating the location of each keyframe on a temporal axis and key value data representing the location of each vertex of an object in each keyframe using coordinates of the vertices each consisting of x, y, and z components. The apparatus includes a key data encoder, a key value data encoder, and a header encoder. The key data encoder includes a first quantizer which quantizes key data of a coordinate interpolator using predetermined quantization bits, a first DPCM processor which generates differential data of the quantized key data, a DND processor which performs a DND operation on the differential data depending on a relationship between the differential data and a maximum value and a minimum value among them, and a first entropy encoder which entropy-encodes the differential data input from the DND processor. The key value data encoder includes a second quantizer which quantizes key value data of a coordinate interpolator using predetermined quantization bits, a second DPCM processor which generates differential data based on the temporal variation of coordinates of each vertex of quantized key value data and differential data based on the spatial variation of the coordinates of each of the vertices of the quantized key value data by performing a predetermined DPCM operation on components of each of the vertices of the quantized key value data, a dictionary encoder which generates symbols indicating DPCMed differential data of each of the vertices and a DPCM operation mode, which has been performed on the differential data and indexes indicating the positions of the symbols, and a second entropy encoder which entropy-encodes the symbols and the indexes. The header encoder encodes information necessary to decode a bitstream encoded by the key data encoder and the key value data encoder.

To achieve the above as well as other aspects of the present invention, there is provided an apparatus for decoding a bitstream, into which a coordinate interpolator, which includes key data indicating the location of each keyframe on a temporal axis and key value data representing the location of each vertex of an object in each of the keyframes using coordinates of the vertices each consisting of x, y, and z components, is encoded. The apparatus includes a key data decoder and a key value data decoder. The key data decoder includes a header decoder which decodes header information necessary to decode key data and key value data from an input bitstream and outputs the decoded header information, a first entropy decoder which entropy-decodes the input bitstream and outputs differential data of decoded key data, an inverse DND processor which extends the range of differential data of the entropy-decoded key data by performing an inverse DND operation on the differential data depending on the order of DND read from the input bitstream by the header decoder, a first inverse DPCM processor which performs an inverse DPCM operation on the differential data input from the inverse DND processor as many times as the order of DPCM input from the header decoder and outputs quantized key data, and a first inverse quantizer which inverse-quantizes the quantized key data and outputs decoded key data. The key value data decoder includes a second entropy decoder which generates data to be dictionary-decoded, including symbols of differential data of key value data, indexes indicating the positions of the symbols, and a DPCM operation mode, by entropy-decoding the input bitstream, a dictionary decoder which generates differential data of key value data by performing a dictionary decoding operation depending on a dictionary decoding mode information input from the header decoder, a second inverse DPCM processor which generates quantized data by retrieving differential data between keyframes and differential data between vertices, which are input from the dictionary decoder, depending on the DPCM operation mode, and a second inverse quantizer which generates retrieved key value data by inverse-quantizing the quantized data.

To achieve the above as well as other aspects of the present invention, there is provided a bitstream, into which a coordinate interpolator, which includes key data indicating the location of each keyframe on a temporal axis and key value data representing the location of each vertex of an object in each of the keyframes using coordinates of the vertices each consisting of x, y, and z components, is encoded. The bitstream includes key data encoding/decoding information, into which key data and information necessary to decode the key data are encoded, and key value data encoding/decoding information, into which key value data and information necessary to decode the key value data are encoded. The key data encoding/decoding information includes inverse DND operation information including the order of inverse DND indicating a predetermined number of cycles of inverse DND to be performed on differential data generated by entropy-decoding the bitstream in order to extend the range of the differential data and maximum and minimum values among differential data used in each cycle of inverse DND operation, first inverse DPCM operation information including the order of inverse DPCM operation to be performed on the inverse-DNDed differential data so as to convert the inverse-DNDed differential data into quantized key data and intra key data which are used for each cycle of inverse DPCM operation, and first inverse quantization information used in inverse quantization to generate retrieved key data by inverse-quantizing the quantized key data. The key value data encoding/decoding information includes dictionary decoding information including information on symbols representing differential data of dictionary-encoded key value data, which are entropy-decoded from the bitstream, first position indexes indicating the positions of the symbols, and a dictionary decoding mode indicating a dictionary decoding method to be performed on the first position indexes, second inverse DPCM operation information including second position indexes indicating the positions of symbols, which are used in an inverse DPCM operation to convert dictionary-decoded differential data of components of each vertex into quantized key value data and correspond to combinations of inverse DPCM operation modes, and second inverse quantization information used in inverse quantization to generate retrieved key value data by inverse-quantizing the quantized key value data.

BRIEF DESCRIPTION OF THE DRAWINGS

The above objects and advantages of the present invention will become more apparent by describing in detail preferred embodiments thereof with reference to the attached drawings in which:

FIG. 18B is a diagram illustrating an example of program codes, by which a function decodeSignedQuasiAAC( ) used in an entropy decoder according to the present invention is realized;

FIGS. 20A through 20L are diagrams illustrating examples of SDL program codes by which an apparatus for decoding key data and key value data of a coordinate interpolator according to a preferred embodiment of the present invention is realized.

DETAILED DESCRIPTION OF THE INVENTION

Hereinafter, an apparatus for encoding a coordinate interpolator according to a preferred embodiment of the present invention will be described more fully with reference to the accompanying drawings, in which preferred embodiments of the invention are shown.

Figure 1:
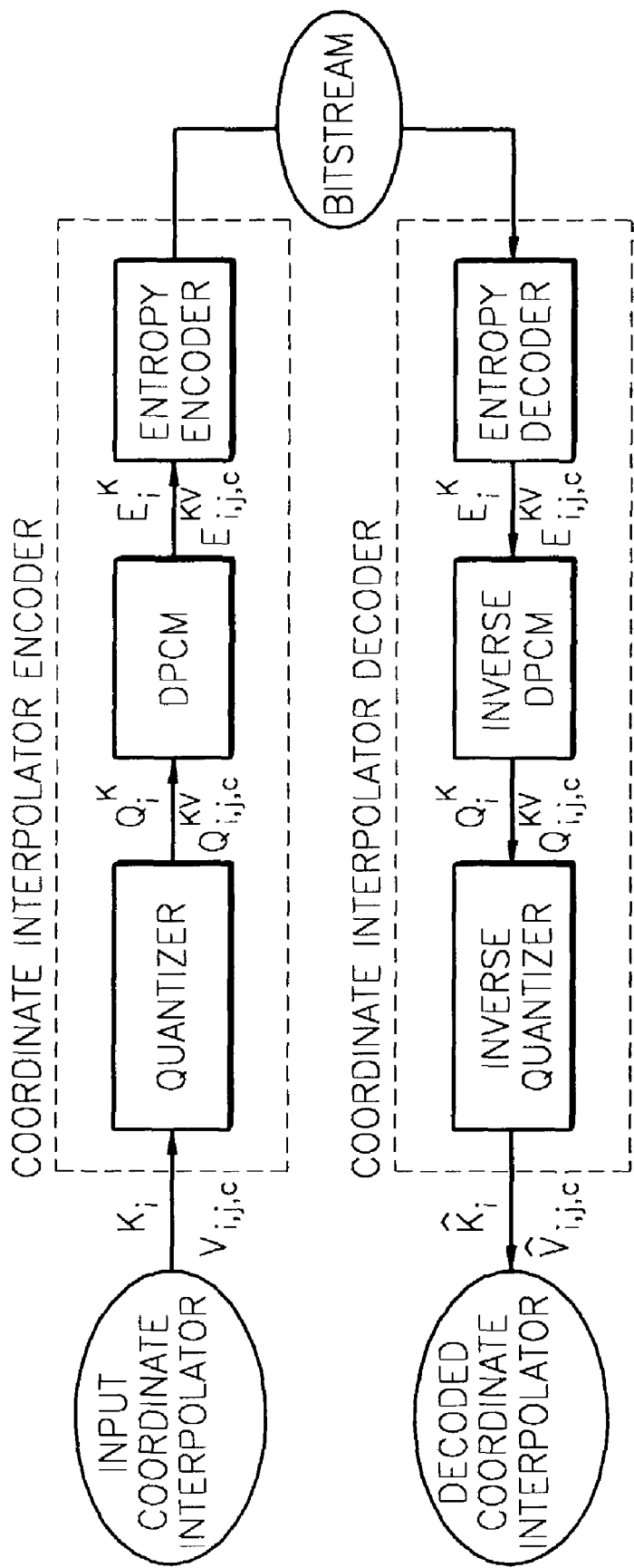
FIG. 1 is a block diagram of a conventional coordinate interpolator encoder and a conventional coordinate interpolator decoder.
Figure 2:
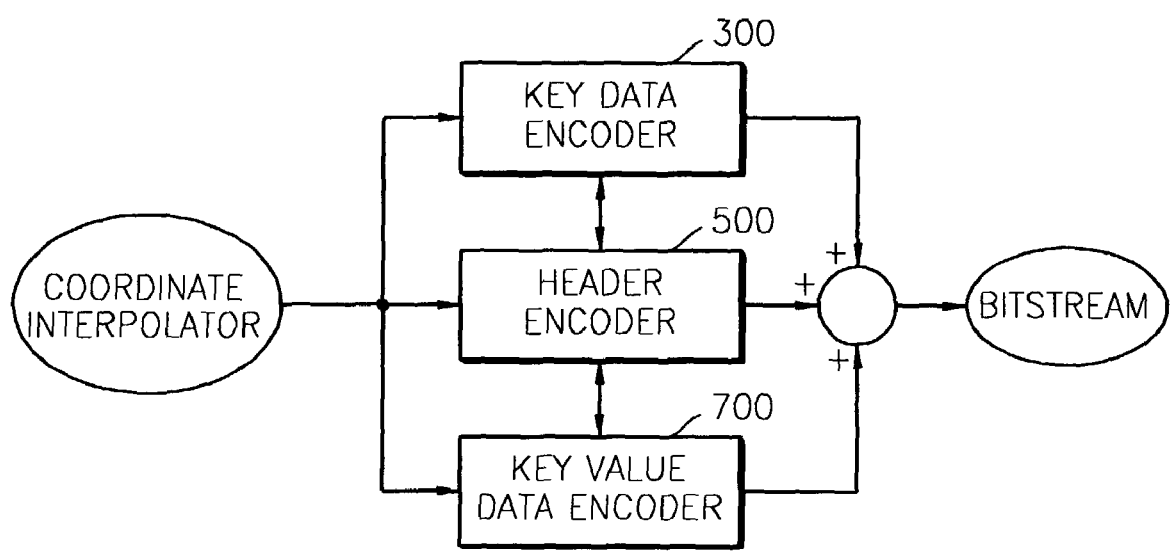
FIG. 2 is a block diagram of an apparatus for encoding a coordinate interpolator according to a preferred embodiment of the present invention.

FIG. 2 is a block diagram of an apparatus for encoding a coordinate interpolator according to a preferred embodiment of the present invention. Referring to FIG. 2, the apparatus for encoding a coordinate interpolator includes a key data encoder 300, which encodes key data of a coordinate interpolator input thereinto, a key value data encoder 700, which encodes key value data of a coordinate interpolator input thereinto, and a header encoder 500, which encodes information necessary to decode the key data encoded by the key data encoder 300 and the key value data encoded by the key value data encoder 700.

Hereinafter, the key data encoder 300 will be described with reference to FIGS. 3A through 6J.

Figure 3A:
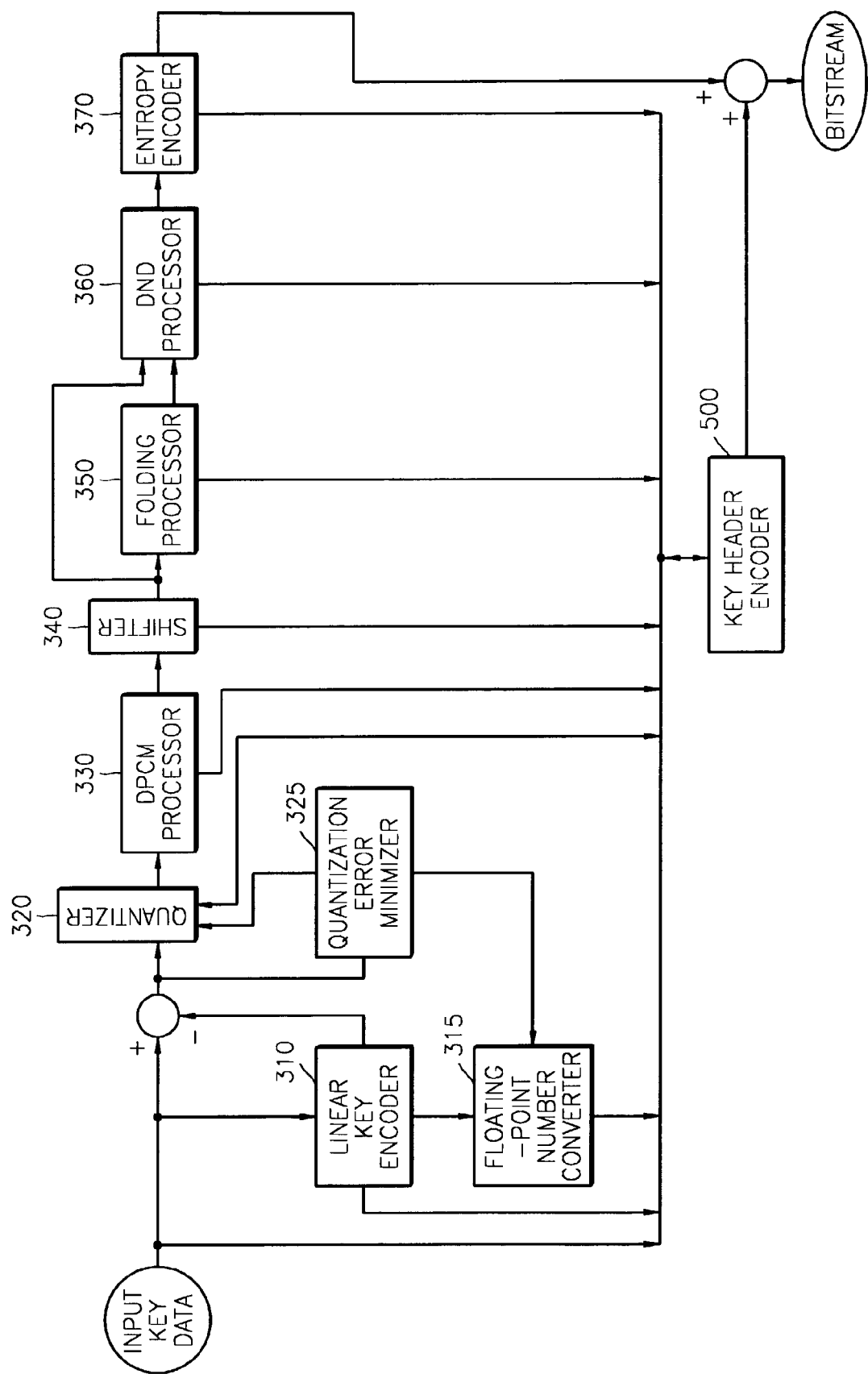
FIG. 3A is a block diagram of a key data encoder according to a preferred embodiment of the present invention.

FIG. 3A is a block diagram of the key data encoder 300. Referring to FIG. 3A, the key data encoder 300 includes a linear key encoder 310, a quantizer 320, a DPCM processor 330, a shifter 340, a folding processor 350, a DND processor 360, and an entropy encoder 370.

The linear key encoder 310 identifies a region where key data linearly increase in an entire key data range and encodes the region. The quantizer 320 quantizes key data input thereinto using a quantization method capable of minimizing a quantization error. The DPCM processor 330 receives quantized key data and generates differential data of the quantized key data. The shifter 340 subtracts a differential datum having the highest frequency from all differential data. The folding processor 350 transfers all differential data to a positive number region or a negative number region. The DND processor 360 reduces the range of differential data of key data by performing a divide operation and then selectively performing a divide-up operation or a divide-down operation on the differential data. The entropy encoder 370 encodes differential data using a function SignedAAC or UnsignedAAC, by which the differential data are encoded on every bit plane.

Figure 4A:
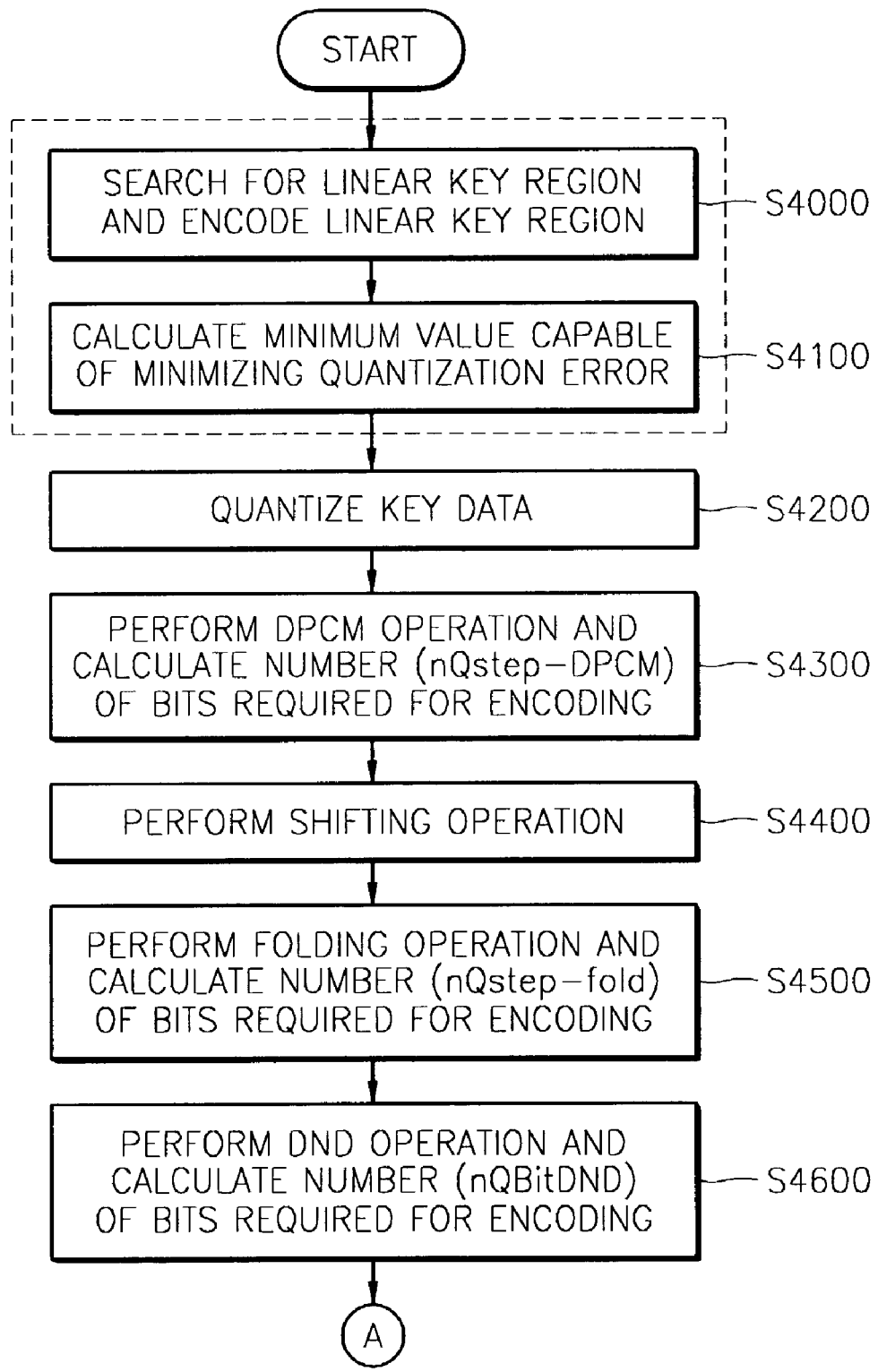
FIGS. 4A through 4G are flowcharts of a method for encoding key data according to a preferred embodiment of the present invention.
Figure 4B:
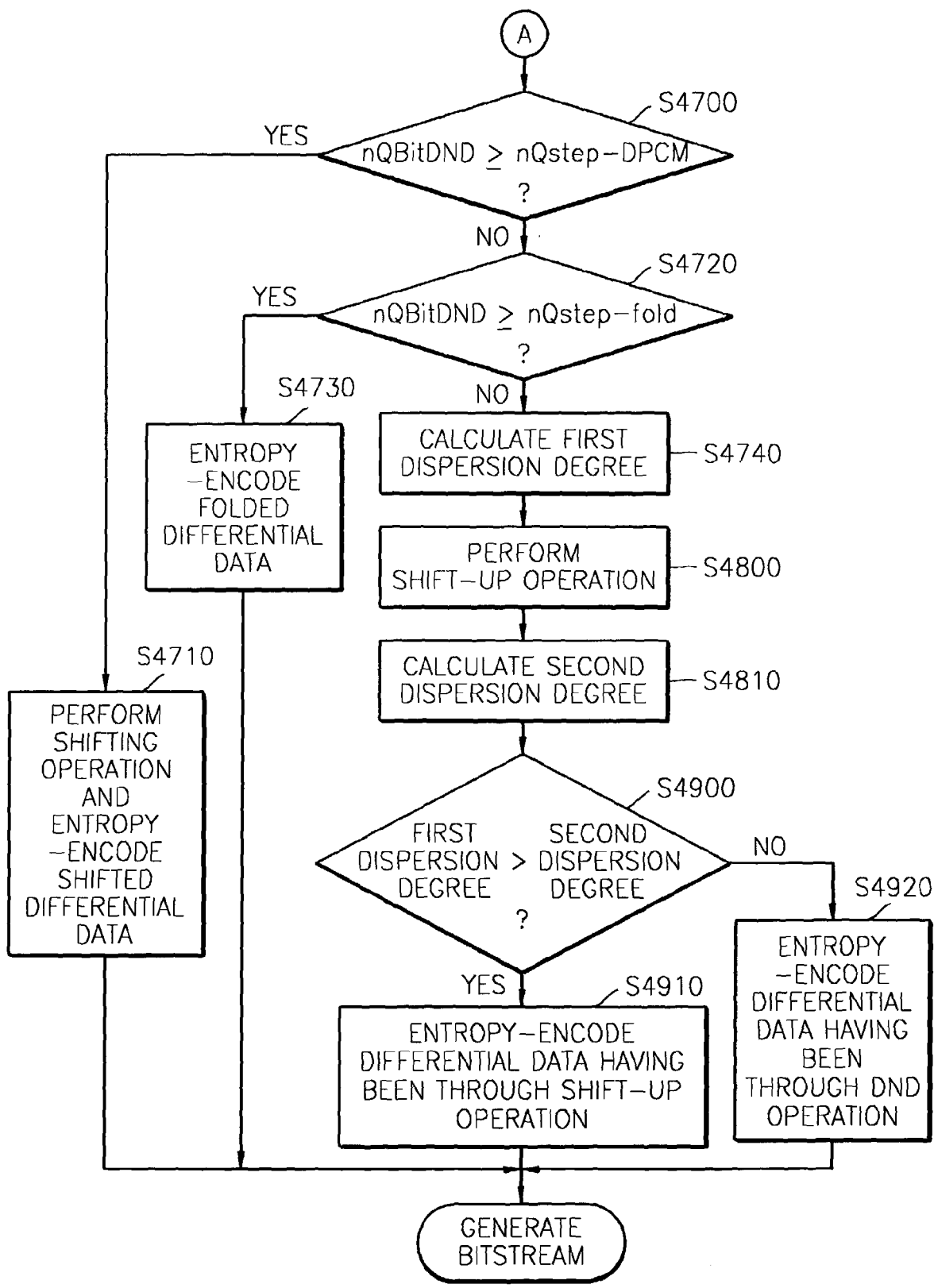

Hereinafter, the operation of the key data encoder 300 will be described with reference to FIGS. 4A and 4B. FIGS. 4A and 4B are flowcharts of a method for encoding key data according to the present invention.

When key data are input into the key data encoder 300, information, such as the number of key data and the number of digits of the key data, is input into the header encoder 500 and then is encoded. The linear key encoder 310 searches for a linear key region, i.e., a region where key frames exist at certain temporal intervals, key data have the same difference, and the key data changes linearly, in the input key data and encodes the searched linear key region first in step S4000.

Famous 3D application software, such as 3DMax or Maya, generates key-frame based animation using keys having a predetermined time interval therebetween in specific regions. In this case, it is possible to easily encode key data using the beginning and ending key data of a linear key data region and the number of key frames existing between them. Accordingly, linear prediction is very useful for encoding keys in a certain region using an interpolator.

The following equation is used for linear prediction.

$$t(i) = \frac{t_E - t_S}{E - S} + t_S \,(0 \le i \le E - S,\, S < E) \tag{1}$$

Here, $t_S$ represents the data of a key where a partially linear region begins, $t_E$ represents the data of a key where the partially linear region ends, S represents an index of $t_S$, and E represents an index of $t_E$. The error between real key data in a specific region ranging from S-th key data to E-th key data and key data linearly predicted following Equation (1) can be calculated using the following equation.

$$e_i = t(i) - t_{i+S} = \frac{t_E - t_S}{E - S} i + t_S - t_{i+S} \tag{2}$$

If a maximum value among errors calculated using Equation (2) is not greater than a predetermined critical value, $t_i$ can be considered co-linear in region $[t_S, t_E]$ or within a certain range of errors. Whether or not the maximum error value $t_i$ is co-linear with the specific region is determined using the following Equation (3).

$$E_p = \underset{i=0,(E-S)}{\text{MAX}} |e_i| = \underset{i=0,(E-S)}{\text{MAX}} \left| \frac{t_E - t_S}{E - S} i + t_S - t_{i+S} \right| \tag{3}$$

If $$E_p \le \frac{1}{2^{nBits+1}},$$

$t_i$ is co-linear with region $[t_S, t_E]$. Here, nBits represents the number of bits used for encoding.

If the linear key encoder 310 searches for the partially linear region, the beginning and ending key data of the partially linear key data region are output to a floating-point number converter 315. The number of keys included in the linear key data region is output to the header encoder 500 and is encoded. It is possible to considerably reduce the amount of data to be encoded using linear encoding.

The beginning key data and the ending key data are encoded using floating-point number conversion performed in the floating-point number converter 315, which will be described later.

The floating-point number converter 315 converts key data represented in the binary system into the decimal system in order to encode the beginning key data and the ending key data.

A computer stores floating-point numbers as 32-bit binary numbers. If a floating-point number represented in the binary system is given, the floating-point number converter 315 converts the floating-point number into a mantissa and an exponent in the decimal system, and this process is expressed by the following equation.

$$\underbrace{\text{mantissa\_binary} * 2^{\text{exponent\_binary}}}_{\text{the floating-point number in binary system}} = \underbrace{\text{mantissa} * 10^{\text{exponent}}}_{\text{the floating-point number in decimal system}} \tag{4}$$

For example, a floating-point number 12.34 can be converted into a binary number by a computer, which is shown in the following.

$$\underset{1}{0}\;\underset{2}{10001010111000010100011}\;\underset{3}{10000010}$$

1: the sign

2: the mantissa in the binary system

3: the exponent in the binary system

The binary number can be converted into a decimal number following Equation (4), which is shown in the following.

$$\underset{1}{0}\;\underset{2}{1234}\;\underset{3}{2}$$

1: the sign

2: the mantissa in the decimal system

3: the exponent in the decimal system

In order to include a mantissa and an exponent in the decimal system in a bitstream, the numbers of bits required to represent the mantissa and the exponent must be calculated. The exponent has a value between −38 and 38 and thus can be expressed together with its sign using 7 bits. The number of bits required to represent the mantissa is dependent on the number of digits. The values of the mantissa and the number of bits required to represent the mantissa are shown in the following table.

TABLE 2

| Values of mantissa | Digits of mantissa | Number of bits required |
|---|---|---|
| 0 | 0 | 0 |
| 1-9 | 1 | 4 |
| 10-99 | 2 | 7 |
| 100-999 | 3 | 10 |
| 1000-9999 | 4 | 14 |
| 10000-99999 | 5 | 17 |
| 100000-999999 | 6 | 20 |
| 1000000-9999999 | 7 | 24 |

Figure 4C:
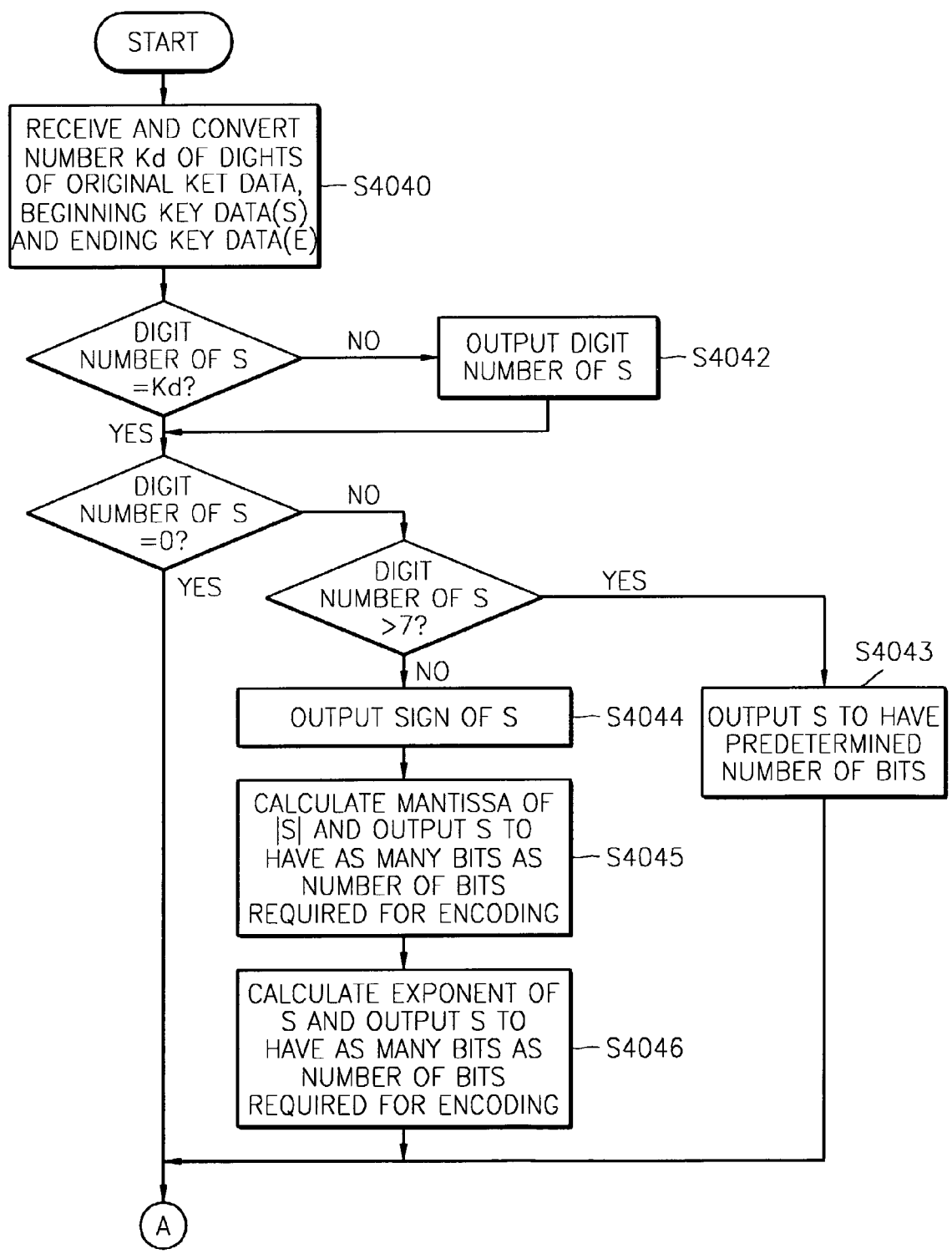
Figure 4D:
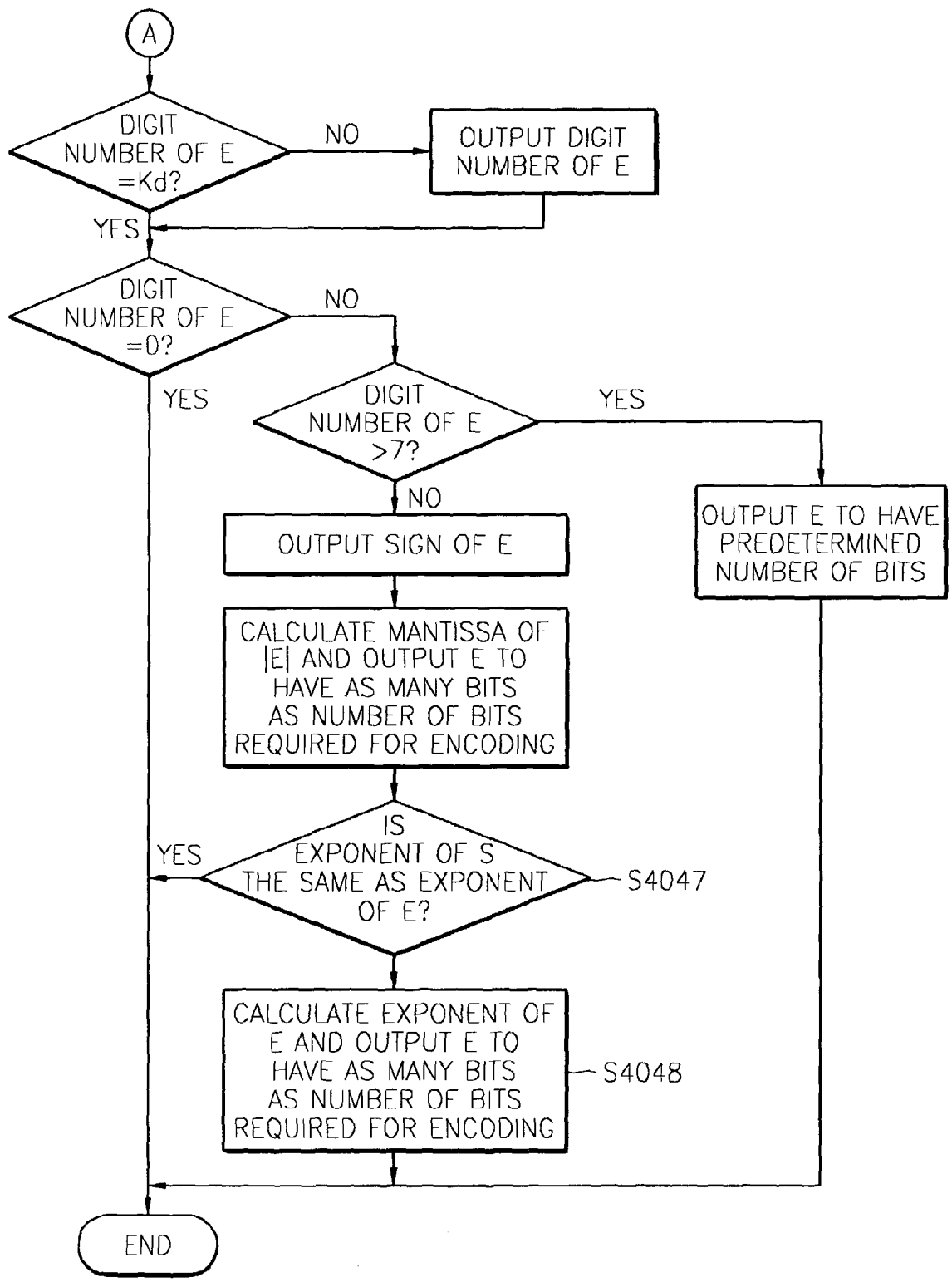

The beginning and ending key data of the linear key data region that have been searched for and converted using the above-mentioned processes are encoded following the encoding process shown in FIGS. 4C and 4D, are output to the header encoder 500, and are stored in the bitstream.

FIGS. 4C and 4D show a process of encoding two floating-point numbers input into the floating-point number converter 315. The way the floating-point number converter 205 encodes a floating-point number will be described with reference to FIGS. 4C and 4D.

The floating-point number converter 315 receives the digit number Kd of original key data, beginning key data S, and ending key data E and converts them in step S4040 following Equation (4).

The floating-point number converter 315 encodes S first. In particular, the floating-point number converter 315 checks whether or not the digit number of S is different from Kd. If the digit number of S is different from Kd, the digit number of S is obtained and is output to the header encoder 500 in step S4042. The floating-point number converter 315 obtains the digit number of S using function Digit ( ).

If the digit number of S is greater than 7, S is output to the header encoder 500 using a predetermined number of bits (in the present invention, 32 bits are used following a floating-point number manner of IEEE Standard 754) in step 4043 so that the digit number of S can be included in the bitstream.

If the digit number of S is not 0 and is smaller than 7, the floating-point number converter 315 outputs the sign of S to the header encoder 500 in step 4044. The number of bits required to encode the absolute value of the mantissa of S, is obtained using Table 2. Next, the absolute value of the mantissa of S is output to the header encoder 500 using the number of bits obtained using Table 2, in step 4045. The floating-point number converter 315 calculates the exponent of S, outputs the sign of S to the header encoder 500, and outputs the exponent to the header encoder 500 as a predetermined number of bits, for example, 6 bits, in step S4046. Such key data conversion makes it possible to considerably reduce the number of bits included in the bitstream.

If the digit number of S is 0, encoding the beginning key data is ended, and the method goes to a step of converting the ending key data E because when the digit number of S is 0, the corresponding floating-point number is also 0, which does not require encoding.

After converting and encoding the beginning key data S, the floating-point number converter 315 converts the ending key data E. The conversion of E is almost the same as that of S. In particular, whether or not the exponent of E is the same as that of S is verified in step S4047. If the exponent of E is the same as that of S, only a flag bit representing that the exponent of E is the same as the exponent of S is output to the header encoder 500. If the exponent of E is not the same as that of S, the exponent of E as well as the flag bit is output to the header encoder 500 in the same way as the exponent of S has been output to the header encoder 500, in step S4048.

Key data among the input key data, which do not belong to the linear key region, are input into the quantizer 320 and then are quantized according to a predetermined quantization bit size, i.e., nKeyQBit.

However, in the case of decoding quantized key data using a decoder, it is impossible to perfectly retrieve original key data due to the error between the original key data and the quantized key data. Therefore, the quantizer 320 of the present invention obtains a maximum value and a minimum value among the input key data and quantizes the input key data using the maximum and minimum values. In addition, the quantizer 320 of the present invention includes a quantization error minimizer 325 so that the error between original key data and their quantized key data can be minimized using the maximum and minimum values among the input key data.

The quantization error minimizer 325 quantizes or inverse-quantizes the input key data in advance using a method for controlling a range of quantization so that the quantization error can be minimized, in step S4100.

In particular, if a mixed maximum value used for quantization is represented by Max, a minimum value to be controlled for quantization is represented by Min, an input value is represented by $X_i$, and the number of bits used for quantization is represented by nQuantBit, then, a quantized input value $\tilde{X}_i$, an inverse-quantized value $\hat{X}_i$, and an error $e_i$ are obtained using the following equation.

$$\tilde{X}_i = \text{floor}\left(\frac{X_i - \text{Min}}{\text{Max} - \text{Min}} * (2^{nQuantBit} - 1) + 0.5\right) \quad (5)$$

$$\hat{X}_i = \frac{\tilde{X}_i * (\text{Max} - \text{Min})}{2^{nQuantBit} - 1} + \text{Min}$$

$$e_i = X_i - \hat{X}_i$$

There are two methods for reducing the sum $\Sigma e_i$ of errors. One is a method for reducing the sum of errors by continuously controlling Min until the sum of errors is minimized. The other is as follows.

First, let us assume that $X_i=(i+n)\Delta x+\epsilon_i$ where $X_i$ indicates an input key data sequence, $\Delta x$ indicates a basic step size of input data, n is an arbitrary integer, and $\epsilon_i$ indicates zero-mean random noise.

Next, when $d_i \equiv X_i - X_{i-1} = \Delta x + (\epsilon_i - \epsilon_{i-1})$, $\Delta' x = E[d_i]$ and Min=Max$-\Delta' x*(2^{nQuantBit}-1)$.

Min, which can make it possible to minimize a quantization error, and Max are input into the quantizer 320 and are used for quantization of key data.

The quantizer 320 receives the maximum and minimum values Max and Min which can minimize a quantization error and quantizes key data fKey$_i$ in step S4200, following Equation (6).

$$nQKey_i = \text{floor}\left(\frac{fKey_i - fKeyMin}{fKeyMax - fKeyMin}(2^{nKeyQBit} - 1) + 0.5\right) \quad (6)$$

Here, i indicates an index of quantized key data, nQKey$_i$ indicates an array of integers of the quantized key data, fKey$_i$ indicates an array of floating-point numbers of the quantized key data, fKeyMax indicates a maximum value input from the quantization error minimizer 325, fKeyMin indicates a minimum value input from the quantization error minimizer 325, and nKeyQBit indicates a quantization bit size. In Equation (6), function floor(v) is a function which outputs a maximum integer no greater than a certain floating-point value v.

The quantizer 320 of the present invention may not use such algorithm for reducing a quantization error, in which case quantization is performed simply using the maximum and minimum values fKeyMax and fKeyMin among input key data.

Figure 4E:
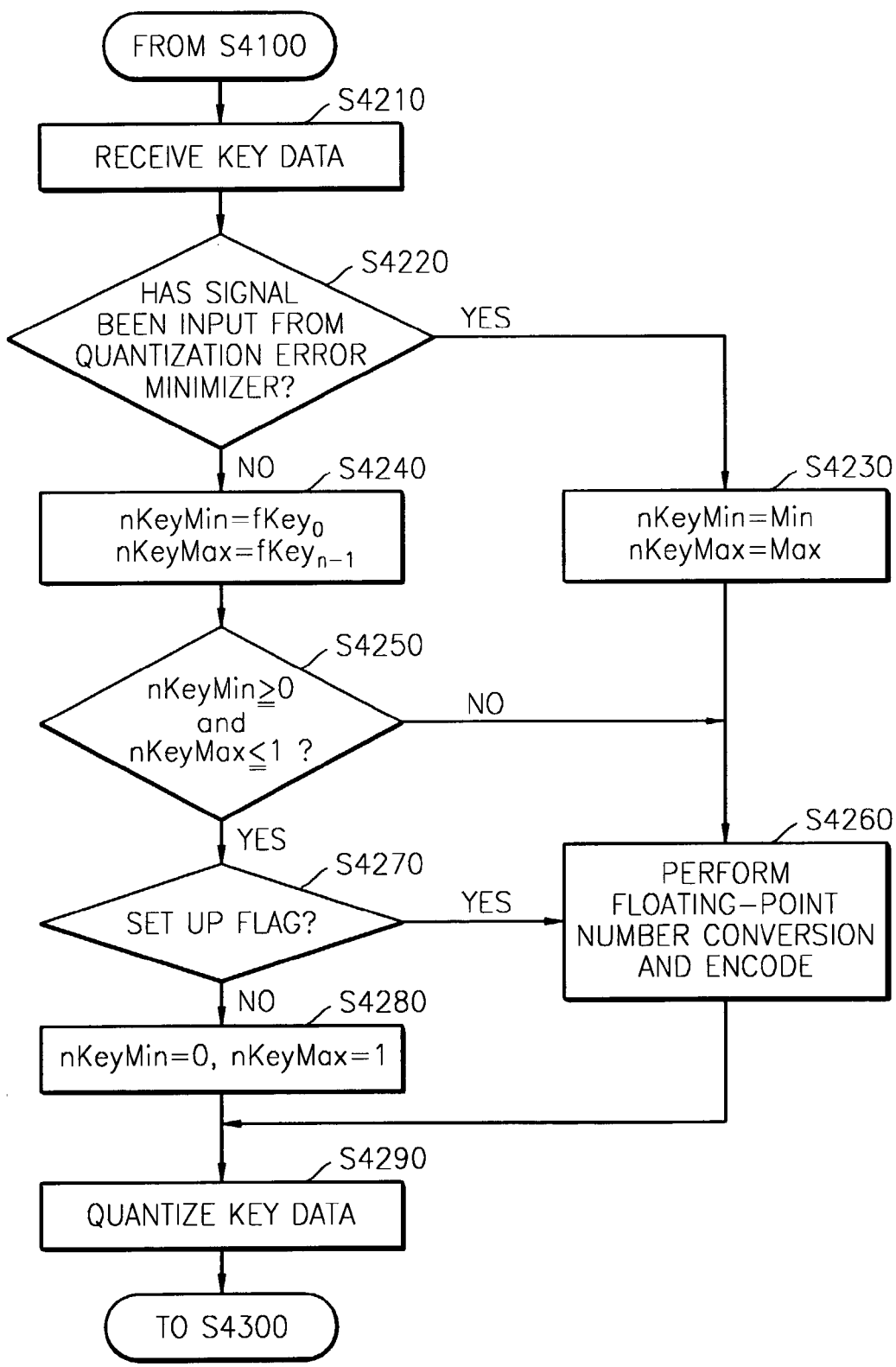

A quantization operation of the present invention will be described more fully with reference to FIG. 4E.

The quantizer 320 receives key data in step S4210 and checks if the maximum and minimum values MAX and MIN are input from the quantization error minimizer 325 in step 4220.

If MAX and MIN are input, the quantizer 320 sets the maximum and minimum values fKeyMax and fKeyMin for quantization as MAX and MIN, respectively, in step 4230 and outputs the newly set maximum and minimum values fKeyMax and fKeyMin to the floating-point number converter 315. The maximum and minimum values fKeyMax and fKeyMin are converted and encoded through the above-mentioned floating-point number conversion process and are output to the header encoder 500 so that they can be included in a key header for being used in decoding.

If there is no value input from the quantization error minimizer 325, the quantizer 320 sets first key data fKey$_0$ and final key data fKey$_{N-1}$ as the minimum value fKeyMin and the maximum value fKeyMax, respectively, in step S4240.

Next, the quantizer 320 checks whether or not the maximum value fKeyMax is smaller than 1 but greater than 0 and whether or not the minimum value fKeyMin is greater than 0 in step S4250. If the maximum value fKeyMax is not smaller than 1 or not greater than 0, the maximum and minimum values fKeyMax and fKeyMin are output to the floating-point number converter 315 and are converted and encoded through the above-mentioned floating-point number conversion. Next, the maximum and minimum values fKeyMax and fKeyMin that have been converted and encoded are included in the key header in step S4260 so that they can be used in decoding.

On the other hand, if the maximum value fKeyMax is smaller than 1 and the minimum value fKeyMin is greater than 0, a flag indicating whether the maximum and minimum values fKeyMax and fKeyMin will be included in the key header for being used in decoding is checked in step S4270. If the flag is set up so that the maximum and minimum values fKeyMax and fKeyMin can be included in the key header, step S4260 is performed so that the maximum and minimum values fKeyMax and fKeyMin are output to the header encoder 500. If the flag is not set up, the quantizer 320 does not allow the maximum and minimum values fKeyMax and fKeyMin to be included in the key header.

In a case where the maximum and minimum values fKeyMax and fKeyMin are not included in the key header, the key data encoder 300 and a key data decoder are supposed to perform encoding and decoding processes, respectively, setting up the maximum and minimum values fKeyMax and fKeyMin at 1 and 0, respectively. In this case, the quantizer 320 sets up the maximum and minimum values fKeyMax and fKeyMin at 1 and 0, respectively, in step S4280. The maximum and minimum values fKeyMax and fKeyMin are already known to the key data decoder so that they do not need to be included in the key header.

The quantizer 320 quantizes the input key data by substituting the maximum and minimum values fKeyMax and fKeyMin that have been set up through the above-mentioned process into Equation (6) and outputs the quantized key data to a DPCM processor 330 in step S4290.

The DPCM processor 330 receives the quantized key data and performs DPCM on the quantized key data a predetermined number of times. Next, the DPCM processor 330 outputs the order of DPCM, by which a minimum value in the degree of dispersion can be obtained, and intra key data obtained in each cycle of DPCM, to the header encoder 500. The DPCM processor 330 outputs differential data generated by DPCM to the shifter 340 in step S4300.

Figure 4F:
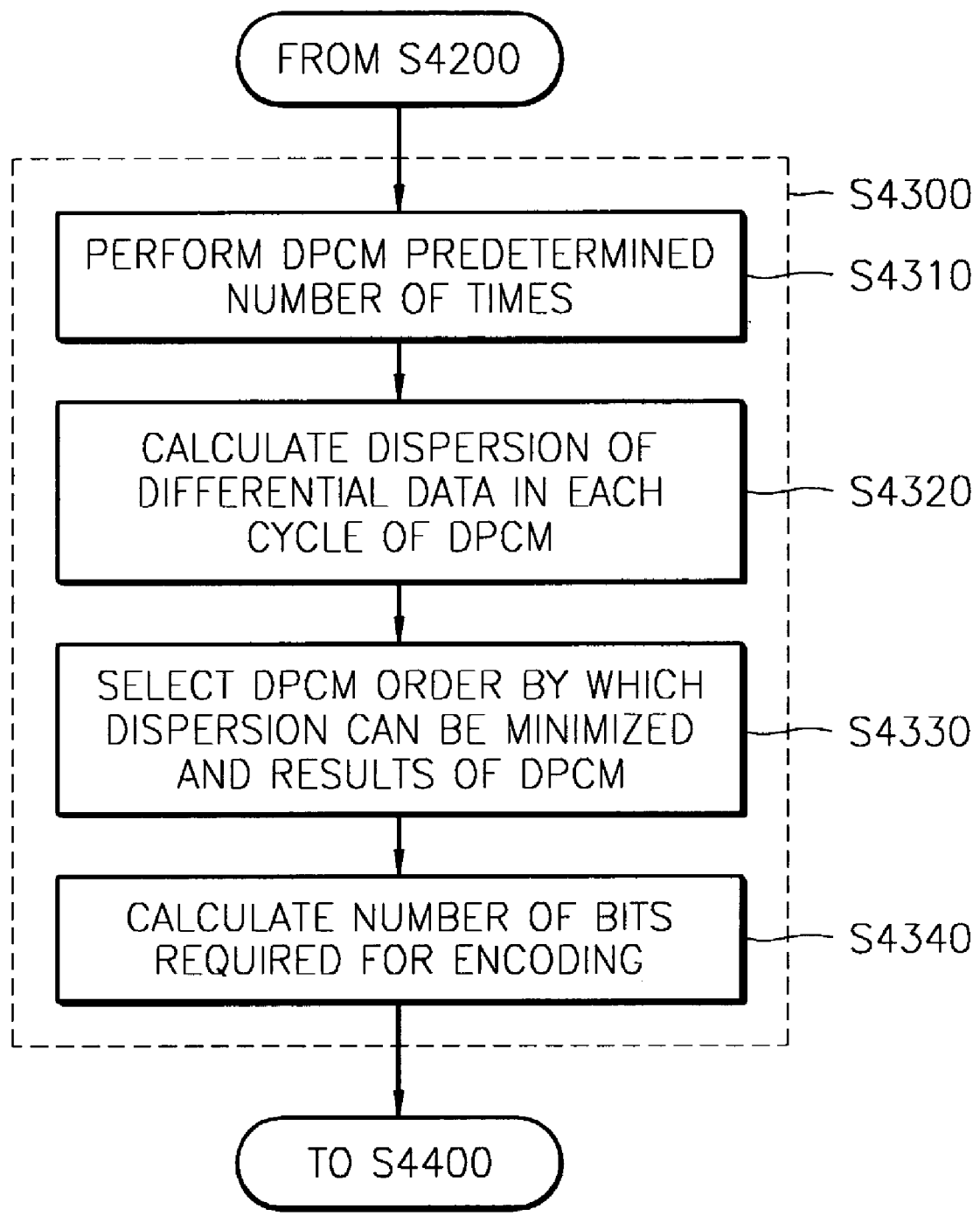

Referring to FIG. 4F, the DPCM processor 330 performs DPCM on the input key data a predetermined number of times and stores the number of cycles of DPCM as the order of DPCM in step S4310. In a preferred embodiment of the present invention, DPCM may be performed three times.

Thereafter, the DPCM processor 330 calculates the degree of dispersion of the results of each cycle of DPCM in step S4320. Here, the degree of dispersion may be represented by dispersion, standard deviation, or quartile deviation, and in a preferred embodiment of the present invention, quartile deviation may be used.

Next, the DPCM processor 330 selects a cycle of DPCM by which a minimum value in the degree of dispersion can be obtained and outputs the results of the selected order of DPCM to the shifter 340. The selected cycle of DPCM, intra key data of each cycle of DPCM and other pieces of information required for DPCM are output to the header encoder 500 in step S4330. However, in a preferred embodiment of the present invention, DPCM is performed only one time if the number of keys is smaller than 5. For example, a first cycle of DPCM is performed following Equation (7).

$$\Delta_i = nQKey_{i+1} - nQKey_i \quad (7)$$

Here, i indicates an index of quantized key data, $nQKey_i$ indicates an array of integers, and $\Delta_i$ indicates differential data.

The DPCM processor 330 calculates the number of bits required to encode the results of the selected cycle of DPCM and differential data of the key data that have been generated by DPCM in a predetermined memory (nQStep_DPCM) in step S4340. The calculation of the number of bits required for encoding may also be performed later in a subsequent step of selecting key data to be encoded, the fact which is obvious to one skilled in the art.

The shifter 340 selects a differential datum (hereinafter, referred to as a mode), which has the highest frequency from among the differential data input from the DPCM processor 330. Then, the shifter 340 subtracts the mode from all the differential data in step S4400 so that most data to be encoded are arranged around 0 and the number of bits required for encoding can be decreased.

Such a shifting operation is performed subtracting mode nKeyShift from all the quantized key data, which is expressed by the following equation.

$$\text{shift}(nQKey_i) = nQKey_i - nKeyShift \quad (8)$$

Here, i indicates an index of quantized key data, $nQKey_i$ indicates an array of integers, and nKeyShift indicates a mode value. As a result of the shifting operation, differential data having the highest frequency become 0 so that the number of bits required for encoding can be considerably reduced.

The key data having been through the shifting operation are output to the folding processor 350 and the DND processor 360, and the mode value nKeyShift is output to the header encoder 500 so as to be included in the key header.

The folding processor 350 performs a folding operation on the outputs of the shifter 340 and outputs the results of the folding operation to the DND processor 360 in step S4500.

The folding operation is used to reduce the range of differential data that widely disperse over both a positive number region and a negative number region by concentrating them in either the positive or negative number region. In the present embodiment, the folding operation is performed following Equation (9) to concentrate the differential data in the positive number region.

$$\begin{aligned}\text{fold}(nQKey_i) &= 2 \cdot nQKey_i \quad &(\text{if } nQKey_i \geq 0) \\ &= 2|nQKey_i| - 1 \quad &(\text{if } nQKey_i < 0)\end{aligned} \quad (9)$$

Here, i indicates an index of quantized key data, and $nQKey_i$ indicates an array of integers. As a result of the folding operation, positive differential data are converted into even numbers, and negative different data are converted into odd numbers.

The folding processor 350 calculates the number of bits required for encoding the differential data having been through the folding operation and stores it in a predetermined memory nQStep_fold. In this step, the calculation of the number of bits required for encoding may be performed later in a subsequent step of selecting differential data to be entropy-encoded, like step S9300, the fact which is obvious to one in the art. The data generated by the folding operation in the folding processor 350 are output to the DND processor 360.

In order to enhance the efficiency of entropy encoding, the DND processor 360 performs a DND operation on the input differential data of the key data a predetermined number of times, thus reducing the range of the differential data in S4600.

Figure 3B:
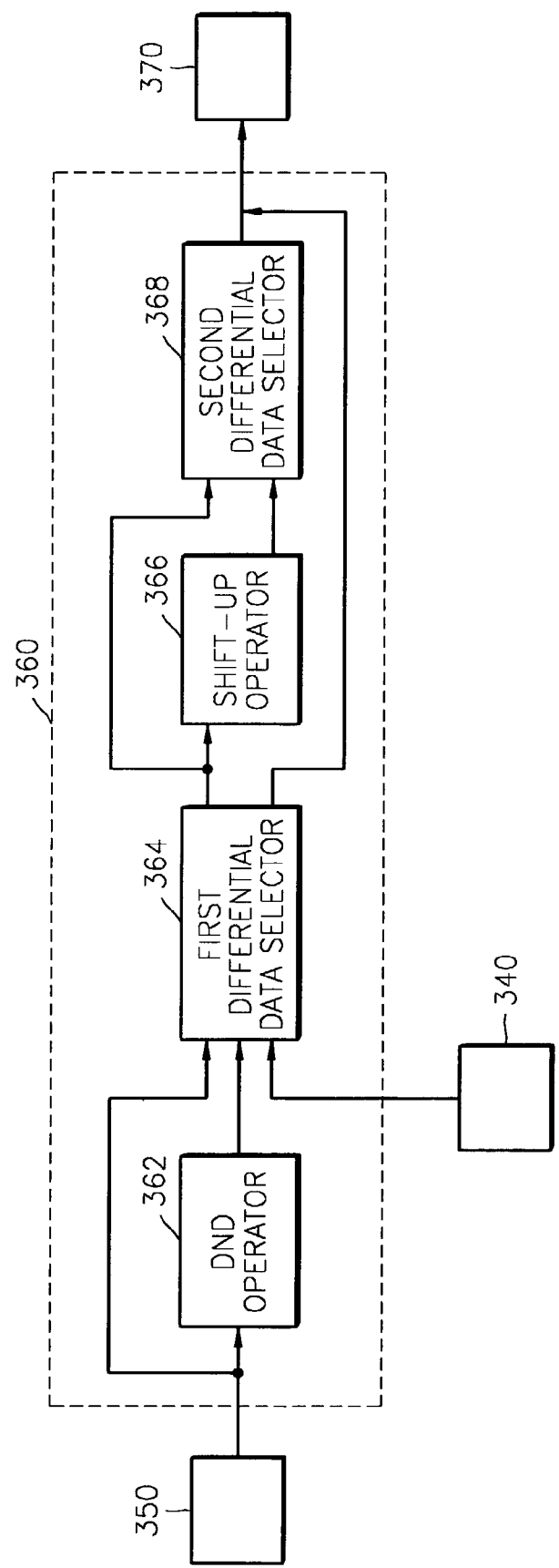
FIG. 3B is a block diagram of a DND processor shown in FIG. 3A.

Referring to FIG. 3B, the DND processor 360 includes a DND operator 362, which performs a DND operation on differential data, a first differential data selector 364, which selects differential data to be entropy-encoded based on the number of bits for encoding, a shift-up operator 366, which performs a shift-up operation on the differential data having been through a DND operation, and a second differential data selector 368, which selects from between the differential data having been through only the DND operation and the differential data having been through the shift-up operation the ones that have a lower dispersion degree and outputs the selected differential data to the entropy encoder 370.

The DND operation performed in the DND operator 362 will be described in the following paragraphs.

When the differential data having been through the folding operation in the folding processor 362 are input into the DND operator 362, they are divided in two groups, and a group of differential data having a higher range than the other group of differential data is moved to the positive number region by a divide function. The divide function is defined by the following equation.

$$\text{divide}(nQKey_j, nKeyMax) \quad (10)$$

$$= nQKey_j - (nKeyMax + 1) \quad \left(\text{if } nQKey_j > \frac{nKeyMax}{2}\right)$$

$$= nQKey_j \quad \left(\text{if } nQKey_j \leq \frac{nKeyMax}{2}\right)$$

Here, j indicates an index of input differential data, nQKey$_j$ indicates an array of integers, and nKeyMax indicates a maximum value among differential data having been through the folding operation. Especially, in a case where most differential data are densely populated along boundaries of the entire region accounted for by all differential data, it is possible to considerably reduce the entire region of all differential data using the divide operation.

After the divide operation, the degree of dispersion is calculated, in which case the size of bits required for encoding is used as a measure of the degree of dispersion so that a minimum value in the size of bits for encoding can be selected.

After the DND operation, a different kind of DND operation, i.e., a divide-up operation or a divide-down operation, is further performed. Whether a divide-up operation or a divide-down operation will be further performed is determined depending on both the size of a positive range of differential data and the size of a negative range of the differential data.

If the range of the differential data having positive values is larger than that of the differential data having negative values, a divide-down operation defined by the following equation is performed.

$$\text{divide} - \text{down}(nQKey_j, nKeyMax) \quad (11)$$

$$= -2(nKeyMax - nQKey_j + 1) + 1 \quad \left(\text{if } nQKey_j > \frac{nKeyMax}{2}\right)$$

$$= nQKey_j \quad \left(\text{if } 0 \leq nQKey_j \leq \frac{nKeyMax}{2}\right)$$

$$= 2 \cdot nQKey_j \quad (\text{if } nQKey_j < 0)$$

On the other hand, if the range of the differential data having positive values is larger than the range of the differential data having negative values, a divide-up operation defined by the following equation is performed.

$$\text{divide} - \text{up}(nQKey_j, nKeyMin) \quad (12)$$

$$= nQKey_j \quad (nQKey_j \geq 0)$$

$$= 2 \cdot nQKey_j \quad \left(\frac{nKeyMin}{2} \leq nQKey_j \leq 0\right)$$

$$= -2(nKeyMin - nQKey_j - 1) + 1 \quad \left(nQKey_j < \frac{nKeyMin}{2}\right)$$

In Equations (11) and (12), j indicates an index of quantized key data, nQKey$_j$ represents an array of integers, nKeyMax indicates a maximum value of nQKey$_j$, and nKeyMin indicates a minimum value of nQKey$_j$.

Figure 4G:
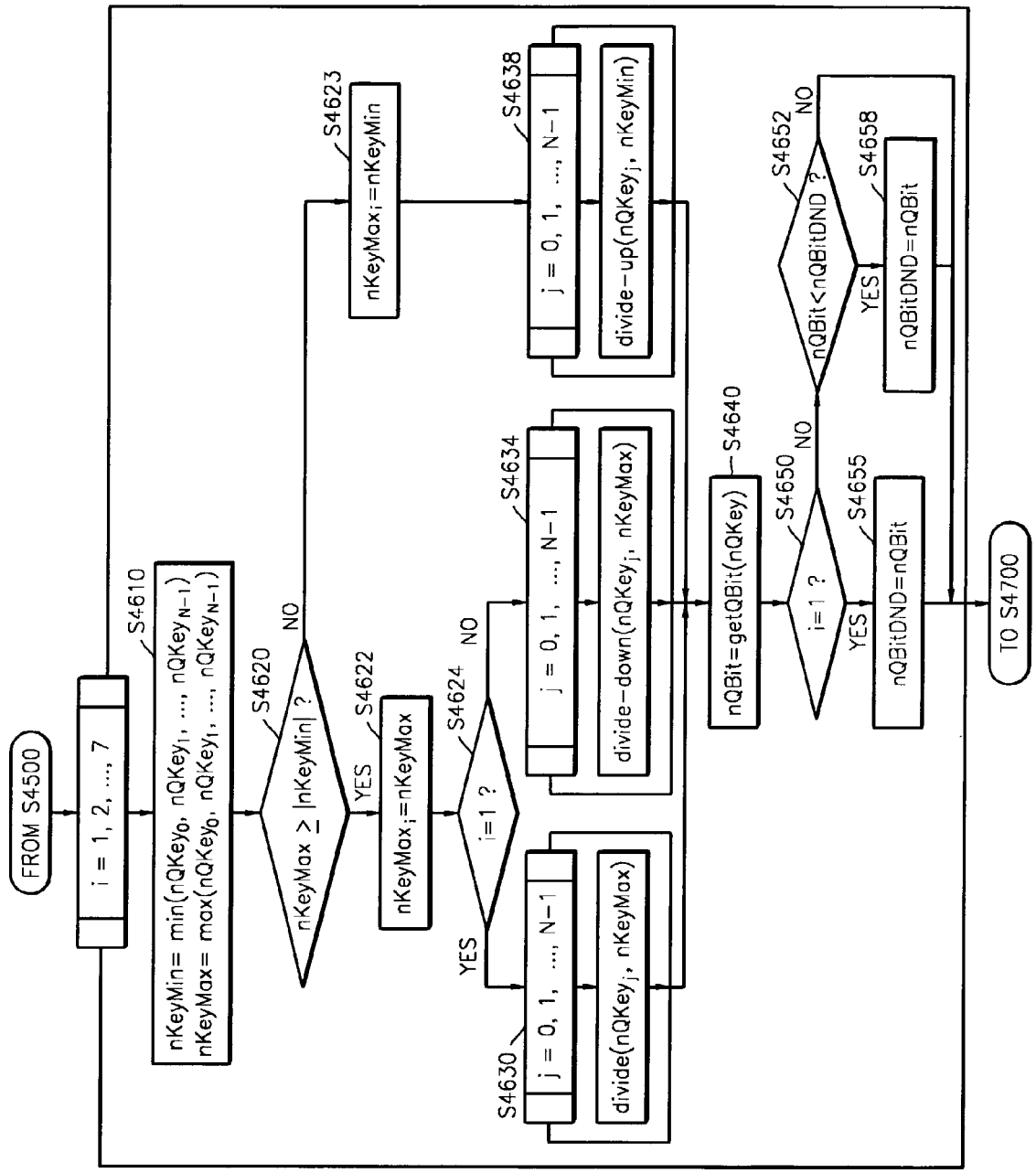

The operation of the DND operator 362 will be described in the following with reference to FIG. 4G.

When the differential data of the input key data are input from the folding processor 350, the DND operator 362 obtains the maximum value nKeyMax and the minimum value nKeyMin among the input differential data in step S4610. Then, the DND operator 362 compares the absolute value of nKeyMax with that of nKeyMin in step S4620. If nKeyMax is not smaller than the absolute value of nKeyMin, the DND operator 362 sets nKeyMax as a maximum value in the current cycle of DND operation in step S4622.

The DND operator 362 checks if the order of DND operation is 1, in other words, if the order of DND operation is 1, in step S4624, and if it is, the DND operator 362 performs a divide operation on the input differential data in step S4630 substituting the maximum value nKeyMax in Equation (10).

Thereafter, the DND operator 362 measures the size of bits required for encoding the differential data range having been reduced using the divide operation, in step S4640, using function getQBit( ). If the order of DND operation turns out to be 1 in step S4650, the size of bits required for encoding is stored as a value nQBitDND indicating the minimum size of bits for encoding, and the order of DND operation is increased by 1 in step S4655.

Next, the DND processor 362 performs steps S4610 through S4622 again. If the order of DND operation is not 1 in step S4624, the DND operator 252 performs a divide-down operation in step S4634 substituting the maximum value nKeyMax in Equation (11). The DND operator 362 calculates the number of bits required for encoding the differential data having been through the divide-down operation, in step S4640. If the number is smaller than the minimum value nQBitDND stored in the previous cycle of DND operation, it replaces the minimum size of bits required for encoding after the DND operation in step S4658.

If the absolute value of the minimum value nKeyMin appears to be greater than that of the maximum value nKeyMax in step S4620, the maximum value in the current cycle of DND operation is renewed as a minimum value in step S4623, and then a divide-up operation is performed in step S4638 substituting the minimum value for nKeyMin in Equation 12. Thereafter, the DND operator 362 calculates the number of bits for encoding the differential data having been through the divide-up operation in step S4640. If the result of the calculation turns out to be smaller than nQBitDND that has been stored in the previous cycle of DND operation in step S4652, it replaces the minimum number nQBitDND of bits required for encoding after the DND operation in step S4658.

The DND processor 362 performs the DND operation a predetermined number of times, and the number of performance of the DND operation may vary. For example, in the present embodiment, the DND operation is performed 7 times. The DND operator 362 outputs nQBitDND and the differential data corresponding to nQBitDND to the first differential data selector 364. The DND operator 362 outputs the order of DND by which the corresponding differential data have been generated to the header encoder 500 and allows them to be included in the bitstream.

The first differential data selector 364 receives the differential data having been through the shifting operation, the differential data having been through the folding operation, and the differential data having been through the DND operation and determines which differential data among the three will be entropy-encoded.

Referring to FIG. 3A, the first differential data selector 364 selects the results of the DPCM and performs a shifting operation on them in step S4710 if the minimum number nQBitDND of bits required for encoding after the DND operation is no smaller than the size nQStep-DPCM of bits for encoding after the DPCM operation in step S4700. Next, the first differential data selector 364 outputs the results of the shifting operation to the entropy encoder 370 and allows them to be entropy-encoded in step S4710. In this case, the order of DND operation is set up at −1, is output to the header encoder 500, and is included in the key header.

However, if it turns out in step S3720 that nQBitDND is smaller than nQStep-DPCM and is not smaller than the size of bits for encoding after the folding operation, the first differential data selector 364 outputs the differential data having been through the folding operation to the entropy encoder 370 and allows them to be entropy-encoded in step S4730, in which case the order of DND operation is set up at 0, is output to the header encoder 500, and thus is included in the key header.

If the number of bits for encoding the differential data after the DND operation is smallest, the first differential data selector 364 outputs the differential data having been through the DND operation to the shift-up operator 366, and then the shift-up operator 366 calculates a first dispersion degree of the differential data input from the first differential data selector 364, in step S4740. Next, the shift-up operator 366 performs a shift-up operation defined by the following equation on the differential data having been through the DND operation, in step S4800 and calculates a second dispersion degree of the results of the shift-up operation in step S4810.

$$\text{shift-up}(nQKey_j, nKey\text{Max}) \quad (13)$$
$$= nQKey_j \quad (\text{if } nQKey_j \geq 0)$$
$$= nKey\text{Max} - nQKey_j \quad (\text{if } nQKey_j < 0)$$

Here, j indicates an index of differential data of quantized key data, $nQKey_j$ indicates an array of integers, and nKeyMax indicates a maximum value among differential data.

When the differential data having been through the DND operation and the differential data having been through the shift-up operation are input, the second differential data selector 368 compares the first dispersion degree with the second dispersion degree in step S4900. If the second dispersion degree is smaller than the first dispersion degree, the second differential data selector 368 outputs the differential data having been through the shift-up operation to the entropy-encoder 370 and allows them to be entropy-encoded in step S4910. The second differential data selector 468 outputs the maximum and minimum values nKeyMax and nKeyMin used in the DND operation, and the maximum value nKeyMax used in the shift-up operation to the header encoder 500 and allows them to be included in the key header.

However, if the first dispersion degree is smaller than the second dispersion degree, the second differential data selector 368 outputs the differential data having been through the DND operation to the entropy encoder 370 and allows them to be entropy-encoded in step S4920. Then, the second differential data selector 368 outputs only the maximum and minimum values nKeyMax and nKeyMin used in the DND operation to the header encoder 500. In a preferred embodiment of the present invention, standard deviation may be used as a measure of the first and second dispersion degrees.

The entropy encoder 370 performs two different functions on differential data depending on the characteristics of the differential data. For example, differential data having been through a DPCM operation and a shifting operation and differential data having been through only a divide operation have both positive and negative values, and thus it is required to perform a process of encoding the sign of each of the differential data as well as the differential data themselves. On the other hand, since differential data having been through a folding operation only have positive values, a process of encoding only the differential data is performed.

In a preferred embodiment of the present invention, function encodeSignedAAC is used for encoding the differential data and their signs as well, and function encodeUnsignedAAC is used for encoding only differential data.

Figure 5:
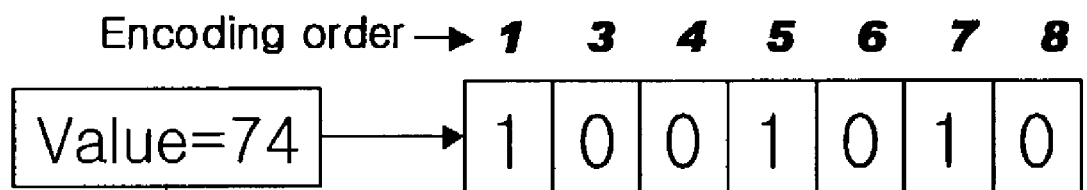
FIG. 5 is a diagram illustrating an example of a function encodeSignedAAC.
Figure 5:
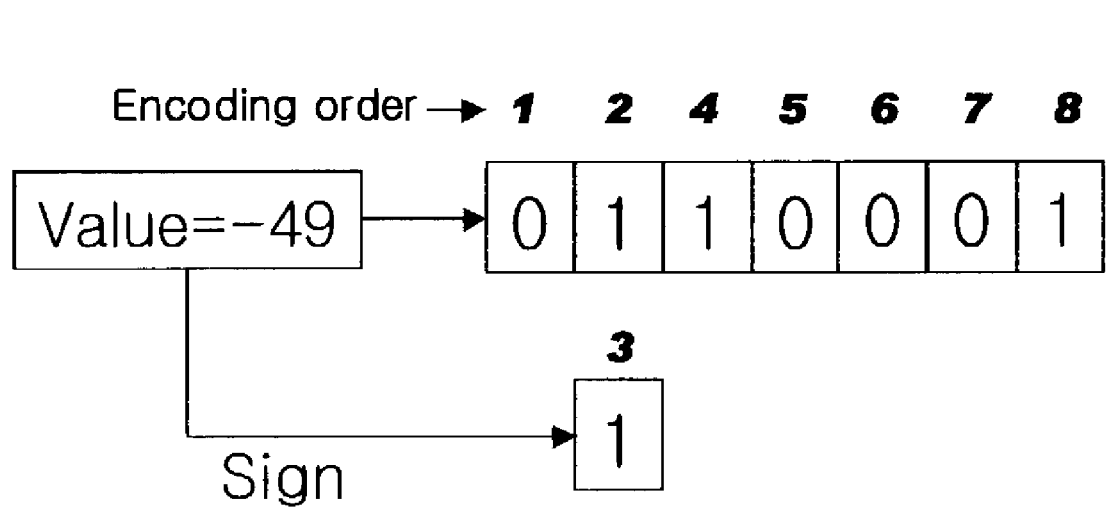

FIG. 5 is a diagram of an example of a function encodeSignedAAC. Referring to FIG. 5, when an input value is 74 and the number of bits for encoding the input value is 8, its sign is 0, and it is the same as a binary number of 1001010. Signs and all bit planes are encoded in the following way:

First step: a binary number is encoded on every bit plane in an order of from its most significant bit (MSB) to its least significant bit (LSB);

Second step: it is checked if the bit which is currently being encoded is 0;

Third step: if the bit currently being encoded is not 0, the sign of the binary number is encoded next; and Fourth step: the remaining bits of the binary number are encoded.

Function encodeUnsignedAAC encodes values not having a sign as an adaptive arithmetic encoding bitstream using a context regarding the values. This function is almost the same as function encodeSignedAAC except that there exists a sign context.

FIGS. 6A through 6J are graphs showing key data which have been subjected to operations according to a preferred embodiment of the present invention. In FIGS. 6A through 6J, the X-axis represents indexes of each of the key data, and the Y-axis represents the values of the key data.

Figure 6A:
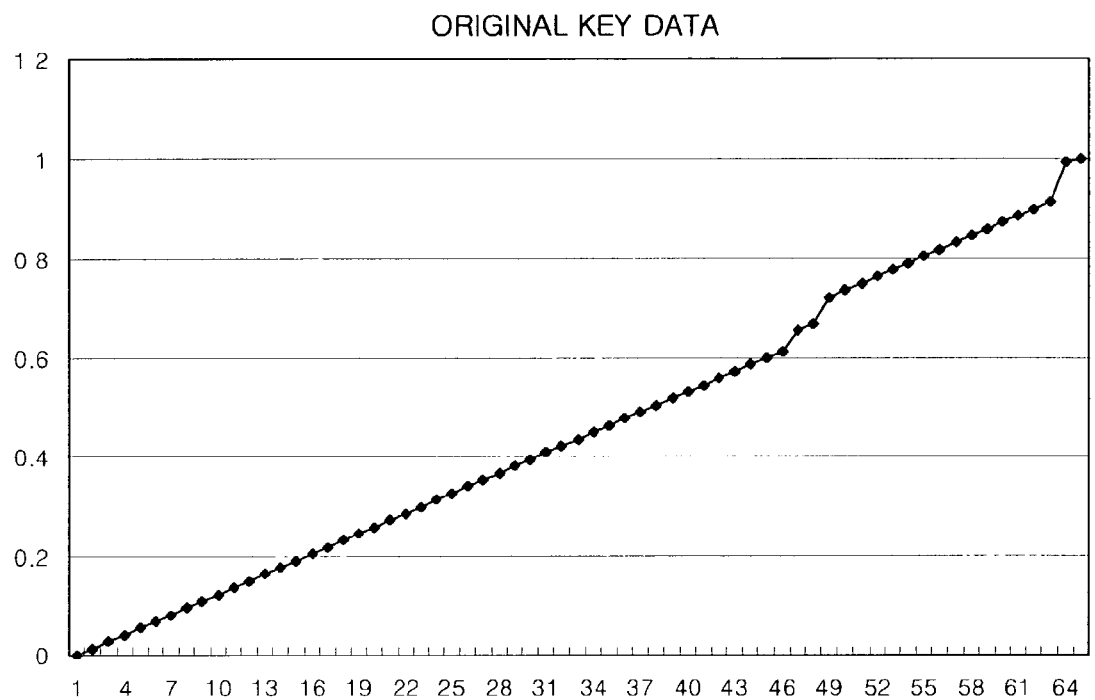
FIGS. 6A through 6J are diagrams illustrating key data, which have been through key data encoding operations according to a preferred embodiment of the present invention.
Figure 6B:
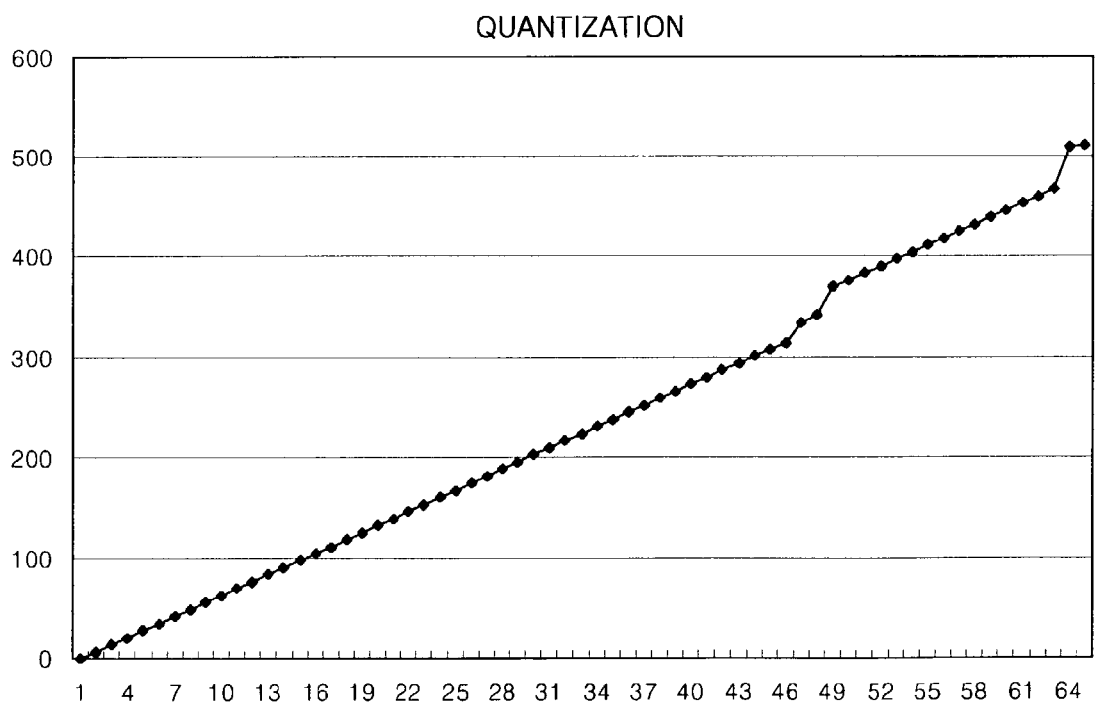
Figure 6C:
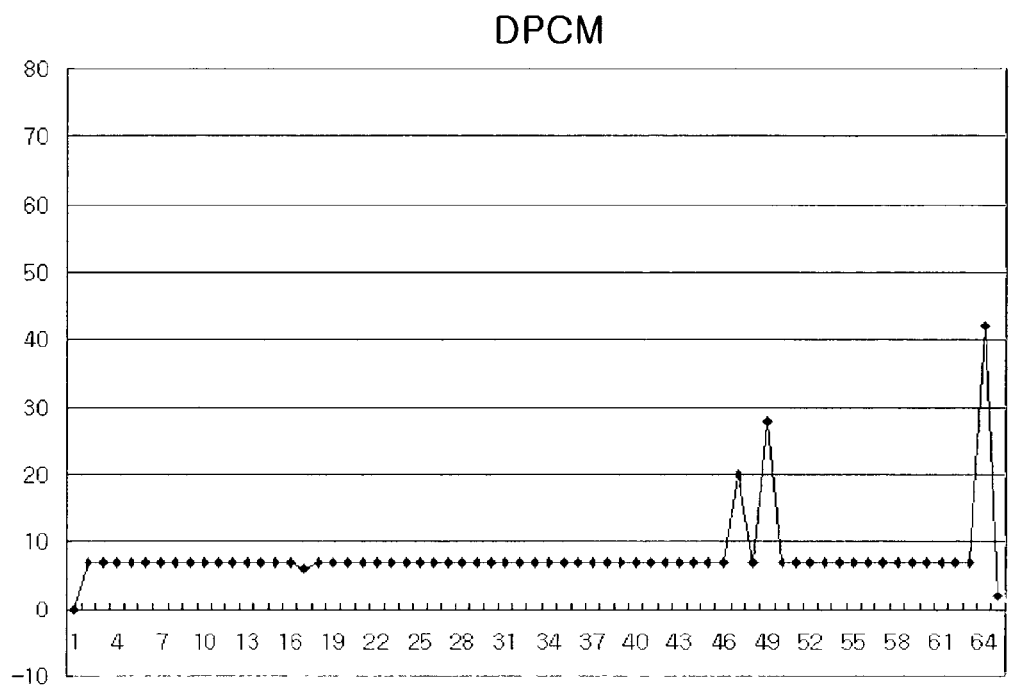

FIG. 6A is a graph showing original key data input into the encoder of the present invention. The key data shown in FIG. 6A are output to the quantizer 320 and then are quantized with nine quantization bits so that quantized key data shown in FIG. 6B are obtained. If DPCM is performed on the quantized key data shown in FIG. 6B, differential data shown in FIG. 6C are obtained.

Figure 6D:
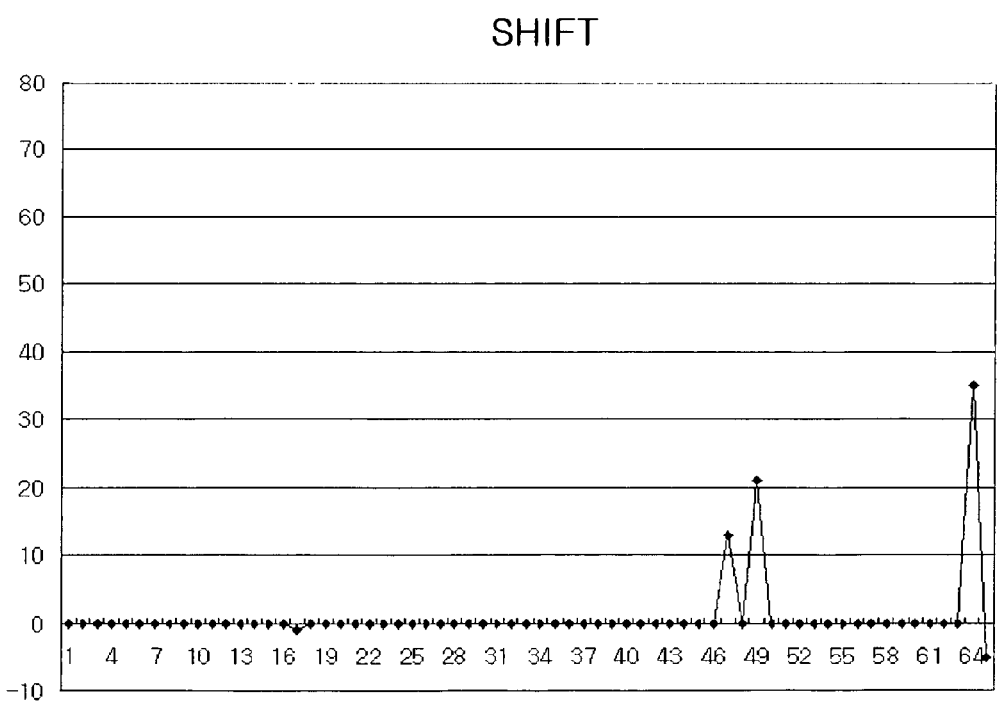

Next, the differential data of the quantized key data are shifted using a mode value of about 7 so that differential data shown in FIG. 6D are obtained. Thereafter, if a folding operation is performed on the shifted differential data, data having only positive values can be obtained, as shown in FIG. 6E.

Figure 6E:
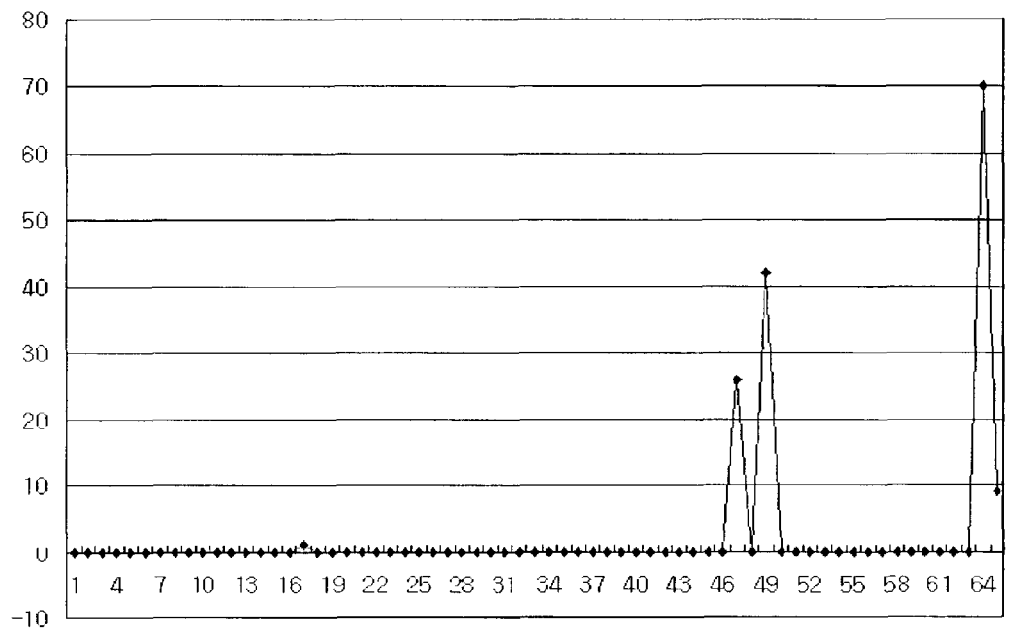
Figure 6F:
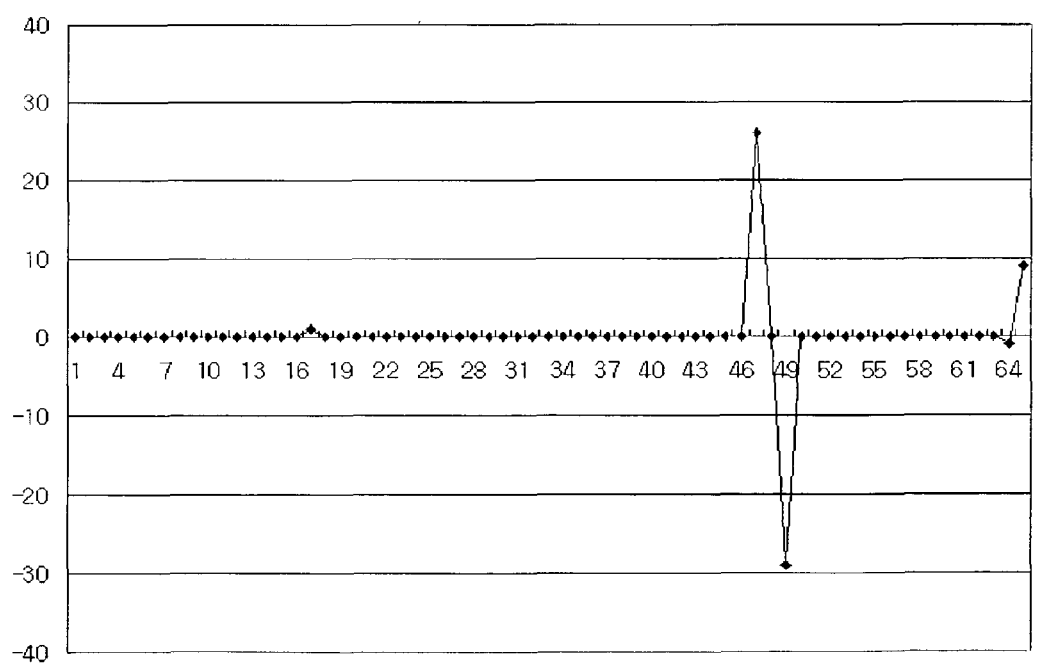
Figure 6G:
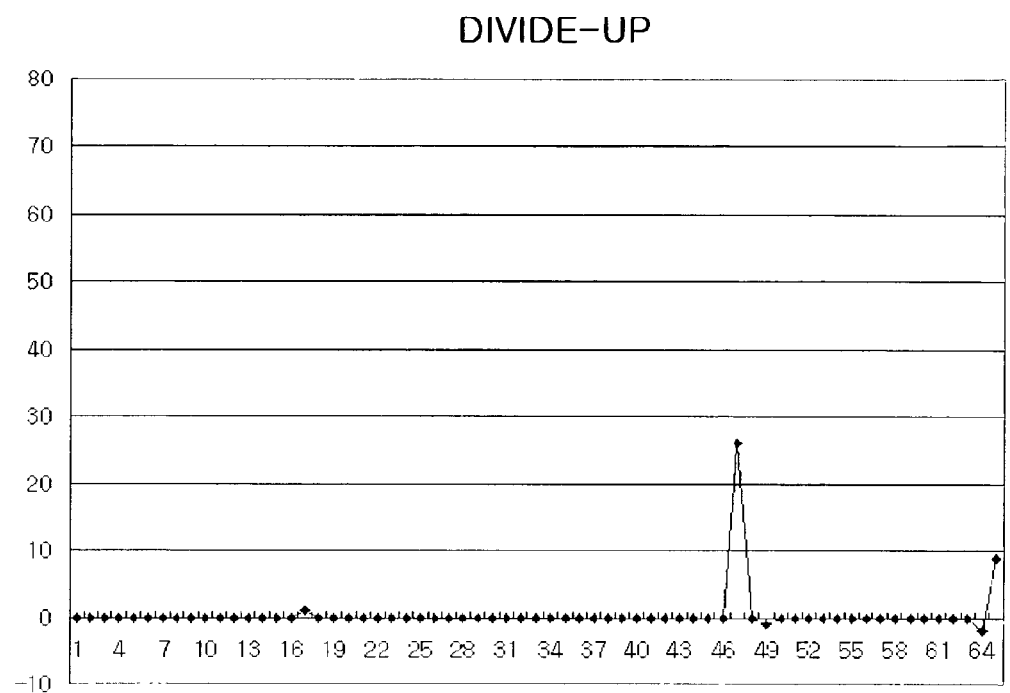
Figure 6H:
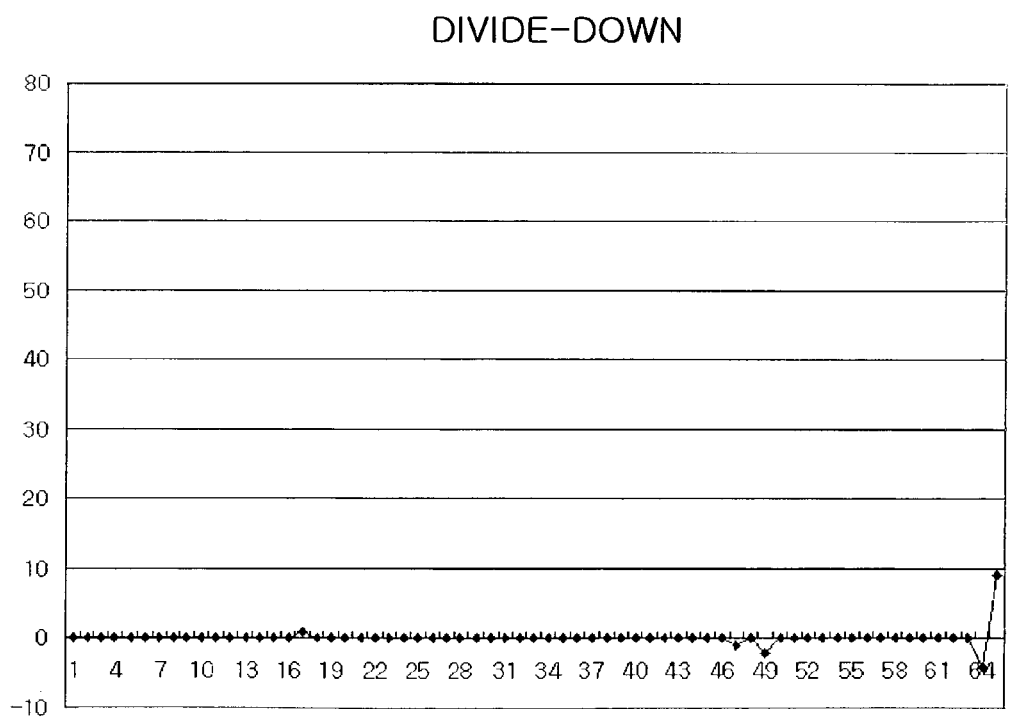

The results of performing a DND operation on the folded data shown in FIG. 6E are shown in FIGS. 6F through 6H. In particular, the results of performing a divide operation on the folded data are shown in FIG. 6F. As shown in FIG. 6F, positive key data values range from 0 to 28, and negative key data values range from −29 to 0, which means that the range of negative key data values is greater than that of positive key data values. Accordingly, it is required to perform a divide-up operation on the data shown in FIG. 6F, and the results of the divide-up operation are shown in FIG. 6G.

Figure 6I:
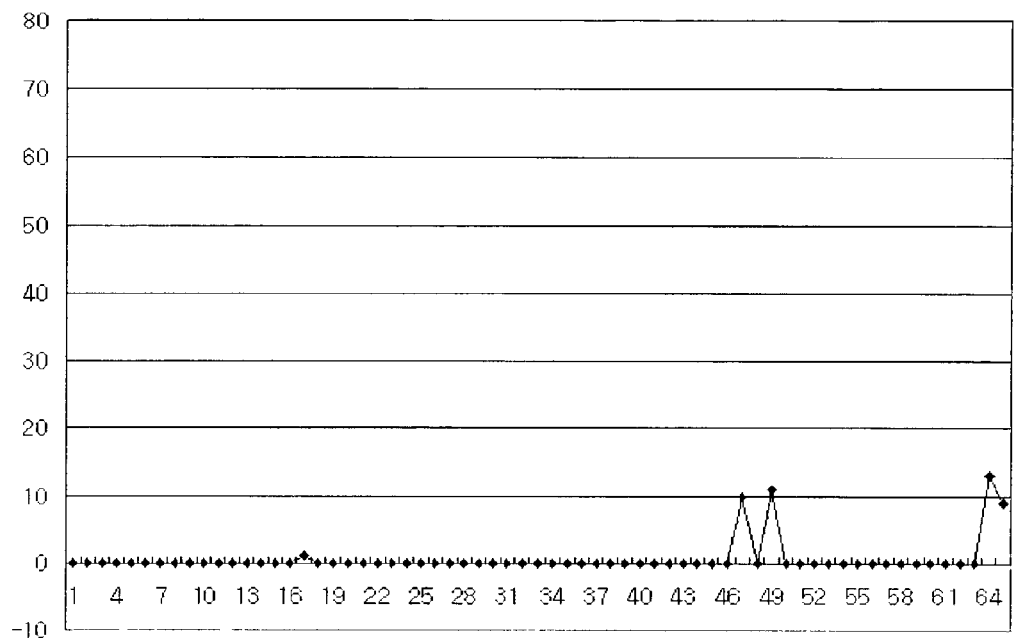

As a result of the divide-up operation, the range of negative key data values is considerably reduced so that it is much smaller than the range of positive key data values. In a subsequent cycle of DND operation, a divide-down operation is performed on the results of the divide-up operation. FIG. 6H is a diagram showing the results of performing a divide-down operation on the differential data shown in FIG. 6G. The results of performing a shift-up operation on the key data shown in FIG. 6H are shown in FIG. 6I.

Figure 6J:
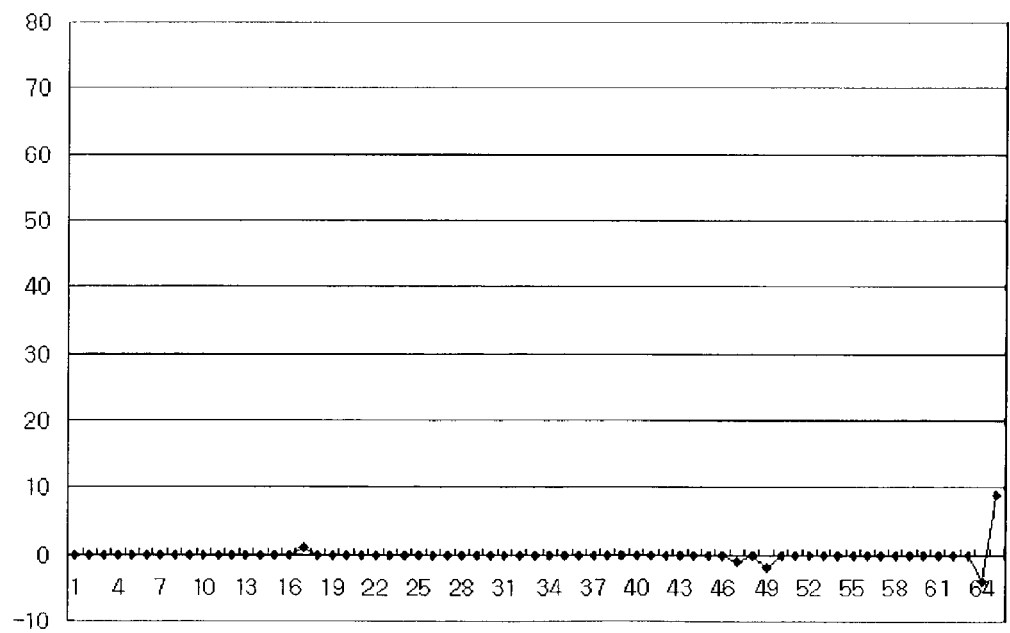

As shown in FIGS. 6A through 6G, the range of key data and differential data gradually decreases. However, as shown in FIGS. 6H and 6I, the range of differential data is increased greater after the shift-up operation than before, which shows that the differential data having been through the divide-down operation, as shown in FIG. 6H, are the ones that are to be finally encoded, as shown in FIG. 6J.

The information encoded in the header encoder 500 and stored in the key header will be described in the following paragraphs.

When key data to be encoded are input, the header encoder 500 encodes the digit number of key data and the number of keys to be encoded. Next, the header encoder 500 receives information on whether or not there exists a linear key region that has been through the linear key encoding in the input key data and the number of key data in the linear key data region from the linear key encoder 310 and receives the beginning and ending key data of the linear key data region that has been through the floating-point number conversion from the floating-point number converter 315.

In a case where the floating-point number converter 315 receives maximum and minimum values which can bring about a minimum quantization error and converts them into floating-point numbers, the converted maximum and minimum values are input into the header encoder 500 from the floating-point number converter 315 so that they can be used again for inverse quantization. In addition, the size of quantization bits is also input into the header encoder 500 and is included in the key header.

The header encoder 500 receives the order of DPCM and intra key data in each cycle of DPCM from the DPCM processor 330 and receives a mode value which has been used for a shifting operation from the shifter 340. In addition, the header encoder 500 receives from the DND processor 360 information on whether or not a shift-up operation has been performed, the order of DND by which the dispersion degree of differential data can be minimized, and maximum and minimum values in each cycle of DND operation.

Finally, the header encoder 500 receives the number of bits used for encoding from the entropy encoder 370 and encodes it as a key header.

Hereinafter, an apparatus and a method for encoding key value data of a coordinate interpolator according to a preferred embodiment of the present invention will be described more fully with reference to FIGS. 7A through 11C.

Figure 7A:
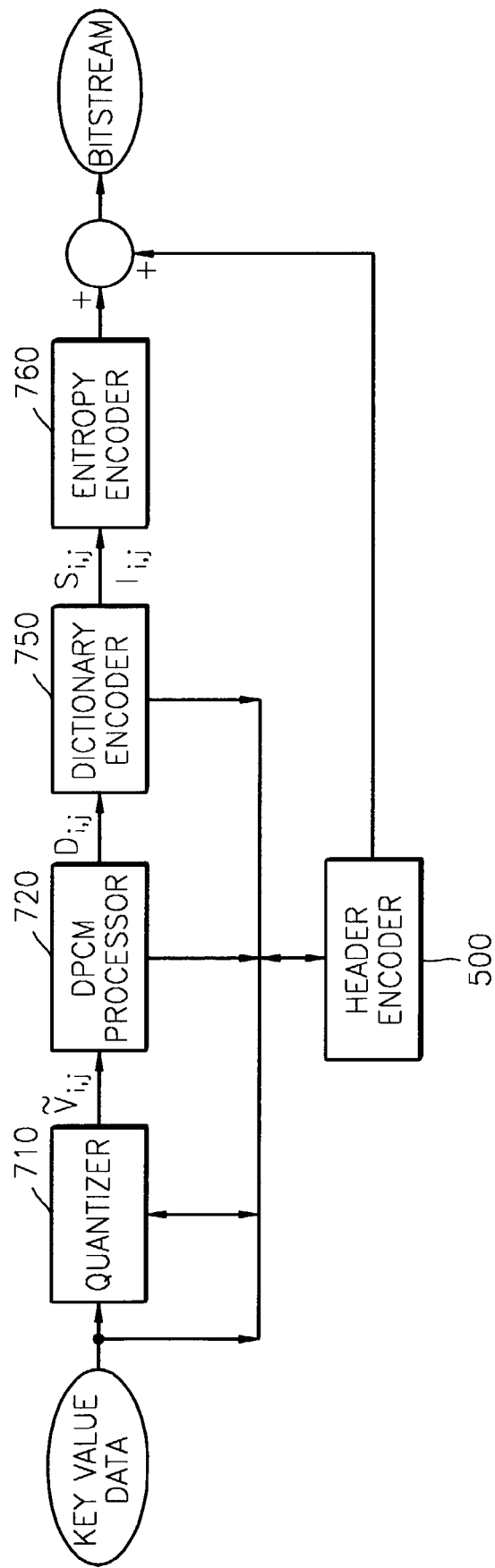
FIG. 7A is a block diagram of a key value data encoder according to a preferred embodiment of the present invention.
Figure 7B:
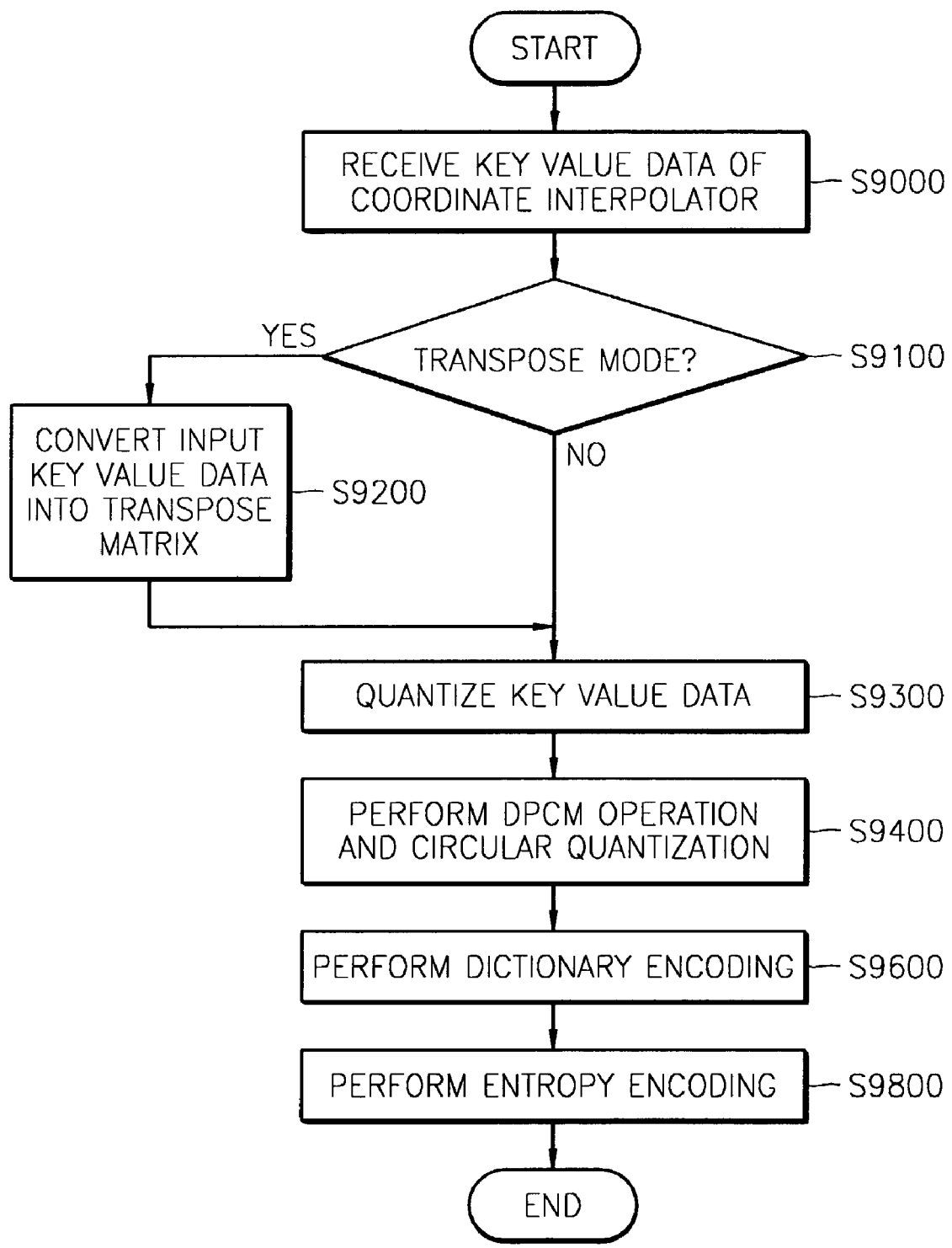
FIG. 7B is a flowchart of a method for encoding key value data of a coordinate interpolator according to a preferred embodiment of the present invention.

FIG. 7A is a block diagram of a key value data encoder according to a preferred embodiment of the present invention, and FIG. 7B is a flowchart of a method for encoding key value data of a coordinate interpolator according to a preferred embodiment of the present invention.

Referring to FIG. 7A, a key value data encoder 700 includes a quantizer 710, which quantizes data of components of each vertex of key value data of a coordinate interpolator input thereinto using predetermined quantization bits, a DPCM processor 720, which performs a predetermined DPCM operation on quantized component data of each of the vertices, a dictionary encoder 750, which converts differential data into symbols and indexes indicating the positions of the symbols, and an entropy encoder 760, which entropy-encodes symbols and indexes of differential data input thereinto.

A method for encoding key value data of a coordinate interpolator will be described in the following paragraphs with reference to FIG. 7B. Referring to FIG. 7B, key value data of a coordinate interpolator are input into the quantizer 710 in the form of an N×M matrix in step S9000. An example of the input key value data of a coordinate interpolator is shown in the following table.

TABLE 3

|   | 1 | 2 | ...j | M |
|---|---|---|---|---|
| 1 | x(1, 1), y(1, 1), z(1, 1) | x(1, 2), y(1, 2), z(1, 2) |  | x(1, M), y(1, M), z(1, M) |
| 2 | x(2, 1), y(2, 1), z(2, 1) | x(2, 2), y(2, 2), z(2, 2) |  | x(2, M), y(2, M), z(2, M) |
| ... |  |  |  |  |
| i |  |  | x(i, j), y(i, j), z(i, j) |  |
| N | x(N, 1), y(N, 1), z(N, 1) | x(N, 2), y(N, 2), z(N, 2) |  | x(N, M), y(N, M), z(N, M) |

In Table 3, N represents the number of key data (keyframes), and M represents the number of vertices in each keyframe.

The key value data encoder 700 according to the present invention operates in two different modes for encoding key value data of a coordinate interpolator. One of the modes is a vertex mode, and the other is a transpose mode. In Table 3, the structure of key value data to be quantized in the quantizer 710 in a vertex mode is shown. Before quantizing the input key value data shown in Table 3, the key value data encoder 700 transposes the input key value data into an M×N matrix. The transposed matrix is inverse-quantized during decoding key value data, and the decoded key value data are converted into N×M matrix so that the same key value data as the input key value data can be retrieved.

Referring to FIG. 7B, the quantizer 710 checks whether or not the encoding mode of the key value data input from the outside is a transpose mode in step S9100. If the encoding mode of the input key value data is a transpose mode, the N×M matrix of the input key value data is transposed into an M×N matrix in step S9200.

Thereafter, in step S9300, the quantizer 710 quantizes the data of each of the components in the matrix of the key value data input thereinto with the predetermined quantization bits and outputs the quantized key value data of each of the components to the DPCM processor 720 in step S9300. In the same step, the quantizer 710 converts minimum values among the input key value data of each of the components and a maximum range among the data ranges of the components into decimal numbers and outputs the decimal numbers to the header encoder 500.

The DPCM processor 720 performs a temporal DPCM operation, a spatial DPCM operation, and a spatio-temporal DPCM operation on the quantized key value data input thereinto, performs a circular quantization operation on the results of the three different DPCM operations, i.e., differential data each obtained from the three DPCM operations, and outputs the differential data having the lowest entropy among them to the dictionary encoder 750 in step S9400.

In step S9600, the dictionary encoder 750 generates and outputs dictionary symbols $S_{i,j}$ and position indexes $I_{i,j}$, which correspond to the differential data input from the DPCM processor 720. In particular, the dictionary encoder 750 generates the dictionary symbols and the position indexes, which indicate the mode of the DPCM operation which has been performed on the input differential data, converts the input differential data into symbols or a symbol flag, corresponding to values of the input differential data, and position indexes, representing the positions of the symbols, and outputs the symbols and position indexes to the entropy encoder 760.

The entropy encoder 760 generates a bitstream by entropy-encoding the symbols and position indexes input from the dictionary encoder 750 in step S9800.

Hereinafter, steps S9300 through S9800 will be described more fully with reference to FIGS. 8A through 11C.

Figure 9A:
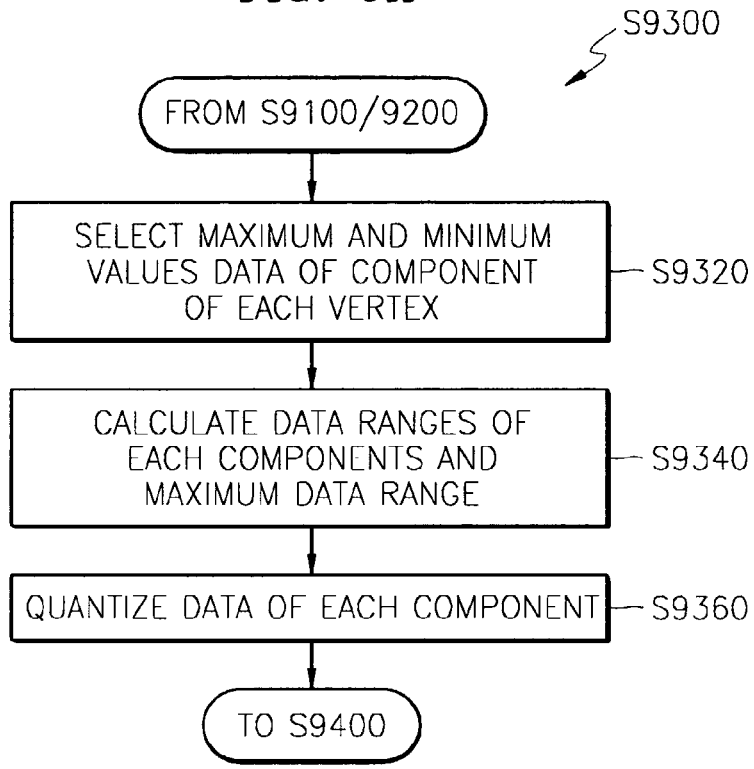
FIG. 9A is a flowchart of a quantization operation according to a preferred embodiment of the present invention.

Referring to FIG. 9A, the quantizer 710 selects maximum values and minimum values among the data of each of the components in step S9320.

In step S9340, the quantizer 710 calculates the data ranges of the components using the selected maximum and minimum values and determines a maximum range among the data ranges of the components.

In step S9360, the quantizer 710 quantizes the key value data of each of the components using the minimum values among the data of each of the components and the maximum range among all the data ranges of the components, which is shown in the following equations.

$$\tilde{V}_{i,j,x} = \text{floor}\left(\frac{V_{i,j,x} - f\text{Min\_X}}{f\text{Max}}(2^{nKVQBit} - 1) + 0.5\right) \quad (14)$$

$$\tilde{V}_{i,j,y} = \text{floor}\left(\frac{V_{i,j,y} - f\text{Min\_Y}}{f\text{Max}}(2^{nKVQBit} - 1) + 0.5\right)$$

$$\tilde{V}_{i,j,z} = \text{floor}\left(\frac{V_{i,j,z} - f\text{Min\_Z}}{f\text{Max}}(2^{nKVQBit} - 1) + 0.5\right)$$

In Equation (14), i represents key data, j represents a vertex, and nKVQBit represents a quantization bit size. In addition, fMin_X, fMin_Y, and fMin_Z represent the minimum values among the data of each of the components, and fMax represents the maximum range among the data ranges of the components.

The quantizer 710 outputs the quantized key value data of each of the components to the DPCM processor 720, converts fMin_X, fMin_Y, fMin_Z, and fMax into decimal numbers following Equation (4) and Table 2, and outputs the decimal numbers to the header encoder 500.

Hereinafter, the structure and operation of the DPCM processor 720 will be described in greater detail with reference to FIGS. 8A and 9B.

Figure 8A:
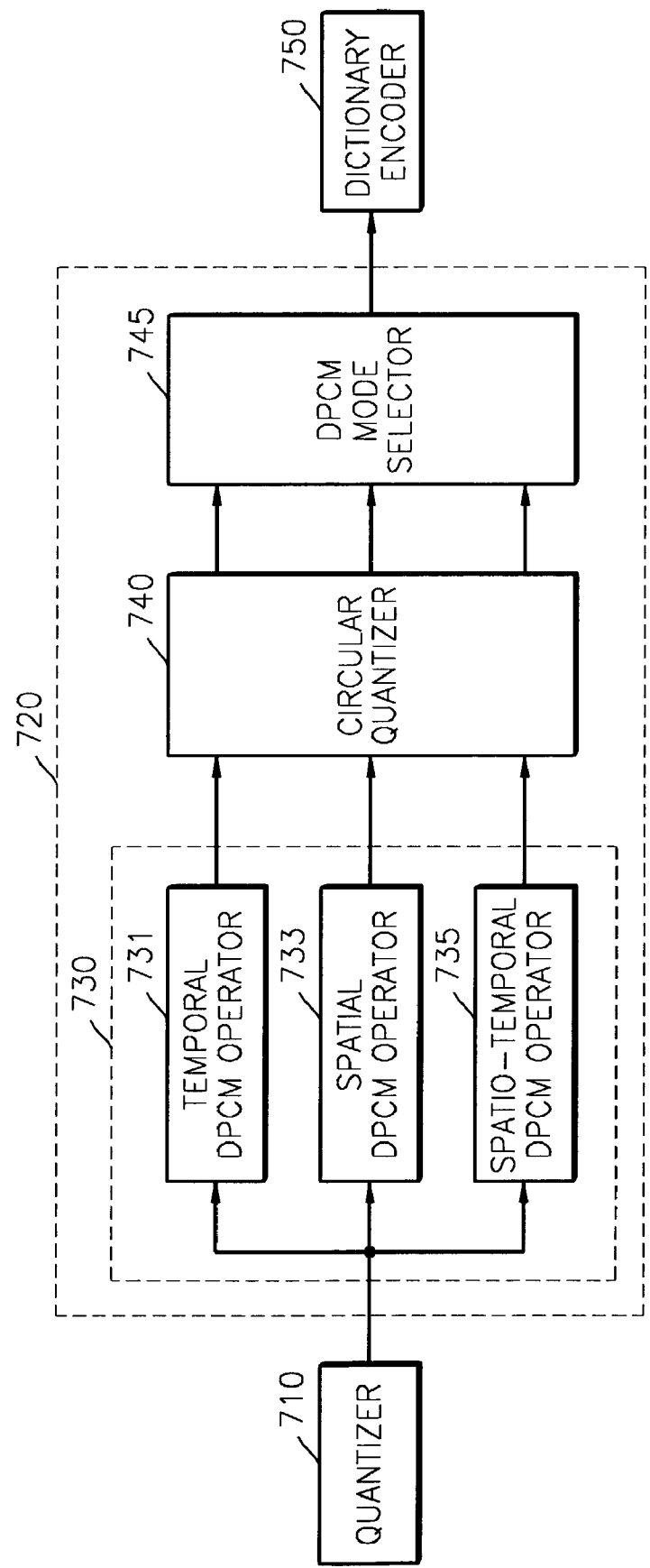
FIG. 8A is a block diagram of a DPCM processor in a key value data encoder according to a preferred embodiment of the present invention.

FIG. 8A is a block diagram of the DPCM processor 720 according to the present invention. Referring to FIG. 8A, the DPCM processor 720 includes a DPCM operator 730, which performs a temporal DPCM operation, a spatial DPCM operation, and a spatio-temporal DPCM operation on the data of each of the components input from the quantizer 710, a circular quantizer 740, which reduces the range of the differential data input from the DPCM operator 730, and a DPCM mode selector 745, which selects one of the differential data input from the circular quantizer 740. The DPCM operator 730 includes a temporal DPCM operator 731, which performs a temporal DPCM operation on the quantized data of each of the components, a spatial DPCM operator 733, which performs a spatial DPCM operation on the quantized data of each of the components, and a spatio-temporal DPCM operator 735, which performs a spatio-temporal operation on the quantized data of each of the components.

Figure 9B:
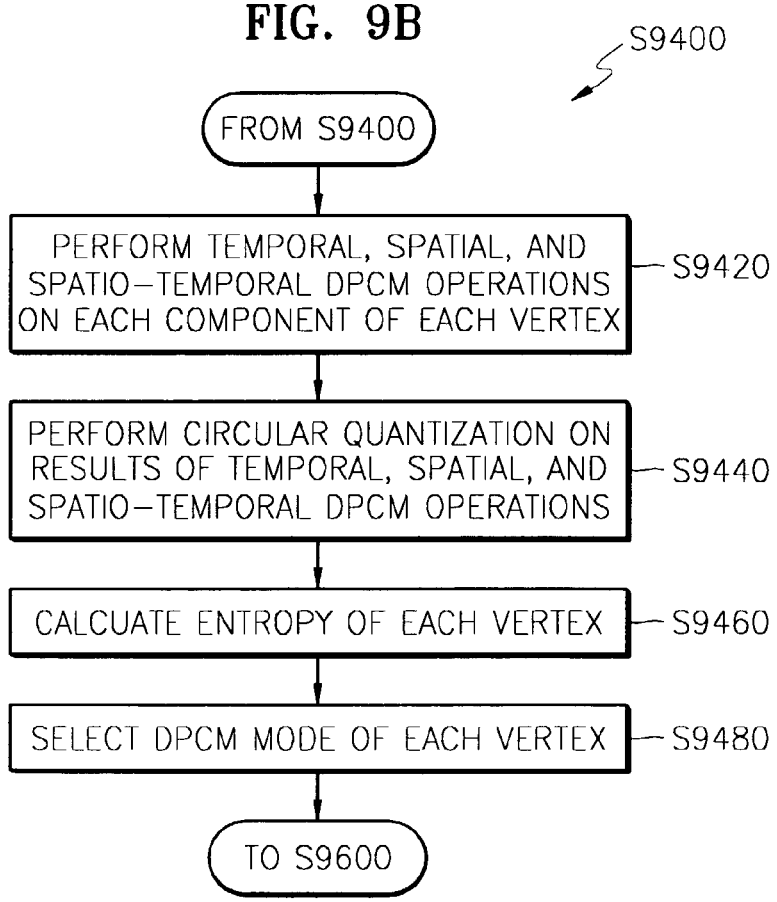
FIG. 9B is a flowchart of a DPCM operation according to a preferred embodiment of the present invention.

FIG. 9B is a flowchart of a DPCM operation according to a preferred embodiment of the present invention. Referring to FIG. 9B, the quantized data of each of the components are input from the quantizer 710 to the temporal DPCM operator 731, the spatial DPCM operator 733, and the spatio-temporal DPCM operator 735, and then a temporal DPCM operation, a spatial DPCM operation, and a spatio-temporal DPCM operation are performed on the quantized data of each of the components input into their respective operators 731, 733, and 735, in step S9420.

The temporal DPCM operator 731 calculates the differences between the component data of vertices in a current keyframe and the component data of vertices in a previous keyframe. A temporal DPCM operation is expressed by the following equation.

$$D_{i,j} = \tilde{V}_{i,j} - \tilde{V}_{i-1,j} \quad (15)$$

In Equation (15), i represents key data, and j represents the position index of a vertex.

The Spatial DPCM operator 733 calculates the differences between vertices in the same keyframe. In particular, the spatial DPCM operator 733 calculates the entropy of the previous vertices, on which a spatial DPCM operation has been performed prior to the current vertices currently being subjected to a spatial DPCM operation, using the following equation.

$$\text{Entropy}(P) = -\sum_{i=0}^{N-1} P_i \log_2 P_i \quad (16)$$

In Equation (16), $P_i$ represents the probability that a certain symbol is generated in a vertex and is equal to $$\frac{F_i}{N}$$

where $F_i$ represents how many times the symbol is generated and N represents the number of key data.

The spatial DPCM operator 733 determines a vertex having the lowest entropy among the vertices as a reference vertex and calculates differential data between the data of a vertex currently being subjected to a spatial DPCM operation and the data of the reference vertex. A spatial operation is expressed by the following equation.

$$D_{i,j} = \tilde{V}_{i,j} - \tilde{V}_{i,Ref} \quad (17)$$

The spatio-temporal DPCM operator 735 performs a spatial DPCM operation on the vertices of the current keyframe, performs a spatial DPCM operation on the vertices of the previous keyframe using a vertex among the vertices of the previous keyframe, which corresponds to the reference vertex of the current keyframe, as a reference vertex, and calculates differential data between differential data corresponding to the vertices of the current keyframe and differential data corresponding to the vertices of the previous keyframe. In other words, the spatio-temporal DPCM operator 735 performs a temporal DPCM operation on the results of the spatial DPCM operation. The spatio-temporal DPCM operation is expressed by the following equation.

$$D_{i,j}=\tilde{V}_{i,j}-\{\tilde{V}_{i-1,j}+(\tilde{V}_{i,Ref}-\tilde{V}_{i-1,Ref})\} \quad (18)$$

During the spatial DPCM operation and the spatio-temporal DPCM operation, if $\tilde{V}_{i,Ref}$ or $\{\tilde{V}_{i-1,j}+(\tilde{V}_{i,Ref}-\tilde{V}_{i-1,Ref})\}$ is smaller than a minimum value among the quantized data of each of the components, the minimum value is used for the spatial DPCM operation and the spatio-temporal DPCM operation. On the other hand, if $\tilde{V}_{i,Ref}$ or $\{\tilde{V}_{i-1,j}+(\tilde{V}_{i,Ref}-\tilde{V}_{i-1,Ref})\}$ is greater than a maximum value among the quantized data of each of the components, the maximum value is used for the spatial DPCM operation and the spatio-temporal DPCM operation.

The DPCM operator 730 outputs the calculated differential data to the circular quantizer 740, and the circular quantizer 740 performs a circular quantization operation on the temporal-DPCMed differential data, the spatial-DPCMed differential data, and the spatio-temporal-DPCMed differential data and outputs the results of the circular quantization to the DPCM mode selector 745 in step S9440.

Figure 10A:
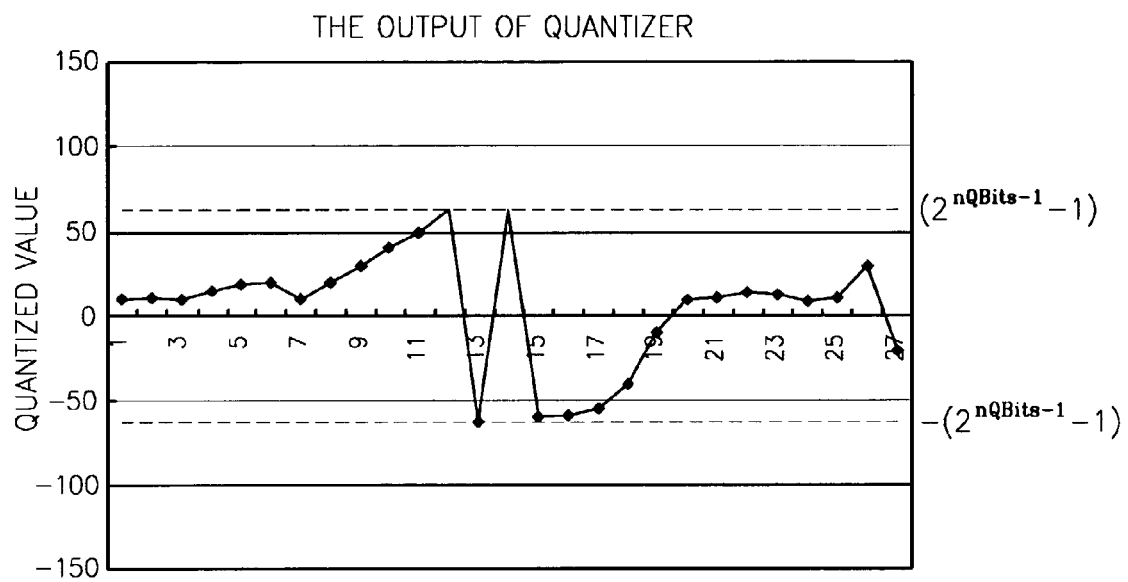
FIGS. 10A through 10C are diagrams illustrating quantized key value data, DPCMed key value data, and circular-quantized key value data, respectively.
Figure 10B:
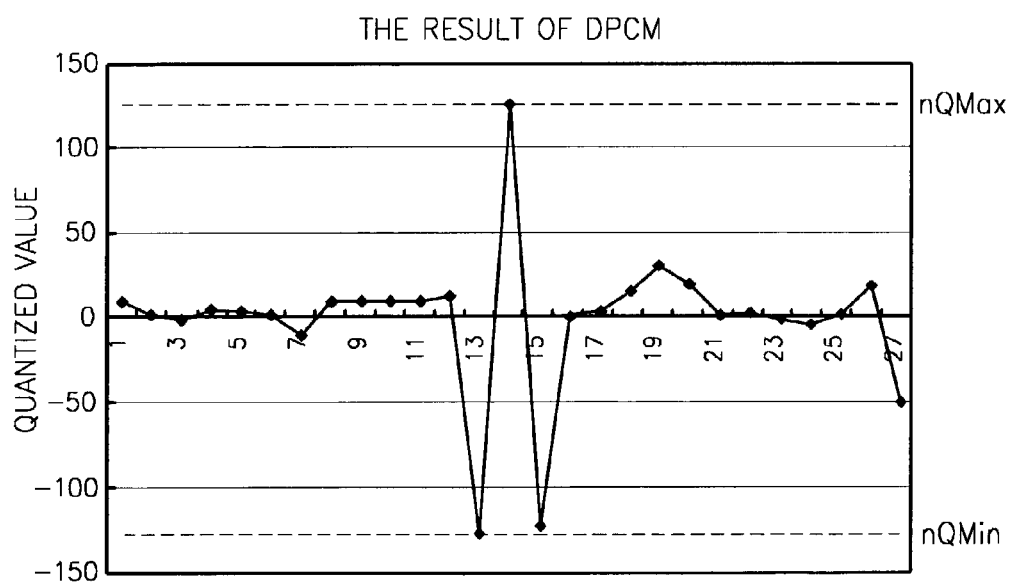

FIG. 10A is a graph showing an example of the output of the quantizer 710, and FIG. 10B is a graph showing the results of performing a DPCM operation on the quantized data shown in FIG. 10A. As shown in FIG. 10B, the range of data to be encoded can be increased as twice as it used be by performing a DPCM operation on quantized data. The purpose of a circular quantization is to perform a DPCM operation while maintaining the data range of quantized values.

In the present invention, the circular quantization is performed on the assumption that a maximum value among DPCMed differential data is circularly connected to a minimum value among the DPCMed differential data. If the result of performing a linear DPCM operation on two consecutive quantized data is greater than half of the maximum value among the DPCMed differential data, a maximum range value of the DPCMed differential data is subtracted from the result of the linear DPCM so as to generate a value having a smaller absolute value. On the other hand, if the result of the linear DPCM is smaller than half of a minimum value in the maximum range, the maximum range value is added to the result of the linear DPCM so as to generate a value having a smaller absolute value.

The operation of the circular quantizer 740 is expressed by the following equation.

CircularQuantization($X_i$):

$X'_i=X_i-(nQ\text{Max}-nQ\text{Min}+1)$ (if $X_i \geq 0$)

$X'_i=X_i+(nQ\text{Max}-nQ\text{Min}+1)$ (otherwise)

$$\tilde{X}_i=\min(|X_i|, |X'_i|) \quad (19)$$

Figure 10C:
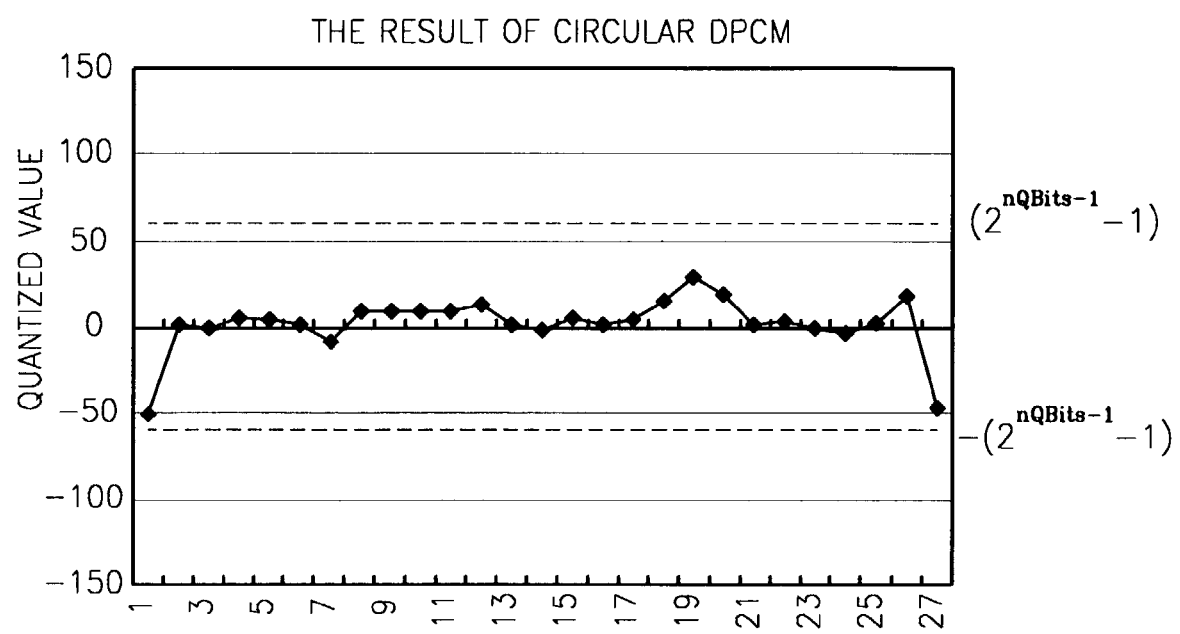

In Equation (19), nQMax represents a maximum value among DPCMed differential data, and nQMin represents a minimum value among the DPCMed differential data. FIG. 10C shows the results of performing circular quantization on the DPCMed differential data shown in FIG. 10B.

The circular quantizer 740 outputs the circular-quantized differential data to the DPCM mode selector 745.

The DPCM mode selector 745 calculates the entropy of the DPCMed differential data each obtained from the temporal DPCM operation, the spatial DPCM operation, and the spatio-temporal DPCM operation, following Equation (16) in step S9460.

Thereafter, the DPCM mode selector 745 selects a DPCM operation leading to the lowest entropy of differential data among the temporal DPCM operation, the spatial DPCM operation, and the spatio-temporal DPCM operation as a DPCM operation mode of each of the vertices and outputs the DPCMed differential data corresponding to the selected DPCM mode and information on the DPCM mode to the dictionary encoder 750 in step S9480.

Hereinafter, the dictionary encoder 750 and its operation will be described with reference to FIGS. 8B and 9C.

Figure 8B:
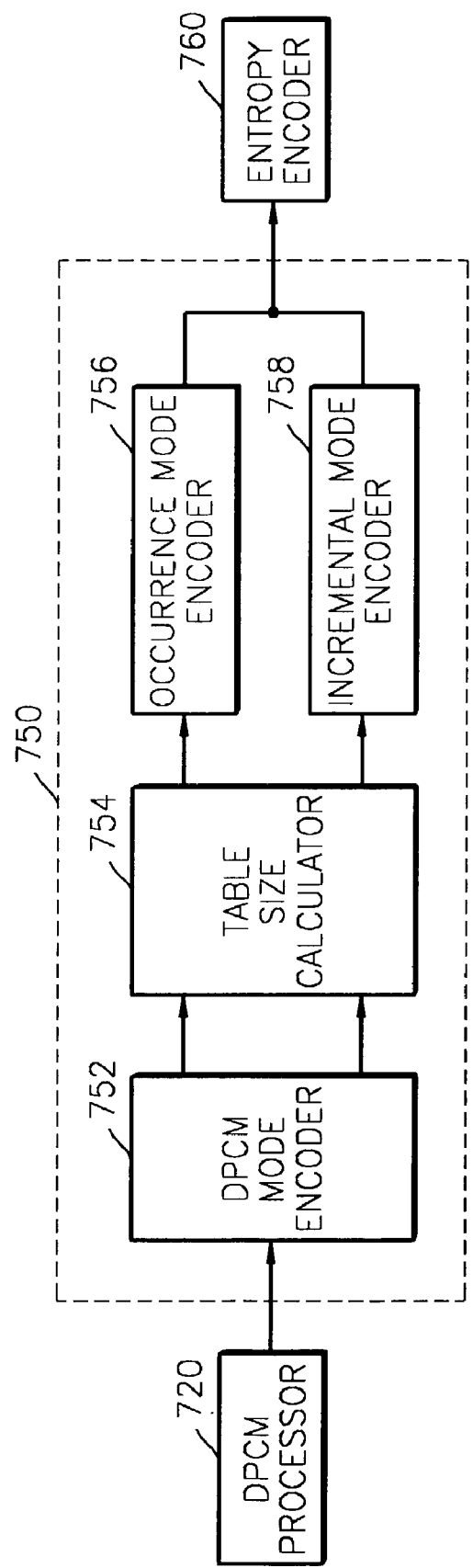
FIG. 8B is a block diagram of a dictionary encoder according to a preferred embodiment of the present invention.

FIG. 8B is a block diagram of the dictionary encoder 750 according to the present invention. Referring to FIG. 8B, the dictionary encoder 750 includes a DPCM mode encoder 752, which encodes the mode of DPCM having been performed on the data of each of the components of each of the vertices input thereinto, an occurrence mode encoder 756, which generates symbols, representing values of the differential data of each of the components of each of the vertices, and position indexes representing the positions of the symbols, an incremental mode encoder 758, which generates a symbol flag corresponding to the symbols and the position indexes representing the positions of the symbols, and a table size calculator 754, which calculates the sizes of a symbol table and a symbol flag table for representing the differential data of each of the components of each of the vertices and outputs the differential data input from the DPCM mode encoder 752 to either the occurrence mode encoder 756 or the incremental mode encoder 758.

The dictionary encoder 750 checks if a quantization selection flag of the differential data of each of the components of each of the vertices is 1 and, if it is, performs subsequent processes, which will be described in the following. On the other hand, if the quantization selection flag of the differential data of a certain vertex is 0, which means the vertex has the same quantized value in all the keyframes, the dictionary encoder 750 omits a dictionary encoding process and encodes the quantized value QMin into a key value header.

Figure 9C:
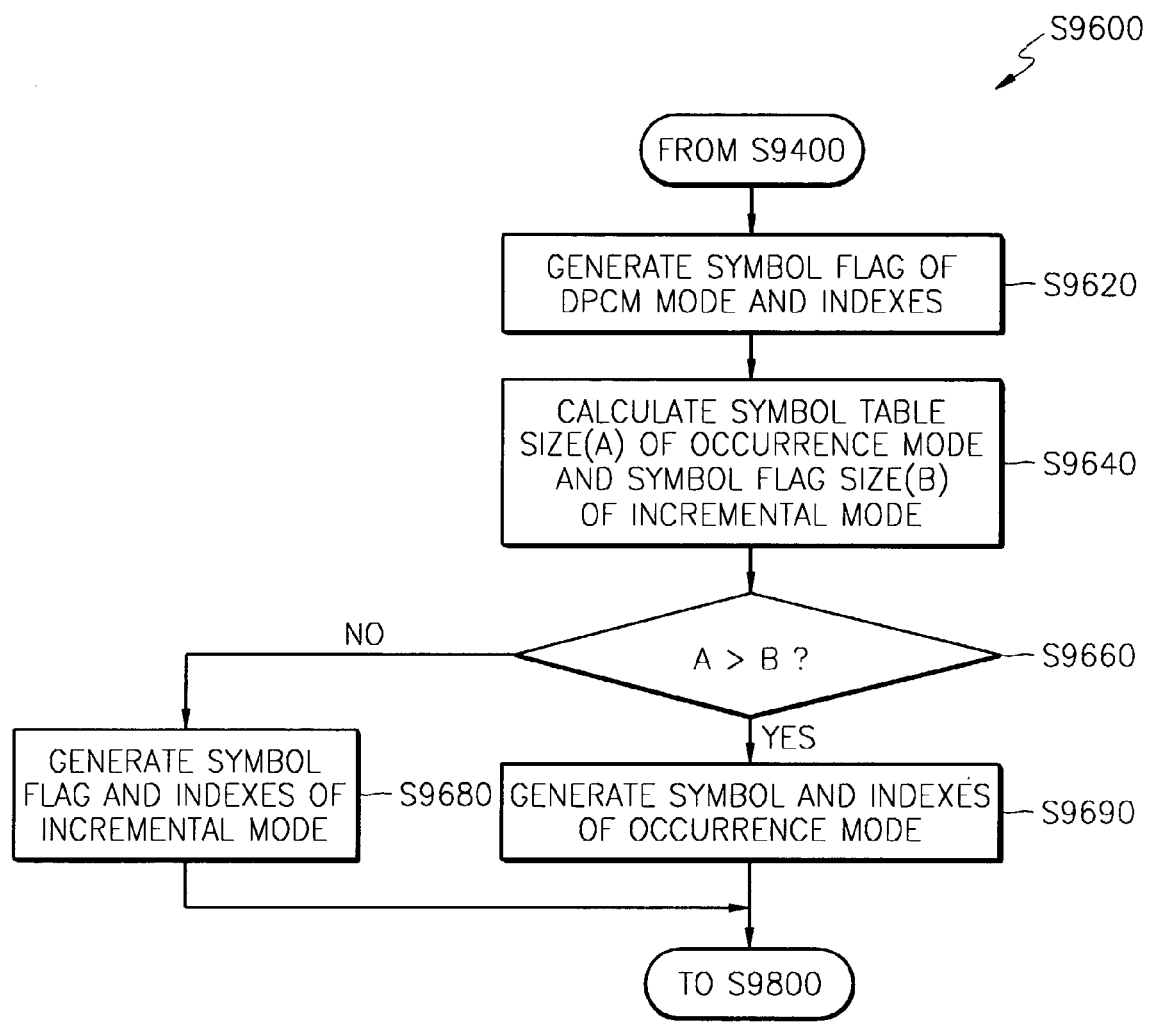
FIG. 9C is a flowchart of a dictionary encoding operation according to a preferred embodiment of the present invention.

FIG. 9C is a flowchart of a dictionary encoding process according to the present invention. Referring to FIG. 9C, the differential data of each of the components of each of the vertices, which have been generated in the DPCM processor 720, are input into the DPCM mode encoder 752, and then the DPCM mode encoder 752 generates the symbols representing the mode of the DPCM operation, which has been performed on the data of each of the components of each of the vertices, and the position indexes indicating the positions of the symbols in step S9620.

Figure 11A:
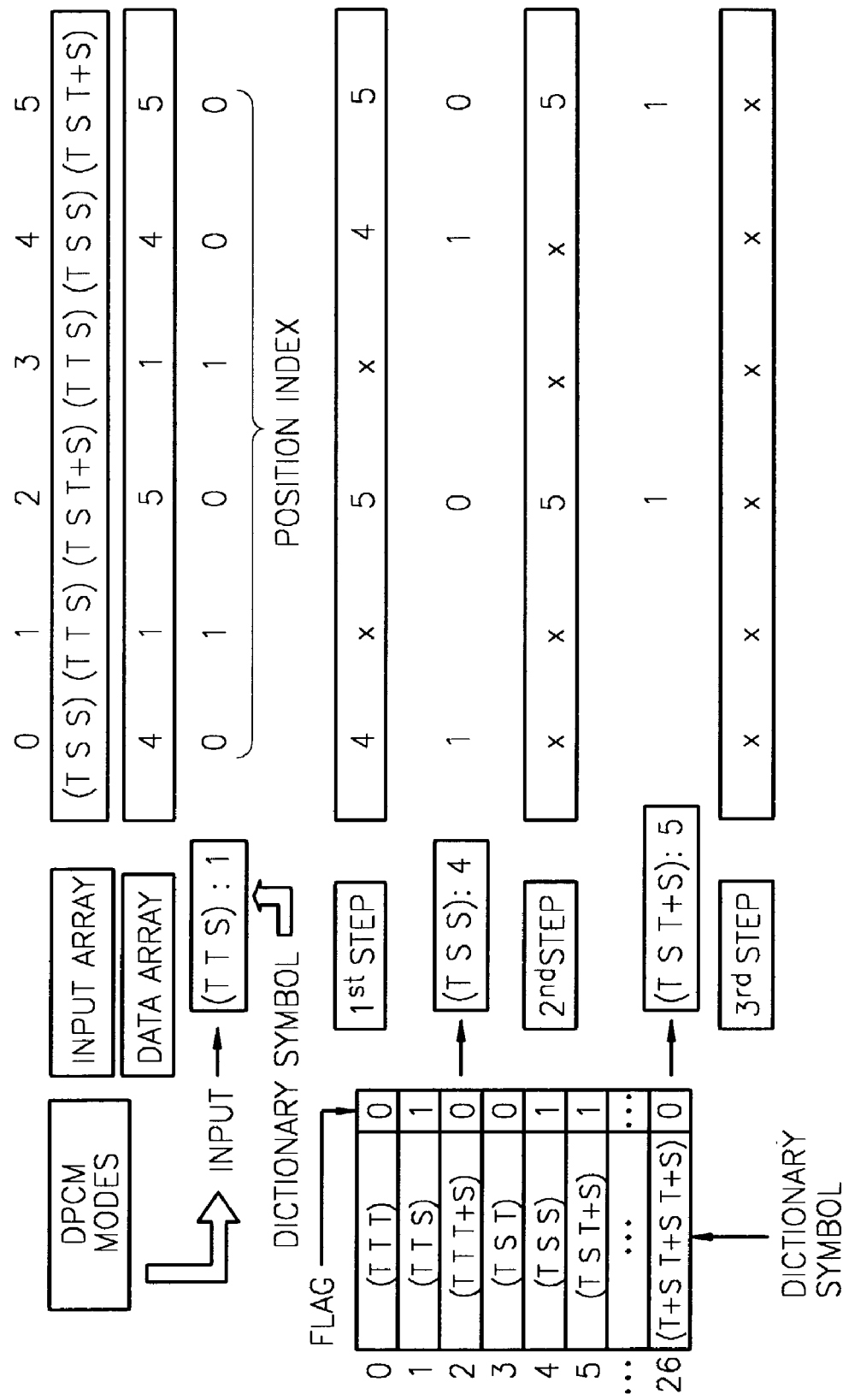
FIG. 11A is a diagram illustrating a DPCM mode encoding method according to a preferred embodiment of the present invention.

FIG. 11A is a diagram illustrating a method of encoding DPCM modes performed in the DPCM mode encoder 752 according to the present invention. Referring to FIG. 11A, the DPCM mode encoder 752 prepares a table, in which the DPCM modes of each of the components of each of the vertices and their respective symbols are shown, in advance, as shown in Table 4. Table 4 shows combinations of DPCM operations and their corresponding symbols. In Table 4, a temporal DPCM operation, a spatial DPCM operation, and a spatio-temporal DPCM operation are referred to as T, S, and T+S, respectively.

TABLE 4

| Symbols | DPCM Modes |
| --- | --- |
| 0 | (T, T, T) |
| 1 | (T, T, S) |
| 2 | (T, T, T + S) |
| 3 | (T, S, T) |
| 4 | (T, S, S) |
| 5 | (T, S, T + S) |
| 6 | (T, T + S, T) |
| 7 | (T, T + S, S) |
| 8 | (T, T + S, T + S) |
| 9 | (S, T, T) |
| 10 | (S, T, S) |
| 11 | (S, T, T + S) |
| 12 | (S, S, T) |
| 13 | (S, S, S) |
| 14 | (S, S, T + S) |
| 15 | (S, T + S, T) |
| 16 | (S, T + S, S) |
| 17 | (S, T + S, T + S) |
| 18 | (T + S, T, T) |
| 19 | (T + S, T, S) |
| 20 | (T + S, T, T + S) |
| 21 | (T + S, S, T) |
| 22 | (T + S, S, S) |
| 23 | (T + S, S, T + S) |
| 24 | (T + S, T + S, T) |
| 25 | (T + S, T + S, S) |
| 26 | (T + S, T + S, T + S) |

Each of the vertices includes three components x, y, and z, and accordingly, the number of combinations of DPCM operations is 27.

As shown in FIG. 11A, the differential data of each of the vertices corresponds to one of the symbols shown in Table 4 depending on what DPCM operations the differential data have been through. The DPCM mode encoder 752 makes the DPCM modes of the vertices correspond to their respective symbols shown in Table 4 and sets up flags indicating that the symbols exist in the differential data of their respective vertices.

The DPCM mode encoder 752 arranges symbols corresponding to the DPCM modes of the vertices in a column and generates position indexes for the symbols in the order of from a position index for a symbol having the smallest magnitude to a position index for a symbol having the greatest magnitude.

As shown in FIG. 11A, an array of symbols corresponding to the DPCM modes of the differential data of the vertices is (4, 1, 5, 1, 4, 5). Among the symbols, 1 is the smallest symbol and corresponds to (T, T, S). The DPCM mode encoder 752 generates a position index for the symbol 1 so that the places where 1 appears in the array of symbols are represented by 1. Accordingly, the position index is (0, 1, 0, 1, 0, 0).

Thereafter, the DPCM mode encoder 752 generates a position index for the second smallest symbol 4, which corresponds to a DPCM mode (T, S, S), so that the places where 4 is located are represented by 1. In the generation of the position index for the symbol 4, the locations of the symbol 1 are not counted. Accordingly, the position index for the symbol 4 is (1, 0, 1, 0). In the same manner, the DPCM mode encoder 752 generates a position index for a symbol 5, which corresponds to (T, S, T+S). The position index for the symbol 5 is (1, 1).

Thereafter, the DPCM mode encoder 752 outputs the flags and the position indexes to the table size calculator 754.

Referring to FIGS. 8B and 9C again, the table size calculator 754 calculates the size (A) of a symbol table used for encoding the input differential data in an occurrence mode, and the size (B) of a symbol flag used for encoding the input differential data in an incremental mode, which correspond to the symbols in the previously set symbol table in step S9640.

The table size calculator 754 compares the size (A=S* (AQP+1) where S represents the number of symbols included in differential data and AQP represents the size of bits used to represent a symbol) of the symbol table used in the occurrence mode encoder 756 with the size (B=$2^{AQP+1}-1$ where AQP represents the size of bits used to represent a symbol) of the symbol flag corresponding the respective symbols in step S9660.

The table size calculator 754 outputs the differential data of each of the vertices to the occurrence mode encoder 756, if A is smaller than B, and outputs them to the incremental mode encoder 758, if B is smaller than A.

The operation of the occurrence mode encoder 756 will be described in the following with reference to FIG. 11B.

The occurrence mode encoder 756 generates symbols corresponding to the values of input differential data of each vertex and position indexes indicating the locations of their respective symbols in step S9680.

Figure 11B:
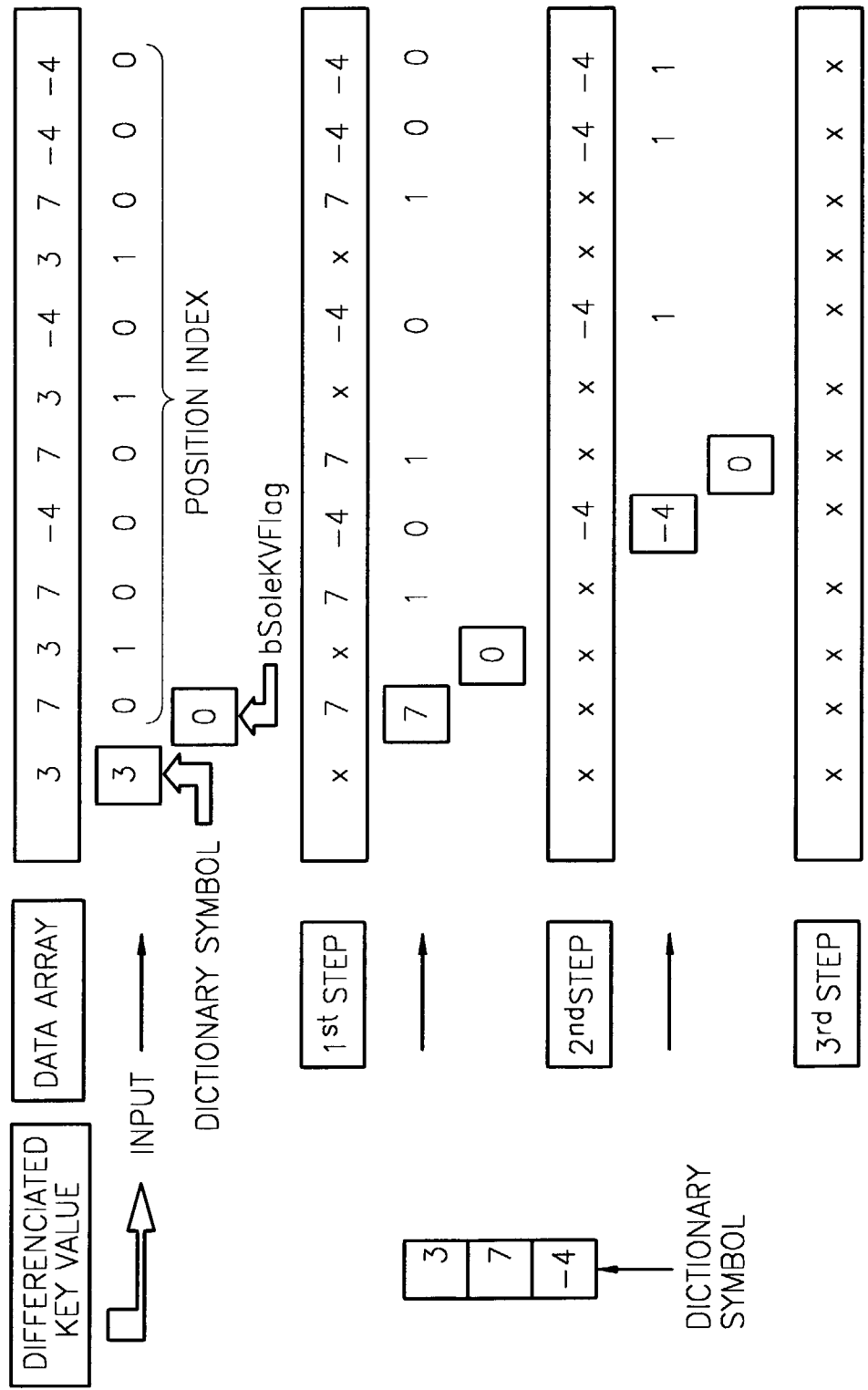
FIG. 11B is a diagram illustrating an occurrence mode encoding method according to a preferred embodiment of the present invention.

Referring to FIG. 11B, when input differential data of a vertex is (3, 7, 3, 7, −4, 7, 3, −4, 3, 7, −4, −4), the occurrence mode encoder 756 prepares a table, in which the symbols 3, 7, and −4 corresponding to differential values of differential data of each vertex are sequentially written in a row.

The occurrence mode encoder 756 encodes the first symbol 3 in the array of the symbols and generates a position index for the symbol 3 so that the places where 3 is located are represented by 1 and the other places are represented by 0. The position index for the symbol 3 is (0 1 0 0 0 1 0 1 0 0 0).

Next, the occurrence mode encoder 756 generates a position index for the next symbol 7. As shown in FIG. 11B, the locations of the previous symbol are not counted again in the generation of the position index for the next symbol. Accordingly, the position index for the symbol 7 is (1 0 1 0 1 0 0).

In the occurrence mode encoder 756, all position indexes for symbols are generated considering only the locations of symbols, which have not been encoded yet, and thus a position index for a symbol −4 is (1 1 1).

In FIG. 11B, a flag bSoleKV is set to 0. The flag bSoleKV indicates whether or not a symbol appears only one time in an array of symbols of differential data. If a symbol appears only one time and thus its position index consists of only 0s, bSoleKV is set to 1 for the corresponding symbol, and the position index of the corresponding symbol is not encoded. The occurrence mode encoder 756 outputs the symbols of the input differential data, the position indexes of the symbols, and bSoleKV to the entropy encoder 760 for entropy-encoding differential data.

Hereinafter, the operation of the incremental mode encoder 758 according to the present invention will be described with reference to FIG. 11C.

The incremental mode encoder 758 generates a symbol flag indicating whether or not symbols included in a predetermined symbol table exist in input differential data and position indexes for the symbols in step S9690.

The incremental mode encoder 758 generates in advance a table for symbols which are expected to exist in input differential data. In the table, symbols are arranged in column in the order from a symbol having the lowest absolute value to a symbol having the greatest absolute value, and between two symbols having the same absolute value, the one having a positive value is arranged in a higher row than the other. Accordingly, symbols are written in the table in the order of 0, 1, −1, 2, −2, 3, −3, . . . . The size of a symbol flag corresponding to symbols in a symbol table is $2^{AQP+1}-1$. For example, if AQP is 2, the number of symbols which can be represented by a symbol flag is 7. The symbol flag is set to 1 if a value corresponding to a symbol exists in differential data. Position indexes are generated for only symbols, for which the symbol flag is set to 1.

Figure 11C:
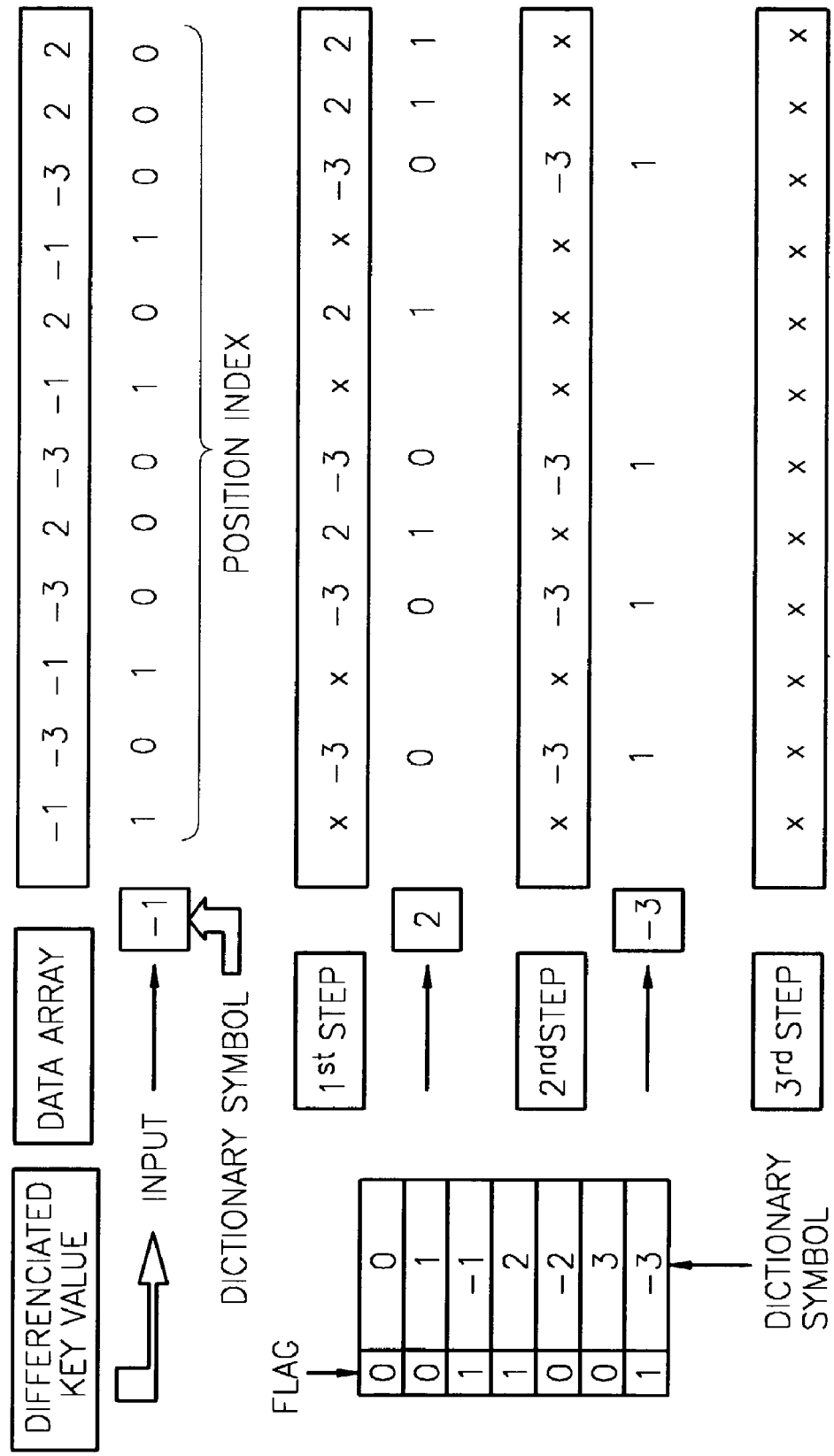
FIG. 11C is a diagram illustrating an incremental mode encoding method according to a preferred embodiment of the present invention.

Referring to FIG. 11C, if differential data input into the incremental mode encoder 758 are (−1, −3, −1, −3, 2, −3, −1, 2, −1, −3, 2, 2), symbols existing in the differential data are (−1, 2, −3), and thus the symbol flag (0, 0, 1, 1, 0, 0, 1) is determined.

The incremental mode encoder 758 generates a position index for a symbol which is located in a higher row in the symbol table than other symbols first. As shown in FIG. 11C, the incremental mode encoder 758 sets up the places where a symbol −1, which ranks first in the symbol table among the symbols existing in the differential data, appears at 1 and sets up other places at 0 so that a position index for the symbol −1 is (1 0 1 0 0 0 1 0 1 0 0 0).

Next, the incremental mode encoder 758 generates a position index (0 0 1 0 1 0 1 1) for a symbol 2 without considering the positions of the symbol −1, which has already been encoded. Finally, the incremental mode encoder 758 generates a position index (1 1 1 1) for a symbol 3 without considering the positions of the symbols −1 and 2, which have already been encoded. The incremental mode encoder 758 outputs the symbol flag and the position indexes for their respective symbols to the entropy encoder 760.

All position indexes generated by the occurrence mode encoder 756 and the incremental mode encoder 758 have a flag called nTrueOne which indicates whether or not original position indexes have been inversed. Specifically, if nTrueOne is set to 0, position indexes are considered obtained by inversing their original position indexes. In a case where position indexes include a lot of 1s, it is possible to enhance the arithmetic encoding efficiency by inversing the position indexes so as to increase the number of 0s.

Hereinafter, the operation of the entropy encoder 760 will be described with reference to FIG. 9D.

The entropy encoder 760 according to the present invention entropy-encodes the symbol flag representing the symbols of the differential data and the position indexes for the symbols, which are input from the incremental mode encoder 758, and entropy-encodes the symbols of the differential data and their respective position indexes, which are input from the occurrence mode encoder 756, using a function enodeSignedQuasiAAC( ).

In encodeSignedQuasiAAC( ), an adaptive-arithmetic-encoded bitstream is generated using a context regarding input values and their signs. In particular, in encodeSignedQuasiAAC( ), a first bit which is not 0 is encoded, then its sign is encoded, and other bits are encoded using a zero context.

Figure 9D:
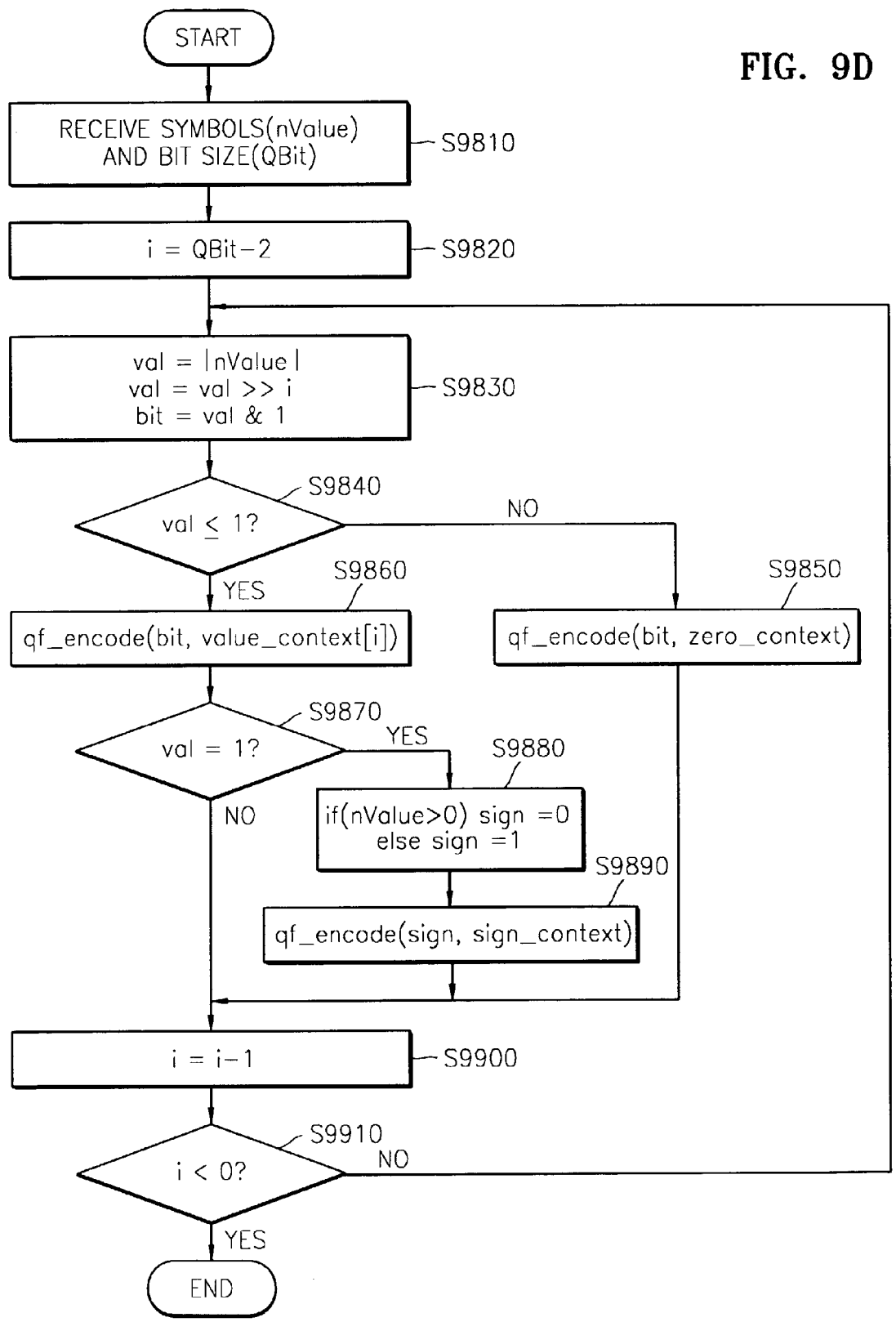
FIG. 9D is a flowchart of an entropy encoding operation according to a preferred embodiment of the present invention.

FIG. 9D is a flowchart of a process of encoding a symbol using encodeSignedQuasiAAC( ).

The entropy encoder 760 receives a symbol nValue of differential data to be encoded and its bit size QBit in step S9810.

The entropy encoder 760 subtracts 2 from nQBit and stores the result of the subtraction as a variable i in step S9820.

In step S9830, the entropy encoder 760 stores the absolute value of the symbol nValue as a variable val and performs a shift-right (SR) operation on val as many times as i. In the same step, the entropy encoder 760 performs an logic AND operation on 1 and the result of the SR operation and stores the result of the logic AND operation as a variable bit.

In the first cycle of the process of encoding a symbol using encodeSignedQuasiAAC( ), a first bit among input values to be entropy-encoded except for sign bits is detected, and in subsequent cycles, other bits are read one by one.

The entropy encoder 760 checks if val is not greater than 1 in step S9840. If val is greater than 1, the value of 'bit' is encoded using a function qf_encode( ) under a zero context in step S9850. On the other hand, if val is not greater than 1, the value of 'bit' is encoded using the function qf_encode( ) under an i-th context in step S9860.

When val is not greater than 1, the entropy encoder 760 checks again if val is 1 in step S9870. If val is 1, the sign of nValue is set up in step S9880 and nValue is encoded based on its sign and a sign context in step S9890.

When the encoding process for one bit is completed, the entropy encoder 760 decreases i by 1 in step S9900 and then checks if the current value of i is smaller than 0 in step S9910. The entropy encoder 760 entropy-encodes the input values by repeatedly performing S9830 through S9900 until i is smaller than 0.

Accordingly, the entropy encoder 760 encodes a first bit of an input value, which is not 0, following a context allotted to the first bit and encodes other bits following the zero context.

Hereinafter, information to be encoded into a key value header in the header encoder 500 will be described with reference to FIG. 7A.

The header encoder 500 receives an input coordinate coordinator and encodes a data mode, the number of vertices in each keyframe, the number of bits required for the number of vertices, and the maximum number of effective digits of each floating-point number.

The header encoder 500 encodes a quantization bit number, minimum values among key value data of each component of each of the vertices and a maximum data range among the data ranges of each of the components of each of the vertices, and maximum and minimum values among quantized data of each of the components of each of the vertices.

The header encoder 500 receives the mode of a DPCM operation, which has been performed on the data of each of the components of each of the vertices, from the DPCM processor 720, receives a dictionary encoding mode from the dictionary encoder 750, and encodes the DPCM operation mode and the dictionary encoding mode.

Hereinafter, a method and an apparatus for decoding a bitstream, into which key data and key value data of a coordinate interpolator are encoded, according to a preferred embodiment of the present invention will be described in greater detail with reference to the accompanying drawings.

Figure 12:
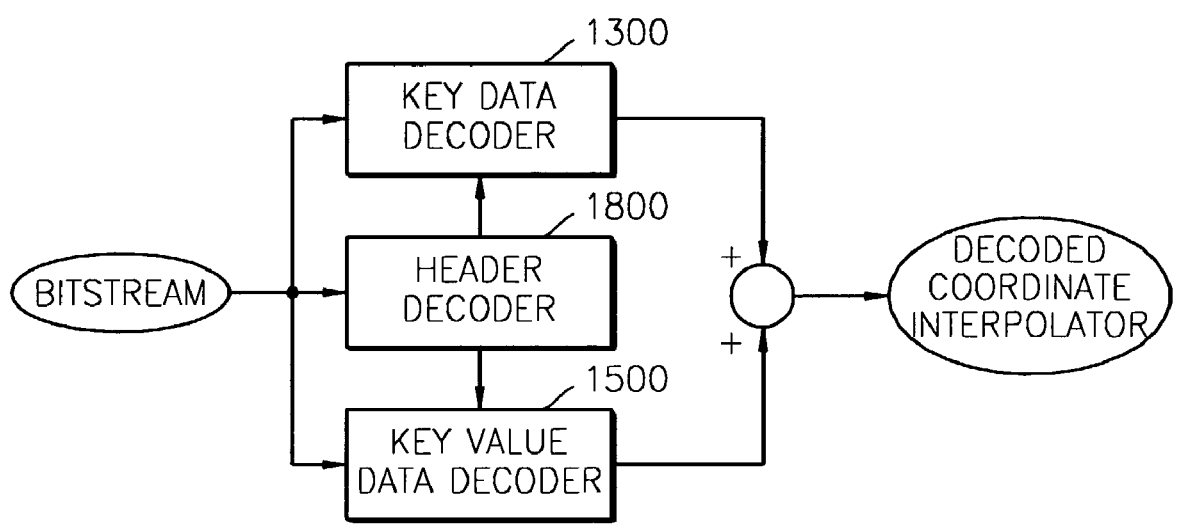
FIG. 12 is a block diagram of an apparatus for decoding a coordinate interpolator according to a preferred embodiment of the present invention.

FIG. 12 is a block diagram of an apparatus for decoding a coordinate interpolator according to a preferred embodiment of the present invention. Referring to FIG. 12, the apparatus for decoding a coordinate interpolator includes a key data decoder 1300, which decodes key data from an input bitstream, a key value data decoder 1500, which decodes key value data from the input bitstream, and a header decoder 1500, which decodes header information necessary to decode the key data and the key value data from the input bitstream and provides the decoded header information to the key data decoder 1300 and the key value data decoder 1500.

Hereinafter, the structure and operation of the key data decoder 1300 will be described in greater detail with reference to FIGS. 13 through 14B.

Figure 13:
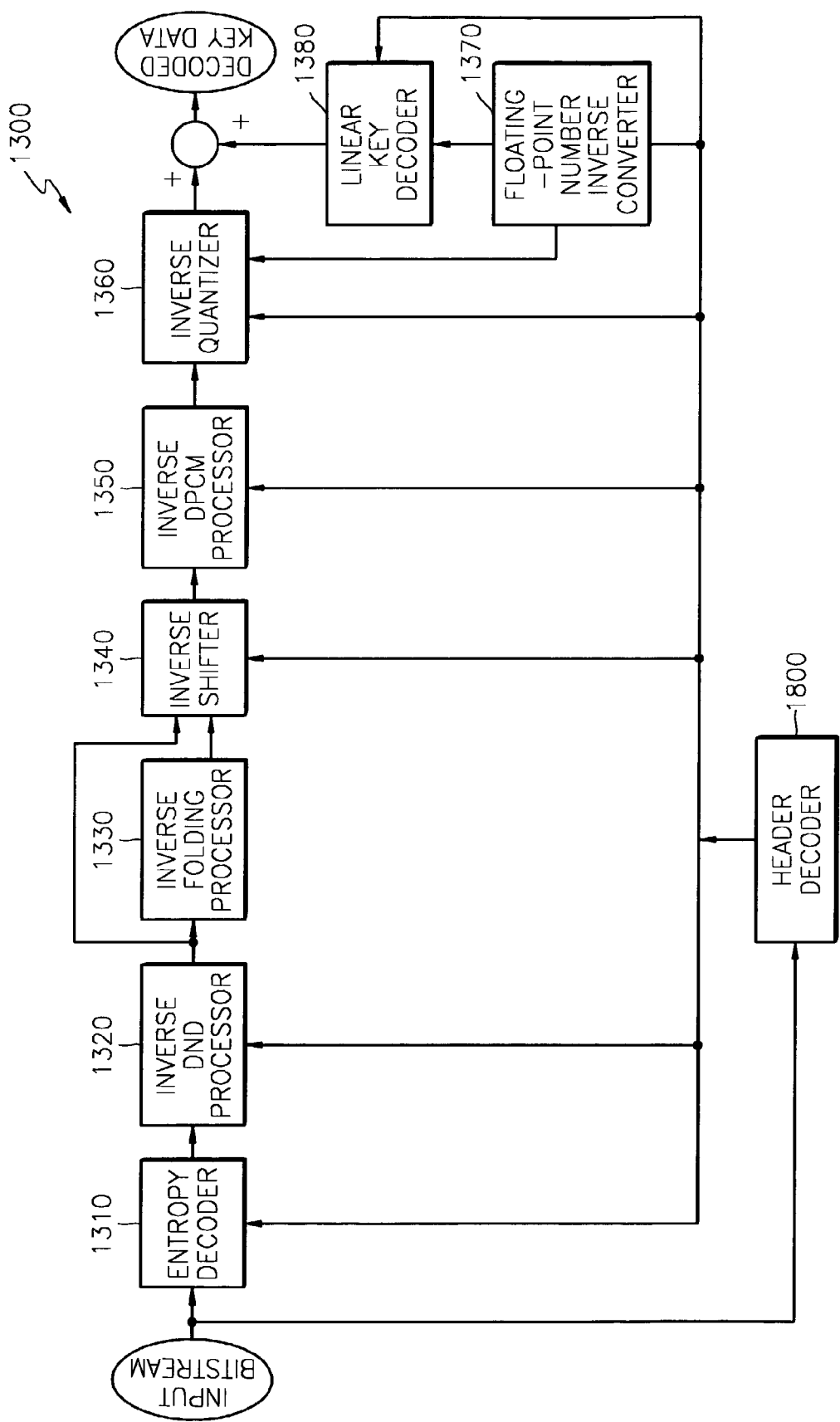
FIG. 13 is a block diagram of a key data decoder according to a preferred embodiment of the present invention.

FIG. 13 is a block diagram of the key data decoder 1300 according to a preferred embodiment of the present invention. The key data decoder 1300 receives an encoded bitstream and reconstitutes it into key data by decoding.

The key data decoder 1300 includes an entropy decoder 1310, an inverse DND processor 1320, an inverse folding processor 1330, an inverse shifter 1340, an inverse DPCM processor 1350, an inverse quantizer 1360, a linear key decoder 1380, and a floating-point number inverse converter 1370.

Figure 14A:
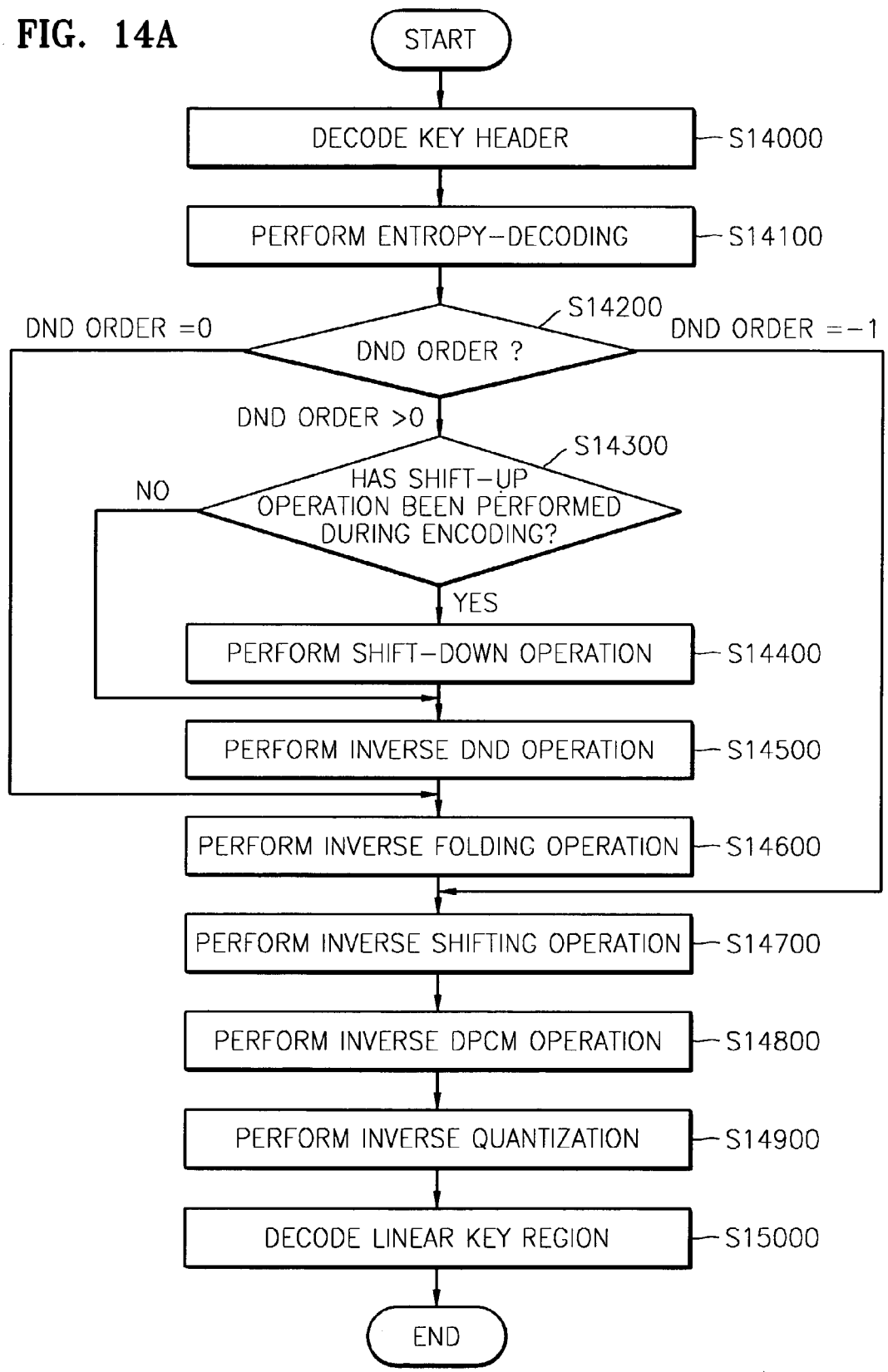
FIG. 14A is a flowchart of a method for decoding key data according to a preferred embodiment of the present invention.

FIG. 14A is a flowchart of a method for decoding key data according to a preferred embodiment of the present invention. Referring to FIG. 14A, a bitstream, into which key data are compressed, is input into the header decoder 1800 and the entropy decoder 1310.

The header decoder 1800 decodes pieces of information required for each step of decoding and provides them to their corresponding steps of decoding in step S14000. The information decoded by the header decoder 1800 will be described with each decoding step.

The entropy decoder 1310 receives the number of differential data to be decoded and the number of bits that have been used for encoding, i.e., the number of bits to be used for decoding, from the header decoder 1800 and decodes the input bitstream in step S14100. The number of differential data is equal to the result of subtracting the number of intra key data obtained by performing DPCM from the number of key data.

The entropy decoder 1310 identifies if the differential data to be decoded have negative values or positive values based on predetermined information included in the bitstream, for example, bSignedAACFlag in the present embodiment. If the encoded differential data have negative values, the entropy decoder 1310 decodes them using function decodeSignedAAC( ). On the other hand, if the encoded differential data have only positive values, the entropy decoder 1310 decodes them using function decodeUnsignedAAC( ). Thereafter, the decoded differential data are transmitted to the inverse DND processor 1320.

The inverse DND processor 1320 receives the order of DND and a maximum value nKeyMax in each cycle of DND from the header decoder 1800.

If the order of DND is −1, this means that the encoded differential data being decoded have been entropy-decoded going through a DPCM operation and a shifting operation instead of going through DND, and the method directly moves onto a step of performing an inverse shifting operation. If the order of DND is 0, this means that the encoded differential data being decoded have been entropy-decoded going through a folding operation instead of going through DND, and thus the method directly moves onto a step of performing an inverse folding operation. If the order of DND is greater than 0, an inverse DND operation is performed in step S14200.

The inverse DND processor 1320 determines whether or not the encoded differential data being decoded have been encoded going through a shift-up operation in step S14300. In a preferred embodiment of the present invention, it is determined whether or not the encoded differential data being decoded have been encoded going through a shift-up operation by checking whether or not nKeyInvertDown included in a bitstream is greater than 0.

If the encoded differential data being decoded have not been through a shift-up operation, the method moves onto a step of performing an inverse DND. On the other hand, if the encoded differential data being decoded have been through a shift-up operation, the differential data that have been transferred from a positive number region to a negative number region by performing a shift-up operation are moved back to the negative number region in step S14400. In a preferred embodiment of the present invention, the differential data having been through a shift-up operation are restored by performing a shift-down operation (an invert-down operation) which is expressed by the following equation.

$$\text{invert} - \text{down}(v) \quad (20)$$
$$= v \quad (\text{if } v \leq nKeyInvertDown)$$
$$= nKeyInvertDown - v \quad (\text{if } v > nKeyInvertDown)$$

Here, nKeyInvertDown has the same value as the maximum value nKeyMax used in the shift-up operation. As a result of the shift-down operation, the differential data having a value over nKeyInvertDown are converted into negative values below −1.

An inverse divide-down operation or an inverse divide-up operation is selectively performed on the differential data having been through the shift-down operation depending on the maximum value nKeyMax in each cycle of DND.

Figure 14B:
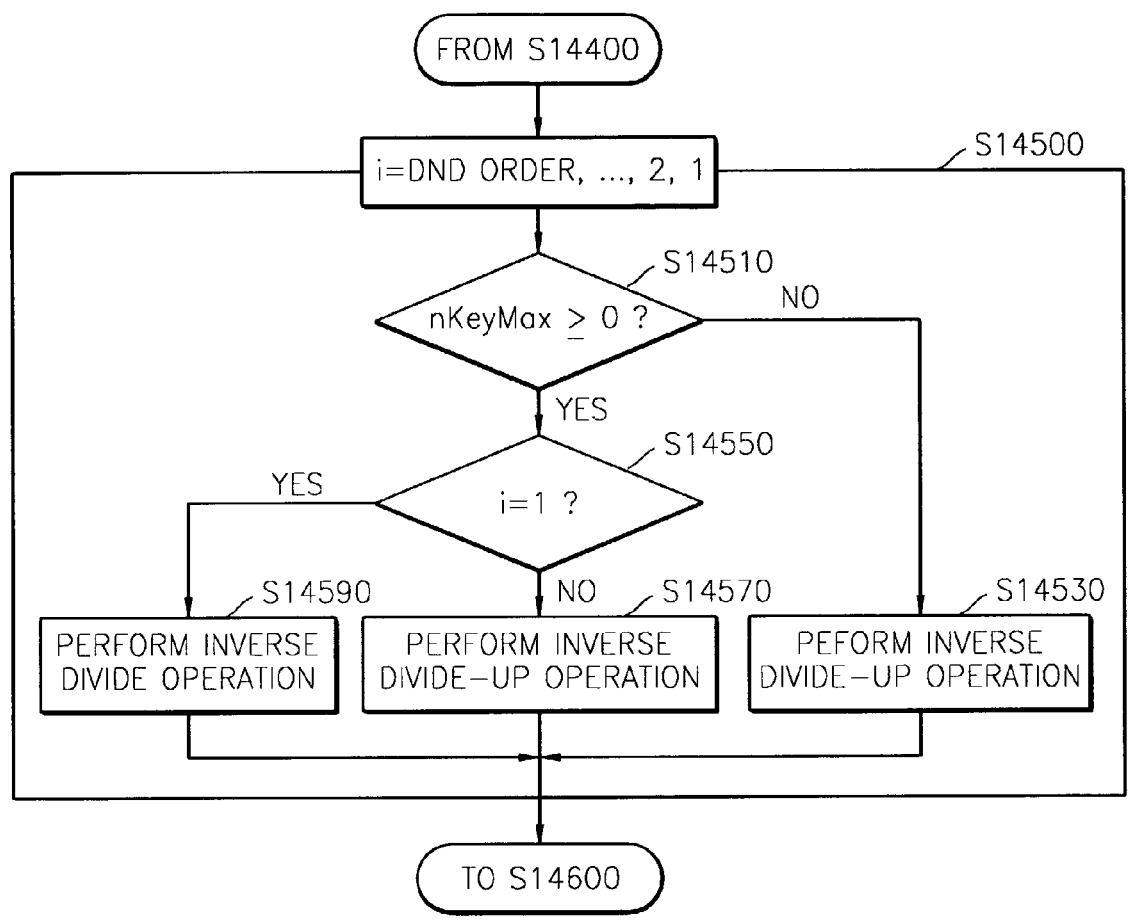
FIG. 14B is a detailed flowchart of step S14500 shown in FIG. 14A.

Referring to FIG. 14B, the inverse DND processor 1320 performs an inverse DND operation as many times as the differential data have been through a DND operation during encoding. In other words, the inverse DND processor 1320 sets up an initial value of the order of inverse DND to be equal to the order of DND. Next, the inverse DND processor 1320 subtracts 1 from the initial value of the order of inverse DND every time it performs an inverse DND operation and keeps performing the inverse DND operation until the order of inverse DND becomes 1. The inverse DND processor 1320 searches for nKeyMax in each cycle of DND and checks whether or not each nKeyMax is not smaller than 0 in step S14510.

If nKeyMax is smaller than 0, it means that a divide-up operation has been performed in the process of encoding, and thus the inverse DND processor 1320 extends the range of the differential data being decoded to a negative number region by performing an inverse divide-up operation, in step S14530. In a preferred embodiment of the present invention, an inverse divide-up operation, which is defined by Equation (21), may be used.

$$\text{inverse} - \text{divide} - \text{up}(v) \quad (15)$$
$$= v \quad (\text{if } v \geq 0)$$
$$= (nKeyMax_i - 1) - \frac{v-1}{2} \quad (\text{if } v < 0, v \bmod 2 \neq 0)$$
$$= \frac{v}{2} \quad (\text{if } v < 0, v \bmod 2 = 0)$$

However, if nKeyMax is not smaller than 0, the inverse DND processor 1320 checks if the order of inverse DND is 1. If the order of inverse DND is not 1, it means that a divide-down operation has been performed on the differential data being decoded in the process of encoding, and thus the inverse DND processor 1320 extends the range of the differential data to a positive number region by performing an inverse divide-down operation, in step S14570.

In a preferred embodiment of the present invention, an inverse divide-down operation which is defined by the following equation may be used.

$$\text{inverse} - \text{divide} - \text{down}(v) \quad (22)$$
$$= v \quad (\text{if } v \geq 0)$$

-continued $$= (nKeyMax_i + 1) + \frac{v-1}{2} \quad \text{(if } v < 0, v \bmod 2 \neq 0\text{)}$$

$$= \frac{v}{2} \quad \text{(if } v < 0, v \bmod 2 = 0\text{)}$$

If nKeyMax is not smaller than 0 and the order of inverse DND is 1, the inverse DND processor 1320 completes an entire inverse DND operation after performing an inverse divide operation in step S14590. In a preferred embodiment of the present invention, an inverse divide operation, which is defined by Equation (23), may be used.

$$\text{inverse} - \text{divide}(v) \qquad (23)$$
$$= v \quad \text{(if } v \geq 0\text{)}$$
$$= v + (nKeyMax_0 + 1) \quad \text{(if } v < 0\text{)}$$

The differential data of key data which have been through the inverse DND operation are input into the inverse folding processor 1330, and the inverse folding processor 1330 performs an inverse folding operation on the differential data so that the differential data which used to be only in a positive number region are divided into positive values and negative values in step S14600. In a preferred embodiment of the present invention, an inverse folding operation which is defined by Equation (24) may be used.

$$\text{inverse} - \text{fold}(v) = -\frac{(v+1)}{2} \text{(if } v \bmod 2 \neq 0\text{)} \qquad (24)$$
$$= \frac{v}{2} \quad \text{(if } v \bmod 2 = 0\text{)}$$
$$= 0 \quad \text{(if } v = 0\text{)}$$

The differential data which have been through the inverse folding operation are output to the inverse shifter 1340, and the inverse shifter 1340 adds a mode nKeyShift, which has been used in the process of encoding and is input from the header decoder 1800, to the differential data input from the inverse folding processor 1340, in step S14700. This operation is expressed by the following equation.

$$\text{inverse-shift}(v) = v + nKeyShift \qquad (25)$$

The inverse DPCM processor 1350 restores the differential data input from the inverse shifter 1340 into quantized key data using the order of DPCM input from the header decoder 1800, in step S14800. The inverse shifter 1340 performs an inverse DPCM operation as many times as the order of DPCM following Equation (26).

$$v(i+1) = v(i) + \text{delta}(i) \qquad (26)$$

Here, i indicates an index of differential data and key data, v indicates an array of integers, and delta(i) indicates differential data.

The quantized key data having been through the inverse DPCM operation are input into the inverse quantizer 1360. Then, the inverse quantizer 1360 receives information on whether or not the size nKeyQBit of quantization bits and maximum and minimum values used for inverse quantization are encoded by the floating-point number converter 315 from the header decoder 1800 and converts the quantized key data into inverse-quantized key data in step S14900 using the following equation.

$$\text{inverse} - \text{quantize}(v) = \qquad (27)$$
$$fKeyMin + \frac{v}{2^{nKeyQBit} - 1} \times (fKeyMax - fKeyMin)$$

If maximum and minimum values used for quantization have not been converted by the floating-point number converter 315 in the process of encoding key data, fKeyMin and fKeyMax shown in Equation (27) are set to 0 and 1, respectively. However, if the maximum and minimum values used for quantization have been converted by the floating-point number converter 315, maximum and minimum values which are inversely converted by the floating-point number inverse converter 1370 are used as the maximum and minimum values, respectively, for inverse quantiazation.

An example of program codes into which the inverse DND operation to the inverse quantization are realized will be described later.

The decoded key data output from the inverse quantizer 1360 are added to the key data decoded in the linear key decoder 1380, thus constituting decoded key data.

Hereinafter, a linear key decoding process S15000 will be described in the following paragraphs.

The header decoder 1800 decodes key header information from a bitstream. If information on a linear key region exists in the bitstream, the header decoder 1800 outputs information required for decoding the beginning and ending keys of the linear key data region to the floating-point number inverse converter 1370 and outputs the number of keys, which are encoded as linear keys, to the linear key decoder 1380.

The floating-point number inverse converter 1370 inversely converts the beginning and ending keys of the linear key data region, which are expressed by decimal numbers, into binary numbers and outputs the binary numbers to the linear key decoder 1380.

Supposing two floating-point numbers to be decoded are referred to as fKeyMin and fKeyMax, a process of decoding fKeyMin is as follows.

The header decoder 1800 reads the number of digits of fKeyMin from a bitstream. If the digit number of fKeyMin is 0, fKeyMin is set to 0, and the number of digits of fKeyMax is read from the bitstream in order to decode fKeyMax. If the digit number of fKeyMax is not smaller than 8, it means that fKeyMax has been encoded following the IEEE Standard 754. Thus, the floating-point number fKeyMax is decoded after 32 bits of it are read.

However, if the digit number of fKeyMax is between 1 and 7, the header decoder 1800 reads a sign bit from the bitstream. In a preferred embodiment of the present invention, if the sign bit is 1, MinKeyMantissaSign is set to −1. On the other hand, if the sign bit is 0, MinKeyMantissaSign is set to 1. Thereafter, the number of bits required for decoding is obtained referring to Table 1 which shows the relationship between the digit number of a mantissa and the number of bits required for encoding. Next, as many bits of the bitstream as the number of bits required for encoding are read and are stored in nMinKeyMantissa. Then, next one bit of the bitstream is read and is stored in MinKeyExponentSign in the same way as the sign of the mantissa is stored in MinKeyMantissaSign. Next six bits of the bitstream, which correspond to an exponent value, are read and are stored in nMinKeyExponent.

The floating-point number inverse converter 1370 restores fKeyMin by substituting the value input from the header decoder 1800 into Equation (28).

$$fKeyMin = \frac{MinKeyMantissaSign * nMinKeyMantissa}{10^{MinKeyExponentSign * nMinKeyExponent}} \quad (28)$$

A process of restoring fKeyMax is the same as the process of restoring fKeyMin. In particular, it is determined whether or not the same value as the exponent of fKeyMin is used as the exponent of fKeyMax before reading the exponent of fKeyMax from the bitstream. If the same value as the exponent of fKeyMin is not used as the exponent of fKeyMin, the exponent of fKeyMax is read from the bitstream in the same way the exponent of fKeyMin is read from the bitstream.

The linear key decoder 1380 receives the beginning and ending keys of the linear key data region from the floating-point number inverse converter 1370 and decodes the linear key data region following Equation (29).

$$Key_i = fKeyMin + \frac{(fKeyMax - fKeyMin) * i}{(nNumberOfLinearKey - 1)} \quad (29)$$

$(i = 0, \ldots, nNumberOfLinearKey - 1)$

Here, fKeyMin and fKeyMax indicate the beginning and ending key data, respectively, of the linear key data region.

Key data in the linear key data region decoded using the aforementioned method are added to the key data output from the inverse quantizer 1360, and then the results of the adding are output as final key data.

Hereinafter, a key value data decoder according to the present invention, which decodes encoded key value data of a coordinate interpolator, and a method for decoding key value data of a coordinate interpolator according to the present invention will be described with reference to FIGS. 15A and 15B.

Figure 15A:
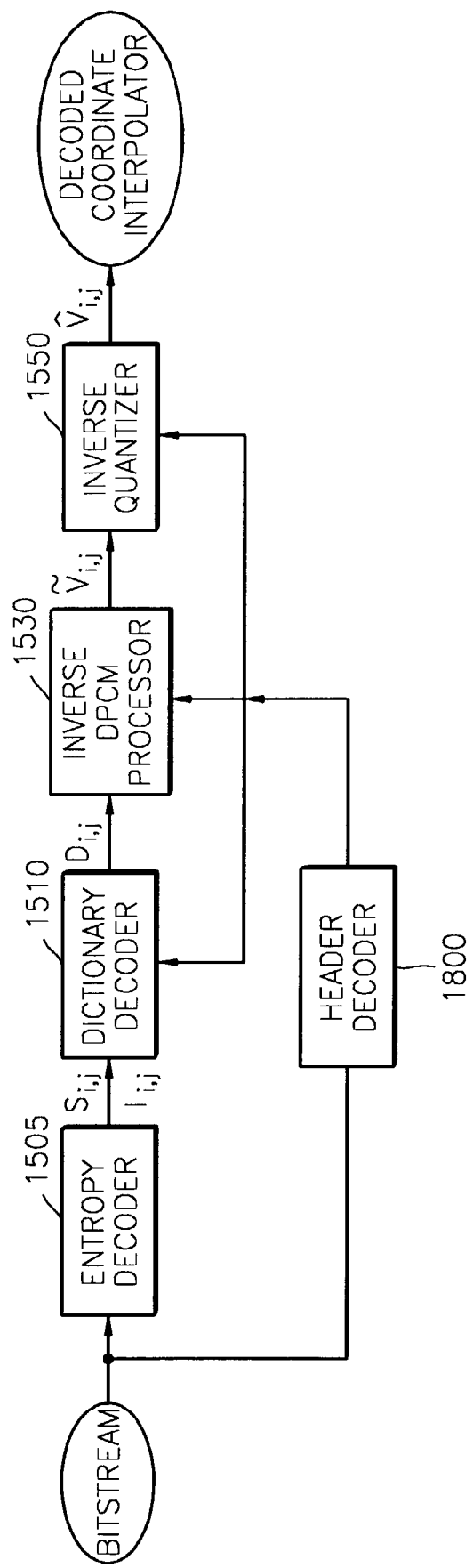
FIG. 15A is a block diagram of an apparatus for decoding key value data according to a preferred embodiment of the present invention.
Figure 15B:
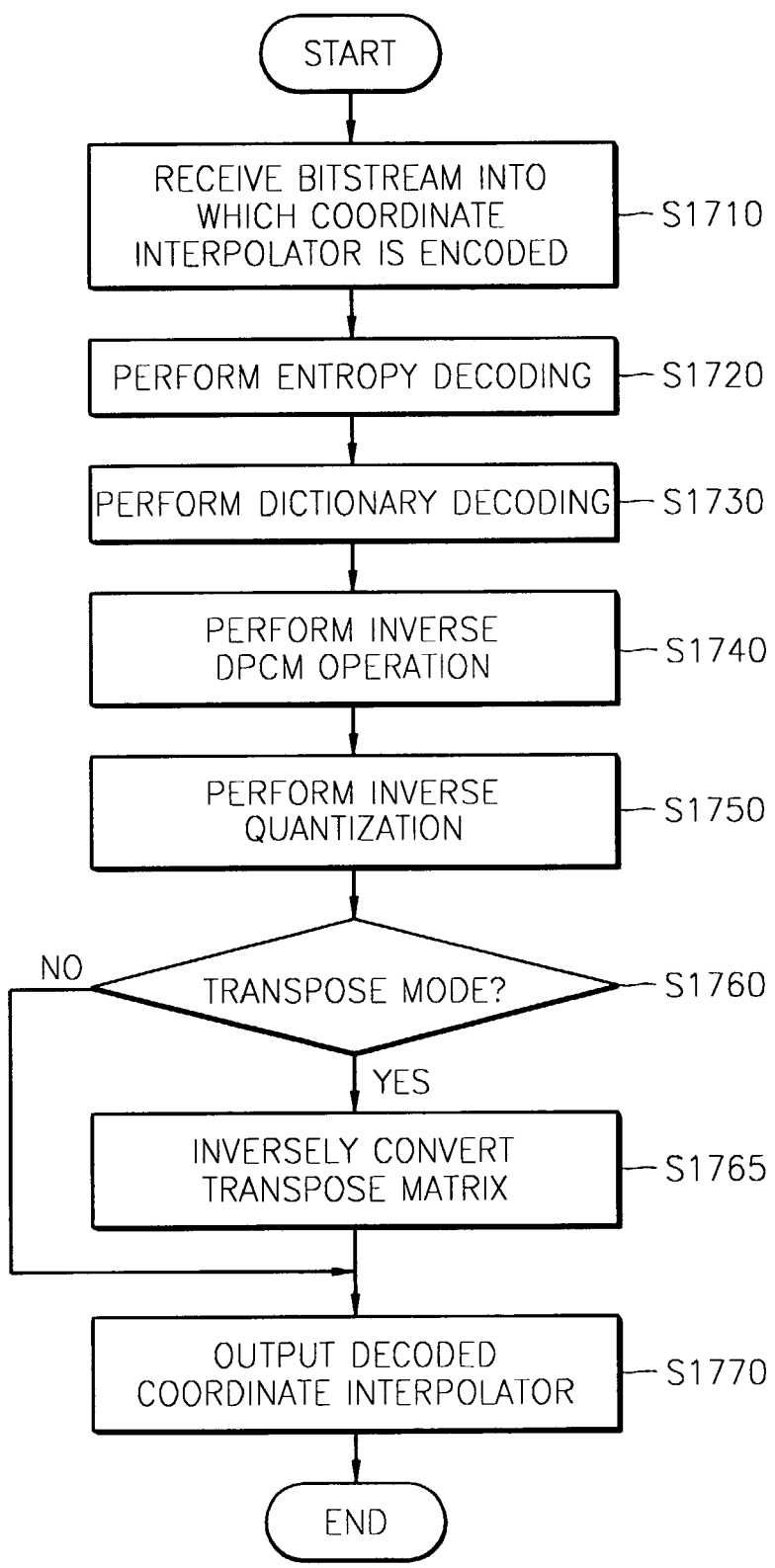
FIG. 15B is a flowchart of a method for decoding key value data according to a preferred embodiment of the present invention.

FIG. 15A is a block diagram of a key value data decoder according to a preferred embodiment of the present invention, and FIG. 15B is a flowchart of a method for decoding encoded key value data according to a preferred embodiment of the present invention.

Referring to FIG. 15A, a key value data decoder 1500 includes an entropy decoder 1505, which entropy-decodes an input bitstream and thus generates data to be dictionary-decoded, including symbols of DPCMed differential data, a symbol flag, position indexes for the symbols, and a DPCM operation mode, a dictionary decoder 1510, which generates differential data based on the symbols of the data to be dictionary-encoded and their position indexes, an inverse DPCM processor 1530, which generates quantized data by performing a predetermined inverse DPCM operation on differential data based on a DPCM operation mode, an inverse quantizer 1550, which generates retrieved key value data by inverse-quantizing quantized data, and a header decoder 1800, which decodes information required for decoding a coordinate interpolator from the input bitstream and outputs the information to the dictionary decoder 1510, the inverse DPCM processor 1530, and the inverse quantizer 1550.

A method for decoding encoded key value data of a coordinate interpolator according to the present invention will be described in the following with reference to FIG. 15B.

A bitstream, into which a coordinate interpolator is encoded, is input into the entropy decoder 1505 in step S1710, and then the entropy decoder 1505 decodes the input bitstream. If the input bitstream has been encoded in an occurrence mode, the entropy decoder 1505 outputs symbols of each vertex and their position indexes to the dictionary decoder 1510 in step S1720. On the other hand, if the input bitstream has been encoded in an incremental mode, the entropy decoder 1505 outputs a symbol flag indicating the existence of symbols and the position indexes for the symbols to the dictionary decoder 1510 in step S1720.

The dictionary decoder 1510 generates differential data by decoding the symbols and position indexes input from the entropy decoder 1510 in an occurrence mode or decoding the symbol flag and position indexes input from the entropy decoder 1510 in an incremental mode, depending on the input dictionary encoding mode, and outputs the generated differential data to the inverse DPCM processor 1530 in step S1730.

The inverse DPCM processor 1530 generates quantized key value data by performing one of an inverse temporal DPCM operation, an inverse spatial DPCM operation, and an inverse spatio-temporal DPCM operation on the differential data input from the dictionary decoder 1510, depending on the decoded DPCM operation mode of the input differential data and outputs the quantized key value data to the inverse quantizer 1550 in step S1740.

The inverse quantizer 1550 inverse-quantizes the quantized key value data input from the inverse DPCM processor 1530 using the minimum values among the data of each of the components and the maximum data range, which are input from the header decoder 1800, in step S1750.

The inverse quantizer 1550 checks if a matrix of the inverse-quantized key value data has been converted into a transpose matrix during the encoding process in step S1760 and inversely converts the transpose matrix if the matrix of the inverse-quantized key value data has been transposed, in step S1765.

The inverse quantizer 1550 outputs key value data of a retrieved coordinate interpolator in step S1770.

Hereinafter, the structure and operation of the key value data decoder 1500 will be described more fully with reference to FIGS. 16A through 17B.

The entropy decoder 1505 decodes a bitstream indicating a DPCM mode from an input bitstream first and then decodes an array of data including bSelFlag, nKVACodingBit, nQMin, and nQMax.

In the encoding process, bSelFlag and nKVACodingBit are set to 1 and 0, respectively, at first. If bSelFlag is decoded into 1, the entropy decoder 1505 decodes nKVACodingBit, nQMin, and nQMax. On the other hand, bSelFlag is decoded into 0, the entropy decoder 1505 decodes nQMin only.

The entropy decoder 1505 decodes nDicModeSelect indicating a dictionary encoding mode after the decoding of the array of the data bSelFlag, nKVACodingBit, nQMin and nQMax. Depending on the value of nDicModeSelect, bitstreams to be decoded are divided into two different kinds, which will be described in the following paragraphs.

Figure 18A:
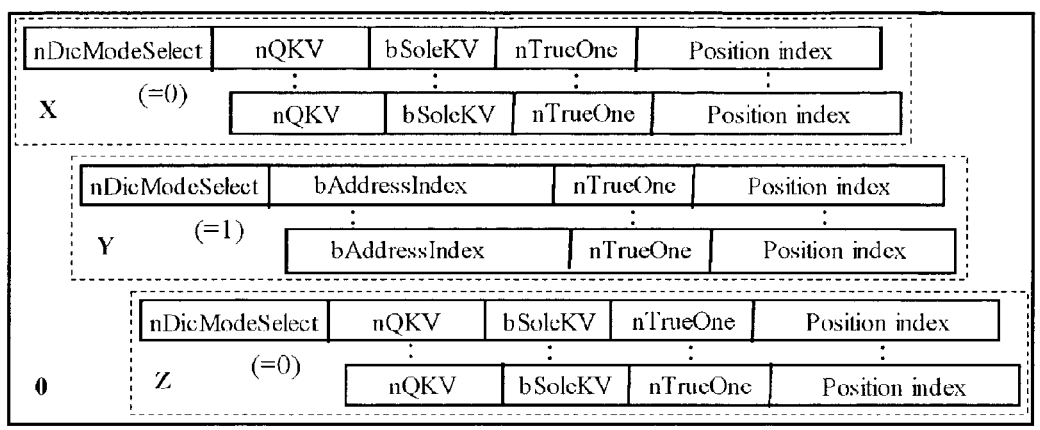
FIG. 18A is a diagram illustrating the structure of a bitstream consisting of vertices of a coordinate interpolator and their component data.
Figure 18A:
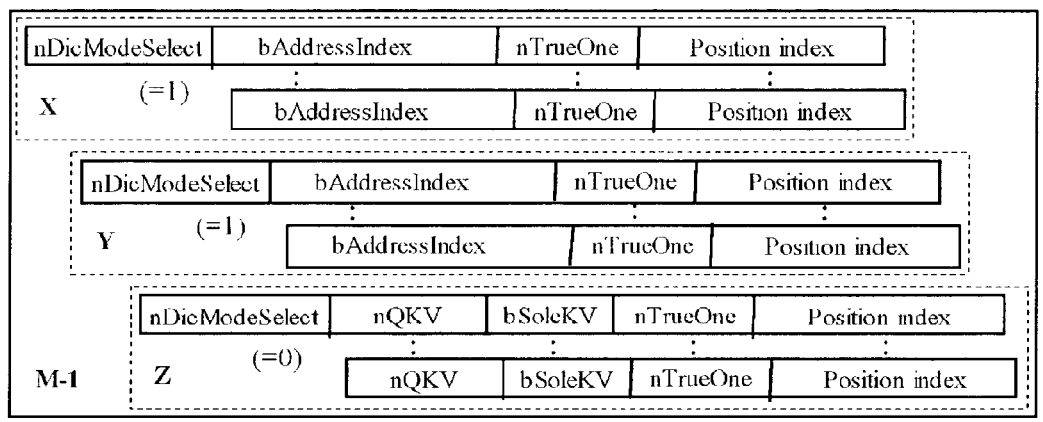

FIG. 18A is a diagram illustrating each vertex of a coordinate interpolator and the structure of a bitstream of component data of each of the vertexes. As shown in FIG. 18A, if nDicModeSelect is 0, a bitstream includes symbols and position indexes, which have been encoded in an occurrence mode encoder. On the other hand, if nDicModeSelect is 1, a bitstream includes a symbol flag and position indexes, which have been encoded in a incremental mode encoder.

The entropy decoder according to the present invention has been described above as using a function decodeSignedQuasiAAC( ), which is realized in program codes shown in FIG. 18B. In the function decodeSignedQuasiAAC( ), an adaptive-arithmetic-encoded bitstream is decoded using a context regarding input values and their signs. In particular, in the function decodeSignedQuasiAAC( ), bits subsequent to a sign bit is decoded using a zero context. The entropy decoder 1505 outputs the decoded data to the dictionary decoder 1510.

Figure 16A:
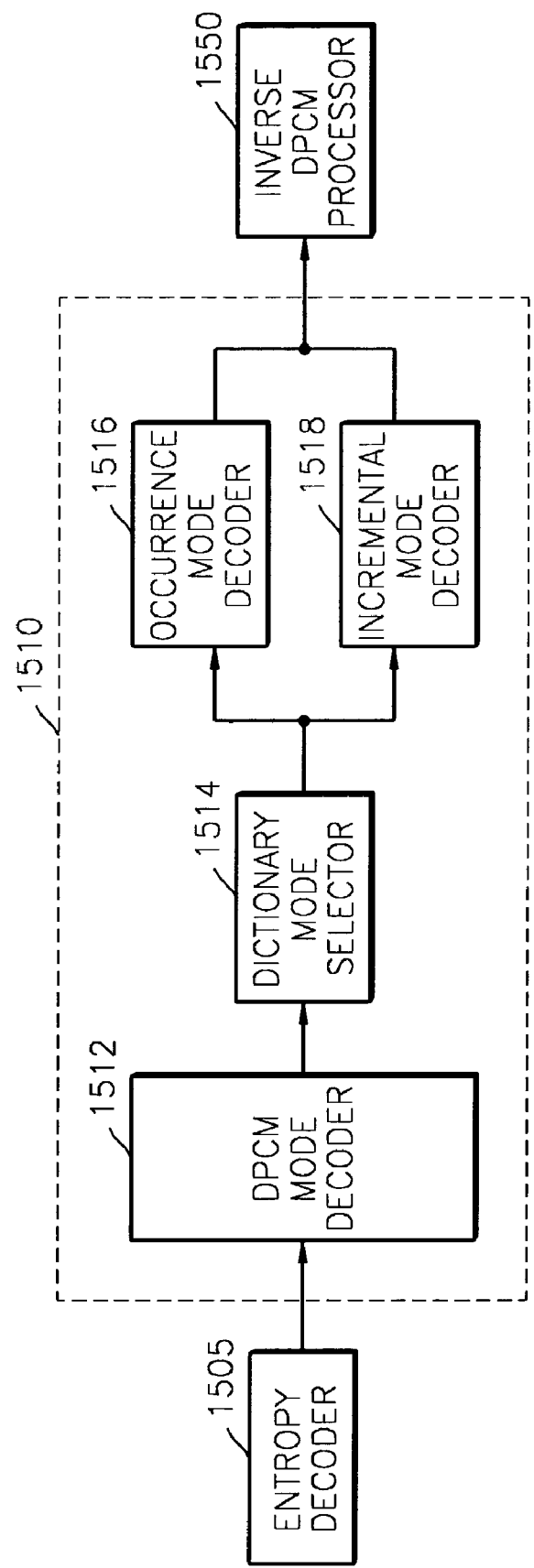
FIG. 16A is a block diagram of a dictionary decoder according to a preferred embodiment of the present invention.
Figure 17A:
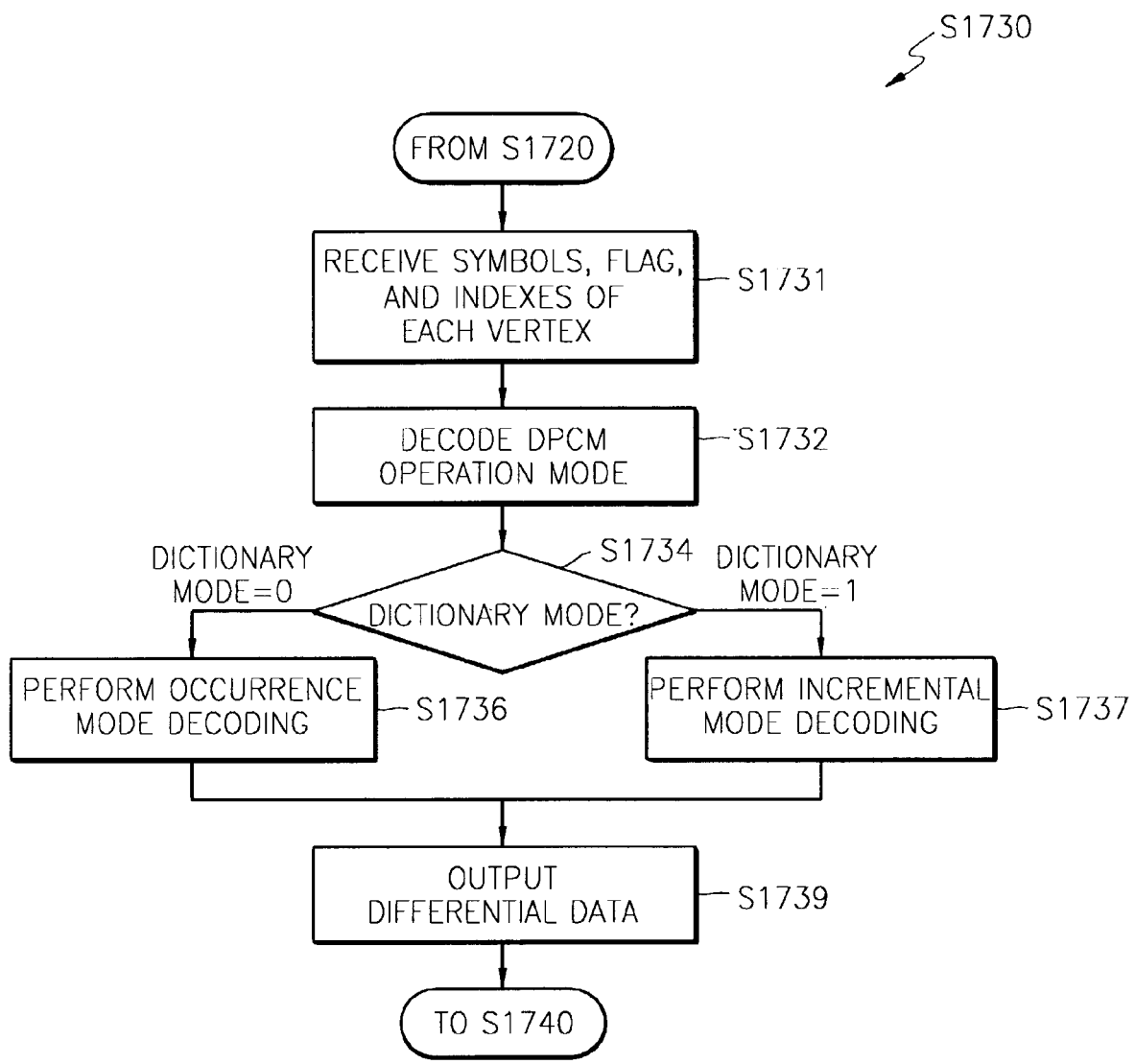
FIG. 17A is a flowchart of a dictionary decoding method according to a preferred embodiment of the present invention.

FIG. 16A is a block diagram of the dictionary decoder 1510 according to the present invention, and FIG. 17A is a flowchart of a dictionary encoding method.

As shown in FIG. 16A, the dictionary decoder 1510 includes a DPCM mode decoder 1512, which retrieves a DPCM mode of each vertex input thereinto, a dictionary mode selector 1514, which selects a dictionary decoding mode of each of the input vertices, an occurrence mode decoder 1516, which receives symbols of each component of each of the vertices and position indexes for the symbols from the dictionary mode selector 1514 and retrieves differential data, and an incremental mode decoder 1518, which receives a symbol flag and the position indexes for the symbols from the dictionary mode selector 1514 and retrieves differential data.

Referring to FIG. 17A, entropy-decoded component data of each of the vertices including the symbols, the symbol flag, and the position indexes are input into the DPCM mode decoder 1512 in step S1731.

The DPCM mode decoder 1512 decodes the mode of an inverse DPCM operation, which will be performed on differential data of each of the components of each of the vertices in the inverse DPCM processor 1530, before dictionary-decoded differential data are output to the inverse DPCM processor 1530 in step S1732.

Hereinafter, DPCM mode decoding will be described with reference to FIG. 19A.

DPCM mode decoding is the same as incremental mode decoding, which will be described later, except that the number of symbols representing combinations of DPCM modes of each of the components of each of the vertices is fixed at 27 and accordingly, the size of a symbol table is also fixed at 27.

The DPCM mode decoder 1512 receives a DPCM mode flag and records symbols corresponding to the DPCM mode flag in a data array following input position indexes.

Figure 19A:
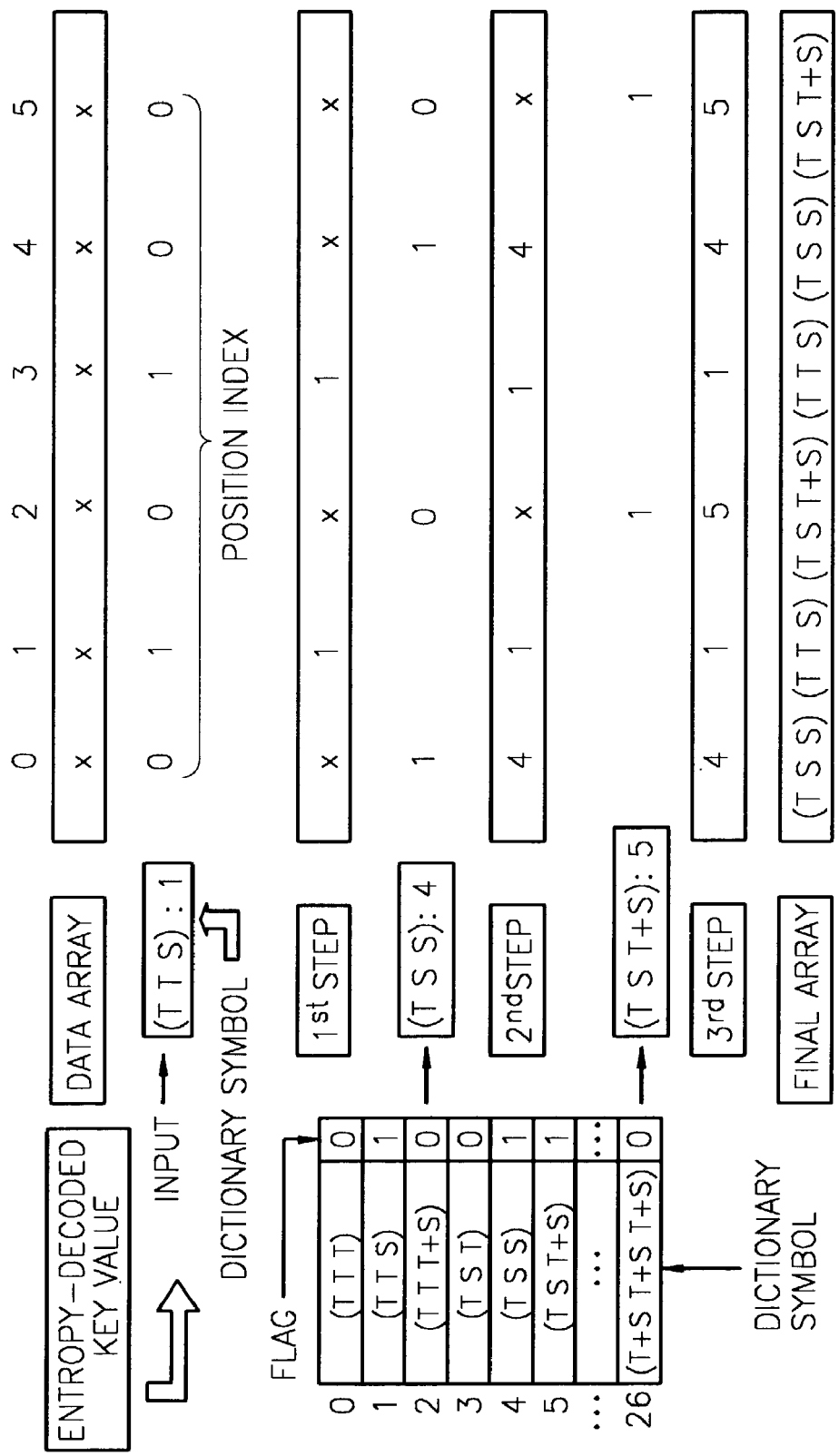
FIG. 19A is a diagram illustrating a DPCM mode decoding method according to a preferred embodiment of the present invention.

For example, as shown in FIG. 19A, symbols corresponding to the input DMCM mode flag are 1 (T T S), 4 (T S S), and 5 (T S T+S) and their respective indexes are (0 1 0 1 0 0), (1 0 1 0), and (1 1). Accordingly, an array of data (X 1 X 1 X X) is retrieved using the symbol 1 and its position index (0 1 0 1 0 0), an array of data (4 1 X 1 4 X) is retrieved using the symbol 4 and its position index (1 0 1 0), and an array of data (4 1 5 1 4 5) is retrieved using the symbol 5 and its position index (1 1).

The retrieved data array (4 1 5 1 4 5) is converted into an array of combinations of DPCM modes (T S S) (T T S) (T S T+S) (T T S) (T S S) (T S T+S). Accordingly, it is possible to identify what kind of DPCM has been performed on each of the components of each of the vertices based on the retrieved data array.

The DPCM mode decoder 1512 outputs the differential data of each of the components of each of the vertices to the dictionary mode selector 1514 together with the decoded DPCM mode information.

The dictionary mode selector 1514 outputs the component data of each of the vertices input from the DPCM mode decoder 1512 to the occurrence mode decoder 1516 or the incremental mode decoder 1518, depending on the value of nDicModeSelect of each of the components of each of the vertices in step S1734.

The dictionary mode selector 1514 outputs the component data of a vertex to the occurrence mode decoder 1516 if nDicModeSelect is 0 and outputs the component data of the vertex to the incremental mode decoder 1518 if nDicModeSelect is 1.

The occurrence mode decoder 1516 retrieves the symbol data and position indexes of each of the components into differential data in step S1736.

Figure 19B:
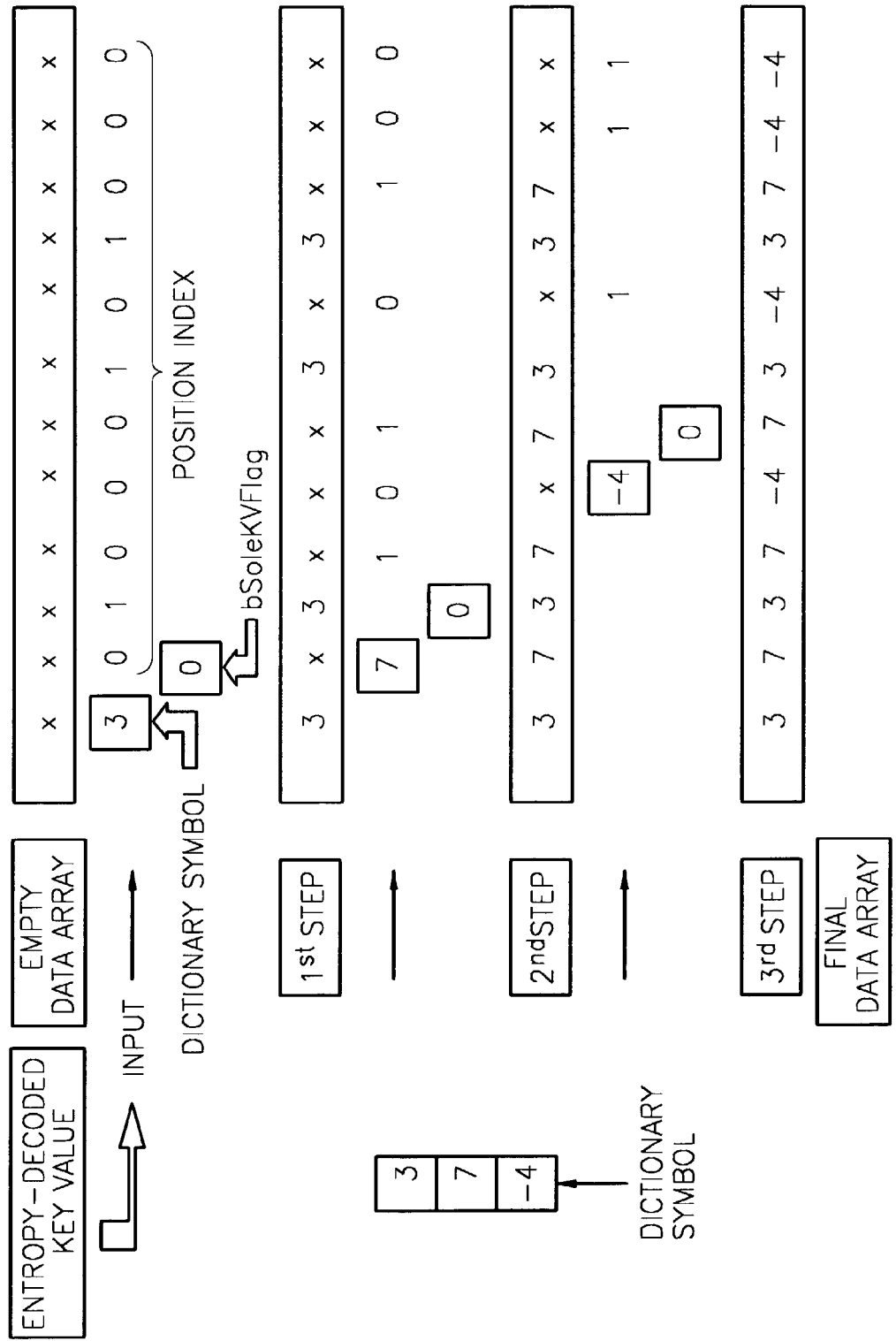
FIG. 19B is a diagram illustrating an occurrence mode decoding method according to a preferred embodiment of the present invention.

FIG. 19B is a diagram illustrating an example of occurrence mode decoding. Referring to FIG. 19B, the occurrence mode decoder 1516 receives symbol data from the dictionary mode selector 1514 and checks bSoleKV and nTrueOne.

If bSoleKV indicates there are a plurality of input symbols in differential data and nTrueOne indicates position indexes have not been inversed, the occurrence mode decoder 1516 retrieves differential data by inserting the input symbols in their respective places in a data array, which are indicated by their respective position indexes.

For example, the occurrence mode decoder 1516 receives symbols 3, 7, and −4 sequentially and their respective position indexes (0 1 0 0 0 1 0 1 0 0 0), (1 0 1 0 1 0 0), and (1 1 1).

The occurrence mode decoder 1516 records the first symbol 3 in a differential data array following the position index (0 1 0 0 0 1 0 1 0 0 0). Accordingly, (3 X 3 X X X 3 X 3 X X X) is obtained by inserting the symbol 3 into places in the differential data array, which correspond to the places where 1 is located in the position index (0 1 0 0 0 1 0 1 0 0 0).

The occurrence mode decoder 1516 retrieves the next symbol 7. During retrieving the symbol 7, the positions of the symbol 3 in the differential data array are not considered so that the position index for the symbol 7 is not (0 1 0 1 0 0 0 1 0 0) but (1 0 1 0 1 0 0).

The occurrence mode decoder 1516 records the symbol 7 in a first place among places in the differential data array, which are not occupied by the symbol 3, and then records the symbol 7 in places in the differential data array, which correspond to the places where 1 is located in the position index (1 0 1 0 1 0 0). Accordingly, after retrieving the symbol 7, the differential data array is (3 7 3 7 X 7 3 X 3 7 X X).

The occurrence mode decoder 1516 retrieves the symbol −4 following the index (1 1 1), and thus the resulting differential data array is (3 7 3 7 −4 7 3 −4 3 7 4 −4).

If bSoleKV is set to 1, this means that there is only one input symbol in differential data, and there is no position index for the input symbol. Accordingly, the occurrence mode decoder 1516 records the input symbol into a first place in a blank differential data array and performs a process for retrieving the next symbols.

Figure 19C:
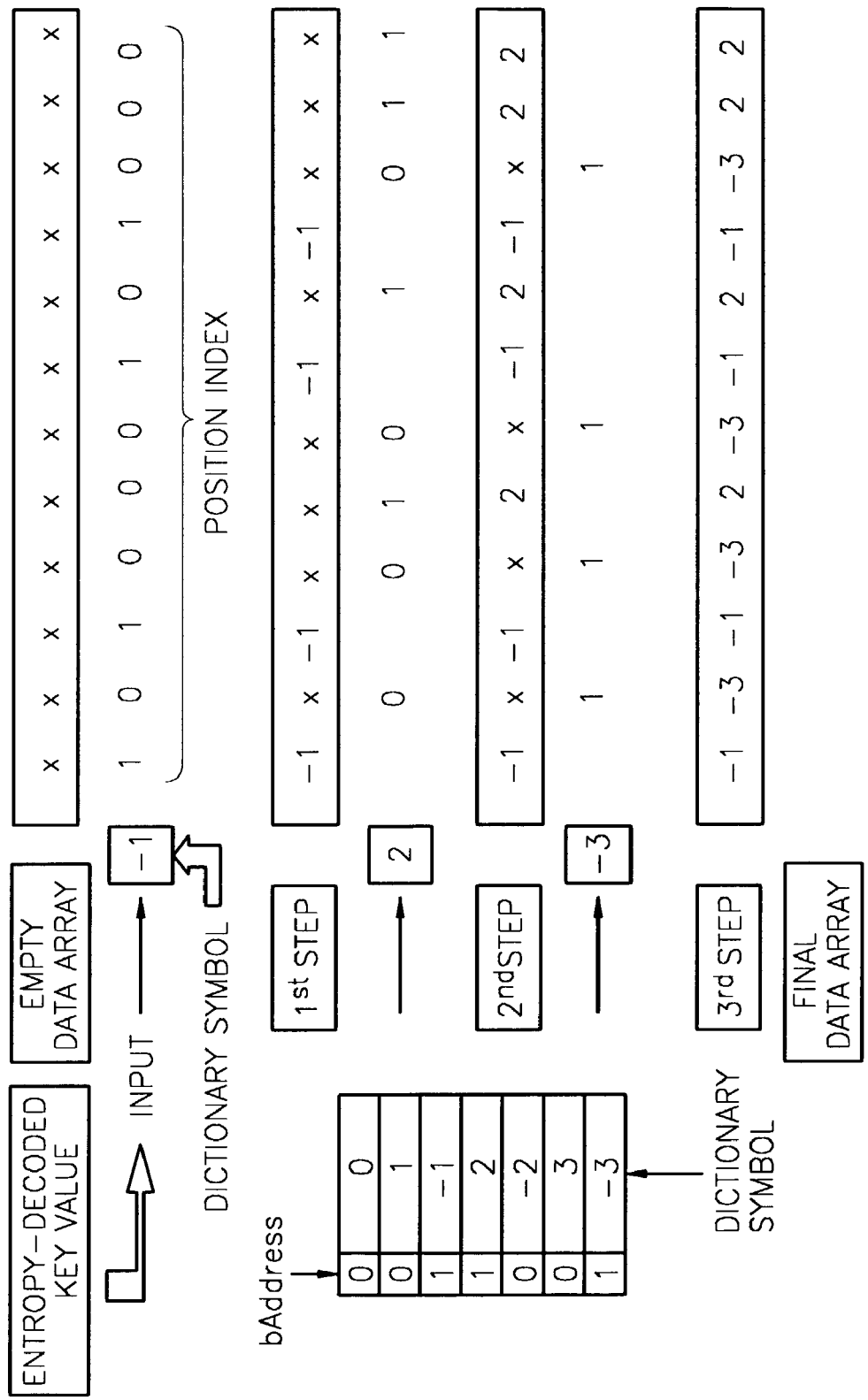
FIG. 19C is a diagram illustrating an incremental mode decoding method according to a preferred embodiment of the present invention.

The incremental mode decoder 1518 retrieves the symbol flag and position indexes of each of the components into differential data in step S1736. Hereinafter, incremental mode decoding will be described with reference to FIG. 19C.

The incremental mode decoder 1518 receives the symbol flag indicating whether or not symbols exist in differential data, nTrueOne indicating whether or not position indexes have been inversed, and the position indexes from the dictionary mode selector 1514.

The incremental mode decoder 1518 decodes symbols included in the differential data based on the input symbol flag. In a symbol table used for incremental mode decoding, like the one used for the incremental mode encoding, symbols are arranged in column in the order from a symbol having the lowest absolute value to a symbol having the greatest absolute value, and between two symbols having the same absolute value, the one having a positive value is arranged in a higher row than the other. The size of a symbol flag is $2^{nKVcodingBit+1}-1$ where nKVCodingBit represents the number of quantization bits decoded in the entropy decoder 1505.

Accordingly, if a symbol flag is (0 0 1 1 0 0 1), the incremental mode decoder 1518 decodes −1, 2, and −3 as symbols existing in the differential data.

The position indexes input after the symbol flag are (1 0 1 0 0 0 1 0 1 0 0 0), (0 0 1 0 1 0 1 1), and (1 1 1 1) and correspond to the symbols −1, 2, and 3, respectively.

The incremental mode decoder 1518 records the symbol −1 in places in a differential data array corresponding to the places where 1 is located in the position index (1 0 1 0 0 0 1 0 1 0 0 0) so that the resulting data array is (−1 X −1 X X X −1 X −1 X X X).

Next, the incremental mode decoder 1518 retrieves the symbol 2 by recording 2 in places in the differential data array corresponding to the places where 1 is located in the position index (0 0 1 0 1 0 1 1). During the retrieving of the symbol 2, the positions of the first symbol −1 in the differential data array are not considered so that the resulting differential data array is (−1 X −1 X 2 X −1 2 −1 X 2 2).

The incremental mode decoder 1518 retrieves the symbol −3 by recording −3 in places in the differentia data array corresponding to the places where 1 is located in the position index (1 1 1 1) so that the resulting differential data array is (−1 −3 −1 −3 2−3−1 2−1−3 2 2).

The occurrence mode decoder 1516 and the incremental mode decoder 1518 retrieves the differential data of each of the components of each of the vertices and outputs the retrieved differential data to the inverse DPCM processor 1530 in step S1739.

Figure 16B:
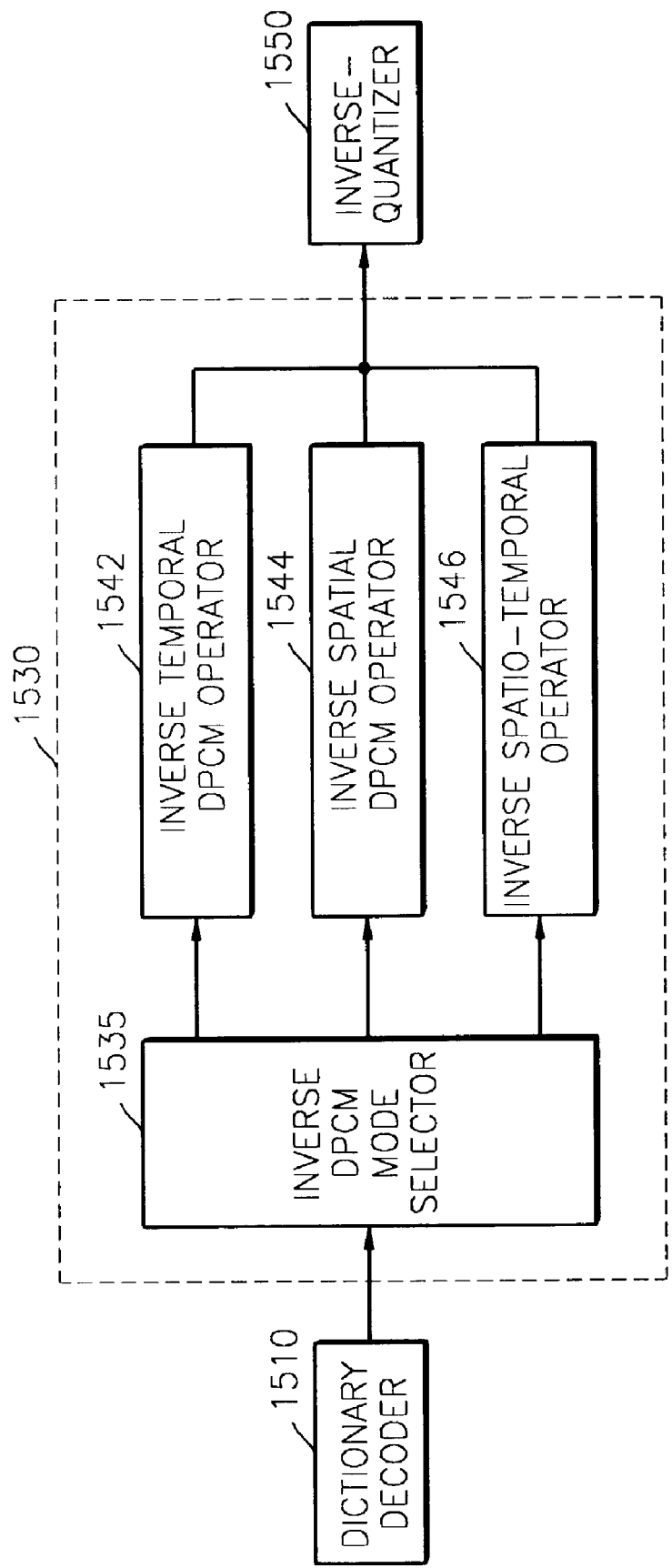
FIG. 16B is a block diagram of an inverse DPCM processor in an apparatus for decoding key value data according to the present invention.
Figure 17B:
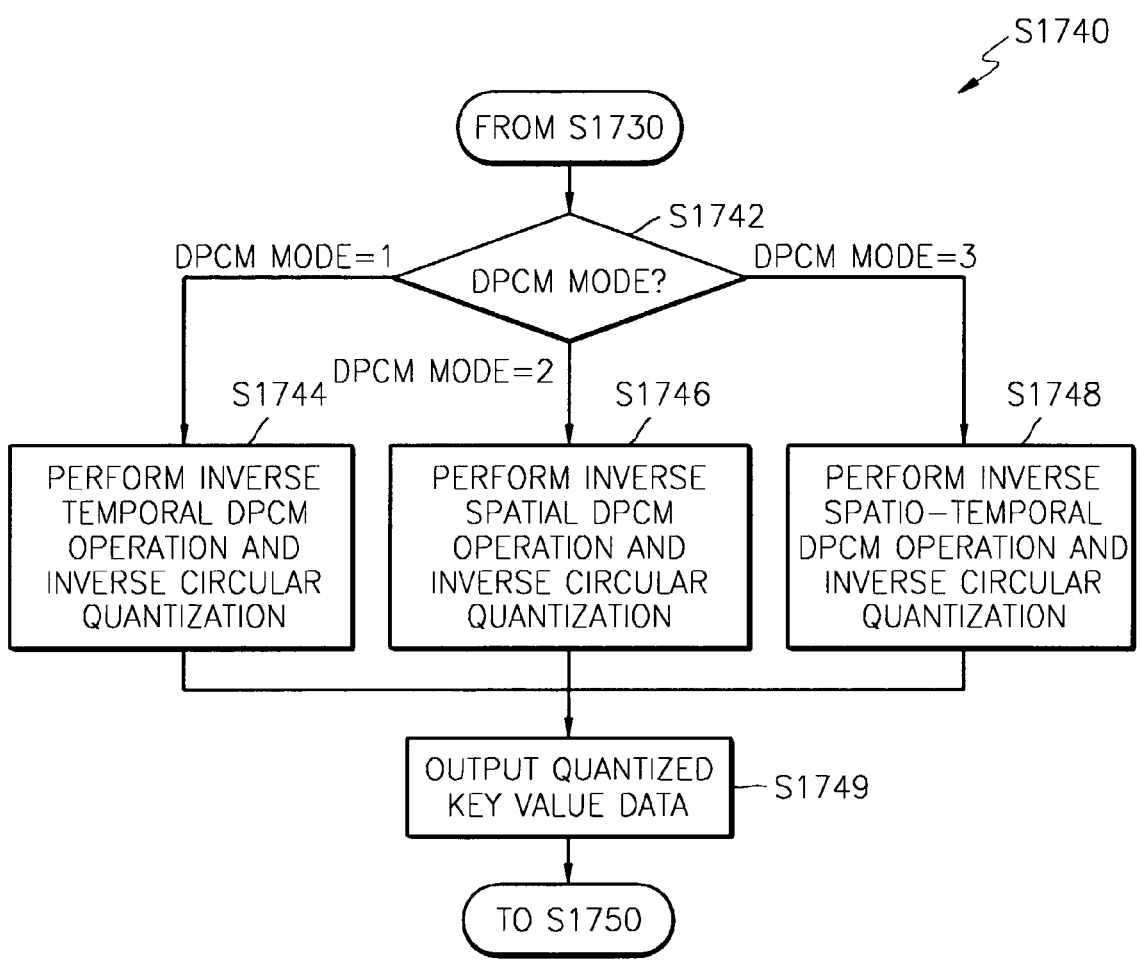
FIG. 17B is a flowchart of an inverse DPCM operation.

FIG. 16B is a block diagram of the inverse DPCM processor 1530 according to the present invention, and FIG. 17B is a flowchart of an inverse DPCM operation.

Referring to FIG. 16B, the inverse DPCM processor 1530 according to the present invention includes an inverse temporal DPCM operator 1542, which performs an inverse temporal DPCM operation and an inverse circular quantization operation on input differential data and then outputs quantized key value data of a coordinate interpolator, an inverse spatial DPCM operator 1544, which performs an inverse spatial DPCM operation and an inverse circular quantization operation on input differential data and then outputs quantized key value data, an inverse spatio-temporal DPCM operator 1546, which performs an inverse spatio-temporal DPCM operation and an inverse circular quantization operation on input differential data and then outputs quantized key value data, and an inverse DPCM mode selector 1535, which outputs differential data input thereinto to one of the inverse temporal DPCM operator 1542, the inverse spatial DPCM operator 1544, and the inverse spatio-temporal DPCM operator 1546.

Referring to FIG. 17B, the inverse DPCM mode selector 1535 determines an inverse DPCM operation, which will be performed on differential data input thereinto, depending on the DPCM operation mode of each of the components of each of the vertices retrieved in the DPCM mode decoder 1512, and outputs the input differential data of each of the components of each of the vertices following the inverse DPCM operation mode in step S1742.

Each of the DPCM operators 1542, 1544, and 1546 performs an inverse DPCM operation and an inverse circular quantization operation on the differential data input thereinto at the same time.

The inverse temporal DPCM operator 1542 performs an inverse temporal DPCM operation on the input differential data following Equation (30) in step S1744, the inverse temporal DPCM operator 1544 performs an inverse spatial operation on the input differential data following Equation (31) in step S1746, and the inverse spatio-temporal DPCM operator 1546 performs an inverse spatio-temporal DPCM operation on the differential data input thereinto following Equation (32) in step S1748.

$$\tilde{V}_{i,j} = D_{i,j} + \tilde{V}_{i-1,j} \tag{30}$$

$$\tilde{V}_{i,j} = D_{i,j} + \tilde{V}_{i,Ref} \tag{31}$$

$$\tilde{V}_{i,j} = D_{i,j} + \{\tilde{V}_{i-1,j} + (\tilde{V}_{i,Ref} - \tilde{V}_{i-1,Ref})\} \tag{32}$$

In Equations (30) through (32), $\tilde{V}_{i,j}$ represents quantized key value data of a j-th vertex in an i-th keyframe, $D_{i,j}$ represents differential data of the j-th vertex in the i-th keyframe, and Ref represents a reference vertex.

In Equations (31) and (32), if $\tilde{V}_{i,Ref}$ or $\{\tilde{V}_{i-1,j}+(\tilde{V}_{i,Ref}-\tilde{V}_{i-1,Ref})\}$ is smaller than a minimum value among the quantized key value data of each of the components, the minimum value is used instead of $\tilde{V}_{i,Ref}$ or $\{\tilde{V}_{i-1,j}+(\tilde{V}_{i,Ref}-\tilde{V}_{i-1,Ref})\}$. If $\tilde{V}_{i,Ref}$ or $\{\tilde{V}_{i-1,j}+(\tilde{V}_{i,Ref}-\tilde{V}_{i-1,Ref})\}$ is greater than a maximum value among the quantized key value data of each of the components, the maximum value is used instead of $\tilde{V}_{i,Ref}$ or $\{\tilde{V}_{i-1,j}+(\tilde{V}_{i,Ref}-\tilde{V}_{i-1,Ref})\}$.

Each of the DPCM operators 1542, 1544, and 1546 performs an inverse DPCM operation using Equation (33) and performs an inverse circular quantization operation at the same time so as to extend the range of differential data, which has been reduced during the encoding process.

InverseCircularQuantization($X_i$):

$$X'_i = \tilde{X}_i - (nQ\text{Max} - nQ\text{Min} + 1) \text{ (if } \tilde{X}_i \geq 0\text{)}$$

$$X'_i = \tilde{X}_i + (nQ\text{Max} - nQ\text{Min} + 1) \text{ (otherwise)}$$

$$\hat{X}_i = \hat{X}_{i-1} + \tilde{X}_i \text{ (if } nQ\text{Min} \leq \hat{X}_{i-1} + \tilde{X}_i \leq nQ\text{Max}\text{)}$$

$$\hat{X}_i = \hat{X}_{i-1} + X'_i \text{ (if } nQ\text{Min} \leq \hat{X}_{i-1} + X'_i \leq nQ\text{Max}\text{)} \tag{33}$$

In Equation (33), $\tilde{X}_i$ is an input value which is the same as $D_{i,j}$, $\hat{X}_{i-1}$ is a previously inversely circular-quantized value, like $\tilde{V}_{i,Ref}$ or $\{\tilde{V}_{i-1,j}+(\tilde{V}_{i,Ref}-\tilde{V}_{i-1,Ref})\}$. nQMax and nQMin represent a maximum value and a minimum value, respectively, among DPCMed differential data.

The inverse DPCM processor 1530 outputs key value data of each of the components of each of the vertices, which have been inverse-DPCMed and inversely circular-quantized, to the inverse quantizer 1550 in step S1749.

Referring to FIG. 15B, the inverse quantizer 1550 converts minimum values fMin_X, fMin_Y, and fMin_Z, which are input from the header decoder 1800, among input component data and a maximum range value fMax into binary numbers following Equation (4) and inverse-quantizes the quantized key value data input from the inverse DPCM processor 1530 by substituting fMin_X, fMin_Y, fMin_Z, and fMax into Equation (34).

$$\hat{v}_{i,j,x} = \text{fMin\_X} + \frac{\tilde{v}_{i,j,x}}{2^{nKVQBits} - 1} \times \text{fMax} \tag{34}$$

$$\hat{v}_{i,j,y} = \text{fMin\_Y} + \frac{\tilde{v}_{i,j,y}}{2^{nKVQBits} - 1} \times \text{fMax}$$

$$\hat{v}_{i,j,z} = \text{fMin\_Z} + \frac{\tilde{v}_{i,j,z}}{2^{nKVQBits} - 1} \times \text{fMax}$$

In Equation (34), nKVQBits represents a quantization bit size used for inverse quantization.

The inverse quantizer 1550 must output the inverse-quantized key value data of each of the components of each of the vertices in the form of matrix shown in Table 2. In order to do this, the inverse quantizer 1550 checks before outputting the inverse-quantized key value data if the mode of the inverse-quantized key value data is a transpose mode in step S1760. If the mode of the inverse-quantized key value data is a transpose mode, the inverse quantizer 1550 generates and outputs decoded key value data of a coordinate interpolator by inversely converting the transpose matrix in step S1765.

FIGS. 20A through 20L are diagrams illustrating examples of SDL program codes by which an apparatus for decoding key data and key value data of a coordinate interpolator according to a preferred embodiment of the present invention is realized.

FIG. 20A is a diagram illustrating a class CompressedCoordinateInterpolator, which is a top class for reading a compressed bitstream of a coordinate interpolator. In FIG. 20A, KeyHeader and Key are the classes for reading key information from the bitstream, which corresponds to key field data in conventional CoordinateInterpolator node. CoordIKeyValueHeader and CoordIKeyValue are the classes for reading keyValue information corresponding to keyValue field data in conventional CoordinateInterpolator node. The function qf_start( ) is used for initializing an arithmetic decoder before reading AAC-encoded part of the bitstream.

FIG. 20B is a diagram illustrating a class for decoding a key header, which is information required for a decoding process.

The main information in the key header is the number of keys, the quantization bit, the intra key data, the DND header and the actual bits used for decoding. nKeyQBit is the quantization bit that is used in the inverse quantization to restore the float key values. nNumKeyCodingBit indicates the bit size of nNumberOfKey, which indicates the number of key data. nKeyDigit indicates the maximum significant digit in the original key data and can be used for rounding off the decoded values. When the information on linear key sub-regions is included in the header, bIsLinearKeySubRegion flag is set to 1. In this case, the keys included in certain sub-region within the whole range of keys can be calculated using the decoded header information following the bIsLinearKeySubRegion flag. bRangeFlag indicates whether the range of key data is from 0 to 1 or not. If the range is not 0 to 1, the minimum value and the maximum value are decoded from the KeyMinMax class. KeyMinMax class reconstructs the minimum value and the maximum value for inverse quantization. Each value can be separated into the mantissa and the exponent. nBitSize is the bit size of several key header information data, which are nQIntraKey, nKeyShift and nKeyMax. nQIntraKey is the magnitude of the first quantized intra data. It is combined together with the nQIntraKeySign, which indicates the sign of nQIntraKey. It is used as a base for restoring the rest of the quanitzed key data. For all the sign bits in the interpolator compression, the value 0 denotes a positive sign and 1 denotes a negative sign. nKDPCMOrder is the order of DPCM minus 1. The range of the order may be from 1 to 3. The number of the quantized intra data is the same as the order of DPCM.

nKeyShift, together with the sign bit nKeyShiftSign, is the integer number that indicates the amount of shift in the key data decoder. These two values are decoded if the bShiftFlag is set to true. nDNDOrder is the order of DND (Divide-and-divide). The DND is described in the key data decoder. If the value of nDNDOrder is 7, then bNoDND is decoded. This boolean value indicates whether inverse DND will be processed or not. nKeyMax is the maximum value or the minimum value used during each successive inverse DND process. nKeyCodingBit is the bits used for coding key data. bSignedAACFlag indicates which decoding method is used for AAC decoding. If the value is 0, the unsigned AAC decoding is performed. Otherwise, the signed AAC decoding is performed. bKeyInvertDownFlag is the boolean value indicating whether nKeyInvertDown is used or not. nKeyInvertDown is the integer value that makes all quantized key data above it to be inverted to negative values starting from −1 and below. If nKeyInvertDown is −1, then inverting is not performed. FIG. 20C is a diagram illustrating a class LinearKey. In FIG. 20C, nNumLinearKeyCodingBit is a value indicating the number of bits necessary to encode a predetermined number of linearly predictable keys. nNumberOfLinearKey is a value indicating the number of linearly predictable keys.

FIG. 20D is a diagram illustrating a class KeyMinMax. In FIG. 20D, bMinKeyDigitSame is a flag indicating if the number (nKeyDigit) of most significant digits of all keys and the number of most significant digits of a minimum value among the keys are the same. nMinKeyDigit is a value indicating the number of most significant digits of the minimum value among the keys. nMinKeyMantissaSign is a value indicating a sign of nMinKeyMantissa.

nMinKeyMantissa is a value indicating the mantissa of the minimum value among the keys. nMinKeyExponentSign is a value indicating a sign of nMinKeyExponent.

nMinKeyExponent is a value indicating the exponent of the minimum value among the keys. fKeyMin is a value indicating the minimum value among the keys. bMaxKeyDigitSame is a flag indicating if the number nKeyDigit of most significant digits of all the keys and the number of most significant digits of a maximum value among the keys are the same. nMaxkeyDigit is a value indicating the number of most significant digits of the maximum value among the keys. nMaxKeyMantissaSign is a value indicating a sign of nMaxKeyMantissa. nMaxKeyMantissa is a value indicating the mantissa of the maximum value among the keys.

bSameExponent is a flag indicating if the exponent of the maximum value among the keys is the same as nMinKeyExponent. nMaxKeyExponentSign is a value indicating a sign of nMaxKeyExponent. nMaxKeyExponent is a value indicating the exponent of the maximum value among the keys. FKeyMax is a value indicating the maximum value among the keys.

FIG. 20E is a diagram illustrating a class Key. In FIG. 20E, nQKey is an array of quantized key data decoded from a bitstream. KeyContext is a context for reading a magnitude of nQKey. KeySignContext is a context for reading a sign of nQKey.

DecodeUnsignedAAC is a function used to perform an unsigned decoding process of adaptive arithmetic coding with a given context, which will be described below. DecodeSignedAAC is a function used to perform a signed decoding process of adaptive arithmetic coding with a given context, which will be described below.

FIG. 20F is a diagram illustrating a class CoordIKeyValueHeader. In FIG. 20F, key value header data are decoded after decoding key header data. A key value header includes the number of vertices, a quantization parameter for key value data, and minimum and maximum values among the key value data, which will be used for quantization. bTranspose is a flag indicating whether a current mode is a transpose mode or a vertex mode. If bTranspose is set to 1, a transpose mode is selected. Otherwise, a vertex mode is selected. nKVQBit indicates quantization bits required for inverse quantization used to retrieve floating-point numbers. nCoordQBit indicates a bit size of nNumberOfCoord indicating the number of vertices. nKVDigit is used after an inverse quantization and indicates a maximum number of significant digits of key value data. A class KeyValueMinMax retrieves minimum values among quantized values of each component of key value data and a maximum key value data range, which will be used for inverse quantization. Each of the aforementioned values can be divided into their respective mantissas and exponents. Other pieces of header information include a maximum value and a minimum value among maximum and minimum values among quantized values of each of the components of the key value data. Specifically, nXQMinOfMax indicates a minimum value among maximum values among quantized values of a component x of each of the vertices.

FIGS. 20G and 20H are diagrams illustrating examples of program codes by which a DPCM mode decoder according to a preferred embodiment of the present invention is realized. Referring to FIGS. 20G and 20H, nDPCMMode is an array of integers indicating a DPCM mode for each component x, y, and z of each vertex. nDPCMMode may have a value of 1 (a temporal DPCM operation), 2 (a spatial DPCM operation), or 3 (a spatio-temporal operation).

bSelFlag is a selection flag for each of the components of each of the vertices. Only vertices having components, for which bSelFlag is set as 'true', are encoded using the dictionary encoder 340. selectionFlagContext is a context for reading bSelFlag.

nKVACodingBit is an array of integers indicating bits required for encoding each of the components of each of the vertices. aqpXContext is a context for reading nKVACodingBit.

nRefVertexis is an array of integers indicating an index of a reference vertex for all the vertices. refContext is a context for reading nRefVertex. nQMin is an array of integers indicating minimum values among quantized values of each of the components of each of the vertices. qMinContext is a context for reading nQMin. qMinSignContext is a context for reading a sign of nQMin.

nQMax is an array of integers indicating maximum values among quantized values of each of the components of each of the vertices. qMaxContext is a context for reading nQMax. qMaxSignContext is a context for reading a sign of nQMax.

FIG. 20I is a diagram illustrating a class CoordIDPCM-Mode used to decode a DPCM mode according to a preferred embodiment of the present invention. bAddressOfDPCM-Mode indicates the usage of DPCM dictionary symbols in a DPCM dictionary table, each of which consists of DPCM modes for each component. There are three types of DPCM modes T, S, and T+S, and a vertex consists of three components. Accordingly, there are 27 dictionary symbols indicating all possible combinations of DPCM modes, as shown in Table 3 above. dpcmModeDicAddressContext is a context for reading bAddressOfDPCMMode.

bDPCMIndex indicates a DPCM symbol has been used for each of the vertices. dpcmModeDIcIndexContext is a context for reading dpcmModeDicIndexContext.

FIG. 20J is a diagram illustrating a class CoordIKeyValue used to decode a dictionary encoding mode according to a preferred embodiment of the present invention. In FIG. 20J, nDicModeSelect indicates which encoding mode has been used during a dictionary encoding process. When nDicMode-Select is set to 1, it means that the encoding mode is an incremental mode. On the other hand, when nDicModeSelect is set to 0, it means that the encoding mode is an occurrence mode.

FIG. 20K is a diagram illustrating a class CoordIIncrementalMode by which an incremental mode decoding method according to a preferred embodiment of the present invention is realized. In FIG. 20K, bAddress indicates the usage of incremental dictionary symbols representing quantized key value data. The number of symbols in an incremental dictionary table is $2^{(nKVCodingBit+1)}-1$. dicAddressContext is a context for reading bAddress.

nTrueOne is a value indicating if index data have been inverted. If nTrueOne is set to 1, a value '1' in a position index is interpreted as a true value indicating the location of a symbol. If nTrueOne is set to 0, then a value '0' in the position index is interpreted as a true value indicating the location of the symbol.

bAddrIndex indicates which incremental dictionary symbol has been used for each component of each vertex. dicIndexContext is a context for reading bAddrIndex.

FIG. 20L is a diagram illustrating a class CoordIOccurrenceMode by which an occurrence mode decoding method according to a preferred embodiment of the present invention is realized. In FIG. 20L, nQKV is an array of integers including occurrence dictionary symbols corresponding to quantized key value data. kvXContext, kvYContext and kvZContext are contexts for reading nQKV. kvSignContext is a context for reading a sign of nQKV.

bSoleKV indicates whether or not a symbol occurs only one time. When a predetermined symbol occurs only one time, bSoleKV is set to 1. dicSoleKVContext is a context for reading bSoleKV. bDicIndex indicates which occurrence dictionary symbol has been used for each of the components of each of the vertices. dicIndexContext is a context for reading bDicIndex.

The present invention can be realized as computer-readable codes written on a computer-readable recording medium. Here, the computer-readable recording medium includes any kind of recording medium which can be read by a computer system. For example, the computer-readable recording medium may include a ROM, a RAM, a CD-ROM, a magnetic tape, a floppy disk, an optical data storage, a carrier wave (transmission through the Internet), and the like. The computer-readable recording medium can be decentralized to computer systems connected over a network, and a computer can read the recording medium in a decentralized way.

The apparatus for encoding a coordinate interpolator according to the present invention is capable of encoding animation key data with a high efficiency since it includes a key data encoder, which encodes key data by taking advantage of the fact that the key data monotonously increase. In addition, the apparatus for encoding a coordinate interpolator according to the present invention is capable of retrieving high-quality animation with a smaller amount of data since it includes a key value data encoder, which encodes key value data considering a temporal correlation between the key value data as well as a spatial correlation between the key value data.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of decoding a bitstream, the method comprising:
    decoding, in a computer, a key header included in a coordinate interpolator, the coordinate interpolator including the location of each vertex constituting a 3D object in a keyframe-based animation; and
    decoding key data included in the coordinate interpolator according to the result of the decoding, the key data representing the position of a key frame on a time axis.

2. The method of claim 1, wherein the decoding of the key data comprises decoding the key data by performing entropy decoding, inverse shift, inverse differential pulse code modulation (DPCM), inverse quantization, and linear key decoding.

3. A method of decoding a bitstream into which a coordinate interpolator that comprises key data and a key header comprising information regarding the key data is encoded, the key data representing the position of a key frame on a time axis, the method comprising:

(a) decoding the key header in a computer;
(b) decoding the key data according to the result of the decoding
performed in (a) in said computer; and
outputting the decoded key data,
wherein (b) comprises decoding the key data by performing entropy decoding, inverse shift, inverse differential pulse code modulation (DPCM), inverse quantization, and linear key decoding,
wherein the key header comprises:
  a quantization bit quantity (nKVQBit) which indicates the number of bits used to quantize the key data;
  a key data quantity (nNumberOfKey) which indicates the number of the key data;
  a key data digit number (nKeyDigit) which indicates the number of digits of the key data;
  a linear key flag (bIsLinearKeySubRegion) which indicates whether the key data comprises a linear key region;
  beginning/ending key data (IKey) which is included in the key header if the linear key flag (bIsLinearKeySubRegion) is set to a value of 1, the beginning/ending key data (IKey) indicating where the linear key region begins and ends;
  a quantization error adjustment flag (bRangeFlag) which indicates whether to adjust a maximum and minimum of the key data using a method by which a quantization error can be minimized;
  an adjusted maximum and minimum (KeyMinMax) of the key data which are included in the key header if the quantization error adjustment flag(bRangeFlag) is set to a value of 1, the adjusted maximum and minimum (KeyMinMax) being used to perform inverse quantization;
  a DPCM order (nKDPCMOrder) which indicates how many iterations of DPCM which have been performed;
  reference key data (nQlntraKey) which is used to determine whether to perform DPCM, wherein the number of the reference key data (nQlntraKey) corresponds to the DPCM order (nKDPCMOrder);
  key data sign bits (nQlntraKeySign), wherein the number of the key data sign bits(nQlntraKeySign) corresponds to the DPCM order (nKDPCMOrder);
  a shift flag (bShiftFlag) which indicates whether to shift all the key data based on the key data with a highest frequency among all the key data obtained by DPCM;
  a shift value (nKeyShift) which represents the degree to which all the key data is to be shifted;
  a shift value sign bit (nKeyShiftSign) which is a sign bit of the shift value (nKeyShift);
  a divide-and-divide (DND) order (nDNDOrder) which indicates how many iterations of DND have been performed to adjust a range of DPCM results;
  at least one (nKeyMax) of maximums and minimums which are used to perform DND, wherein the number of the maximums and minimums corresponds to the DND order(nDNDOrder);
  a sign bit (nKeyMaxSign) which identifies the at least one (nKeyMax) of the maximums and minimums, wherein the number of the sign bit (nKeyMaxSlgfl) corresponds to the DND order (nDNDOrder);
  an invert-down flag (bKeylnvertDownFlag) which indicates whether to invert down DND results;
  an invert-down value (nKeylnvertDown) which indicates the degree to which the DND results are to be inverted down; and
  an adaptive arithmetic coding (AAC) flag (bSignedAACFlag) which indicates whether entropy encoding has been performed using a signed AAC method or an unsigned AAC method,
wherein the linear key region is a region where the key data linearly increases.

4. The method of claim 3, wherein (b) comprises:
performing entropy-decoding on the encoded key data by performing inverse signed AAC if the AAC flag (bSignedAACF lag) indicates that the encoded key data has been encoded using the signed AAC method and performing inverse unsigned AAC if the AAC flag (bSignedAACFlag) indicates that the encoded key data has been encoded using the unsigned AAC method;
performing inverse DND on the result of the entropy decoding if the DND order (nDNDOrder) is set to a value of 1 or greater;
performing inverse fold on the result of the entropy decoding if the DND order (nDNDOrder) is set to a value other than −1;
inversely shifting the result of the inverse fold by as much as the shift value (nKeyShift) if the DND order (nDNDOrder) is set to a value other than −1, and inversely shifting the result of the entropy decoding by as much as the shift value (nKeyShift) if the DND order (nDNDOrder) is set to a value of −1;
performing inverse DPCM on the result of the inversely shifting according to the DPCM order (nKDPCMOrder);
adjusting the result of the inverse DPCM if the maximum and minimum key data have been adjusted, and performing inverse quantization on the result of the adjusting according to the quantization bit size (nKeyQBit); and
if the decoded key header comprises the linear key region, decoding the key data of the linear key region using the beginning/ending key data (IKey), and performing linear key synthesis on the result of the decoding and the result of the inverse quantization.

5. The method of claim 4 wherein, in the performing of the inverse DND, if the DND order (nDNDOrder) is set to a value of 1 or greater and the invert-down value is not −1, an invert-down operation, which is an inverse operation of a shift-up operation performed during entropy encoding, is performed, if the DND order (nDNDOrder) is set to a value of 1 or greater and the invert-down value is −1, not performing the invert-down operation, and the performing of the inverse DND comprises performing the inverse DND a predetermined number of times corresponding to the DND order (nDNDOrder),
  wherein, if a current iteration of the inverse DND is not a final iteration of the inverse DND and the at least one (nKeyMax) is a positive value, the current iteration of the inverse DND is performed using an invert-divide-down method, if the current iteration of the inverse DND is not the final iteration of the inverse DND and the at least one (nKeyMax) is a negative value, the current iteration of the inverse DND is performed using an inverse-divideup method, and If the current iteration of the inverse DND is the final iteration of the inverse DND, the current iteration of the inverse DND is performed using an inverse-divide-up method regardless of whether the at least one (nKeyMax) is a positive value or a negative value.

* * * * *

UNITED STATES PATENT AND TRADEMARK OFFICE
CERTIFICATE OF CORRECTION

PATENT NO. : 7,809,203 B2
APPLICATION NO. : 10/305123
DATED : October 5, 2010
INVENTOR(S) : Shin-jun Lee et al.

Page 1 of 1

It is certified that error appears in the above-identified patent and that said Letters Patent is hereby corrected as shown below:

Column 41, Line 28, In Claim 3, delete "(blsLinearKeySubRegion)" and insert --(bisLinearKeySubRegion)--, therefor.

Column 41, Line 50 (Approx.), In Claim 3, delete "(nQlntraKey)" and insert --(nQIntraKey)--, therefor.

Column 41, Line 52 (Approx.), In Claim 3, delete "(nQlntraKey)" and insert --(nQIntraKey)--, therefor.

Column 41, Line 54 (Approx.), In Claim 3, delete "(nQlntraKeySign)," and insert --(nQIntraKeySign),--, therefor.

Column 41, Line 55 (Approx.), In Claim 3, delete "bits(nQlntraKeySign)," and insert --bits (nQIntraKeySign)--, therefor.

Column 42, Line 7, In Claim 3, delete "(nKeyMaxSlgfl)" and insert --(nKeyMaxSign)--, therefor.

Column 42, Line 9, In Claim 3, delete "(bKeylnvertDownFlag)" and insert --(bKeyInvertDownFlag)--, therefor.

Column 42, Line 11, In Claim 3, delete "(nKeylnvertDown)" and insert --(nKeyInvertDown)--, therefor.

Column 42, Line 23, In Claim 4, delete "AACF lag" and insert --AACFlag--, therefor.

Column 43, Line 4, In Claim 5, delete "divideup" and insert --divide-up--, therefor.

Column 43, Line 4, In Claim 5, delete "If" and insert --if--, therefor.

Signed and Sealed this
Nineteenth Day of June, 2012

David J. Kappos
*Director of the United States Patent and Trademark Office*